US012677677B2

(12) United States Patent
Hosokawa

(10) Patent No.: US 12,677,677 B2
(45) Date of Patent: Jul. 7, 2026

(54) MANUFACTURING METHOD OF SEMICONDUCTOR DEVICE, SEMICONDUCTOR DEVICE, AND ELECTRONIC APPARATUS

(71) Applicant: SONY SEMICONDUCTOR SOLUTIONS CORPORATION, Kanagawa (JP)

(72) Inventor: Kohyoh Hosokawa, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 651 days.

(21) Appl. No.: 18/041,081

(22) PCT Filed: Jul. 9, 2021

(86) PCT No.: PCT/JP2021/025959
§ 371 (c)(1),
(2) Date: Feb. 9, 2023

(87) PCT Pub. No.: WO2022/044567
PCT Pub. Date: Mar. 3, 2022

(65) Prior Publication Data
US 2023/0290710 A1 Sep. 14, 2023

(30) Foreign Application Priority Data
Aug. 31, 2020 (JP) ................................. 2020-146202

(51) Int. Cl.
H10W 70/40 (2026.01)
H10W 70/04 (2026.01)
H10W 70/652 (2026.01)

(52) U.S. Cl.
CPC ......... H10W 70/424 (2026.01); H10W 70/04 (2026.01); H10W 70/042 (2026.01);
(Continued)

(58) Field of Classification Search
CPC ......... H01L 23/49582; H01L 23/49575; H01L 23/3114; H01L 21/4828; H01L 21/4832;
(Continued)

(56) References Cited

U.S. PATENT DOCUMENTS

| | | | |
|---|---|---|---|
| 7,875,988 B2 * | 1/2011 | Shoji ..................... | H10W 46/00 257/797 |
| 2012/0139104 A1 | 6/2012 | Camacho | |

(Continued)

FOREIGN PATENT DOCUMENTS

| | | |
|---|---|---|
| JP | 2009-187980 A | 8/2009 |
| JP | 2009-194396 A | 8/2009 |

(Continued)

OTHER PUBLICATIONS

International Search Report and Written Opinion of PCT Application No. PCT/JP2021/025959, issued on Oct. 5, 2021, 11 pages of ISRWO.

*Primary Examiner* — Jose R Diaz
(74) *Attorney, Agent, or Firm* — CHIP LAW GROUP

(57) ABSTRACT
A manufacturing method of a semiconductor device forms an external connection terminal in a relatively short time and at a low cost and improves mounting reliability of a mounting substrate.
The method includes a step of preparing a frame body portion that has a plate shape, and a lead frame that has a plurality of terminal portions paired and provided such that at least a part of the terminal portions overlap with each other on plate surfaces on both sides of the frame body portion in a plate surface view, a step of mounting the lead frame on a semiconductor device body that includes a semiconductor element by joining the terminal portion on one plate surface of the plate surfaces of the frame body portion to an electrode portion of the semiconductor device body, and a step of forming a columnar terminal that
(Continued)

protrudes from the electrode portion of the semiconductor device body by partially removing the frame body portion by etching with use of a mask including the terminal portion on the other plate surface of the frame body portion.

10 Claims, 46 Drawing Sheets

(52) U.S. Cl.
CPC ....... *H10W 70/461* (2026.01); *H10W 70/465* (2026.01); *H10W 70/652* (2026.01)

(58) Field of Classification Search
CPC .......................... H01L 2924/177–17724; H01L 2924/171–17151; H01L 2924/181–1816; H10W 70/04; H10W 70/042; H10W 70/65; H10W 70/652; H10W 70/421; H10W 70/424; H10W 70/465
See application file for complete search history.

(56) References Cited

U.S. PATENT DOCUMENTS

| | | |
|---|---|---|
| 2016/0064310 A1 | 3/2016 | Sirinorakul |
| 2018/0138107 A1* | 5/2018 | Kobayashi ........ H01L 23/49541 |
| 2018/0374780 A1* | 12/2018 | Mazzola ........... H01L 23/49548 |
| 2020/0118944 A1 | 4/2020 | Cadag |

FOREIGN PATENT DOCUMENTS

| | | |
|---|---|---|
| JP | 2012-209343 A | 10/2012 |
| JP | 2017-034094 A | 2/2017 |
| JP | 2017-130576 A | 7/2017 |
| JP | 2018-037504 A | 3/2018 |

* cited by examiner

F I G . 2 5
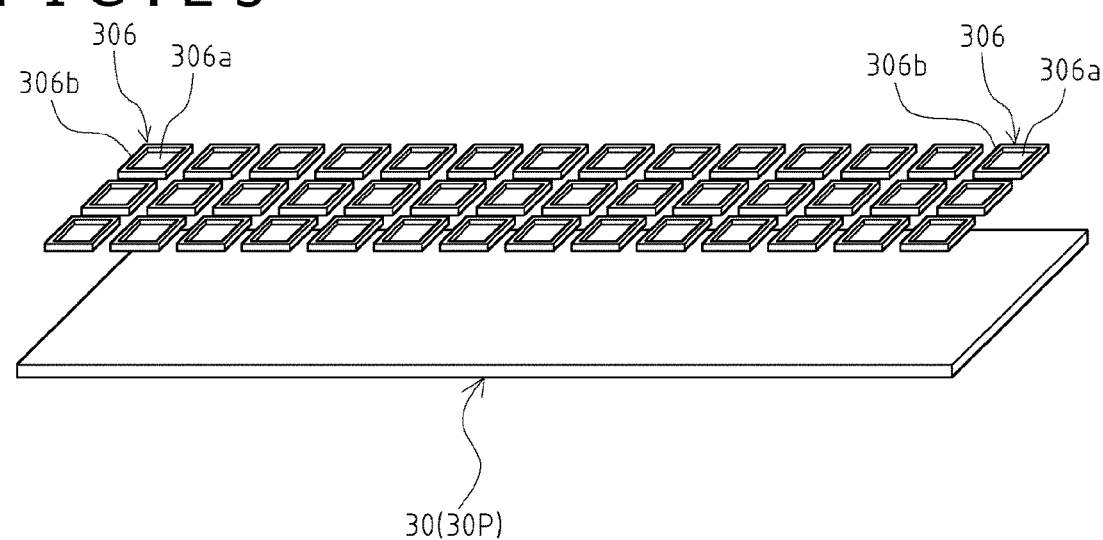
F I G . 2 6
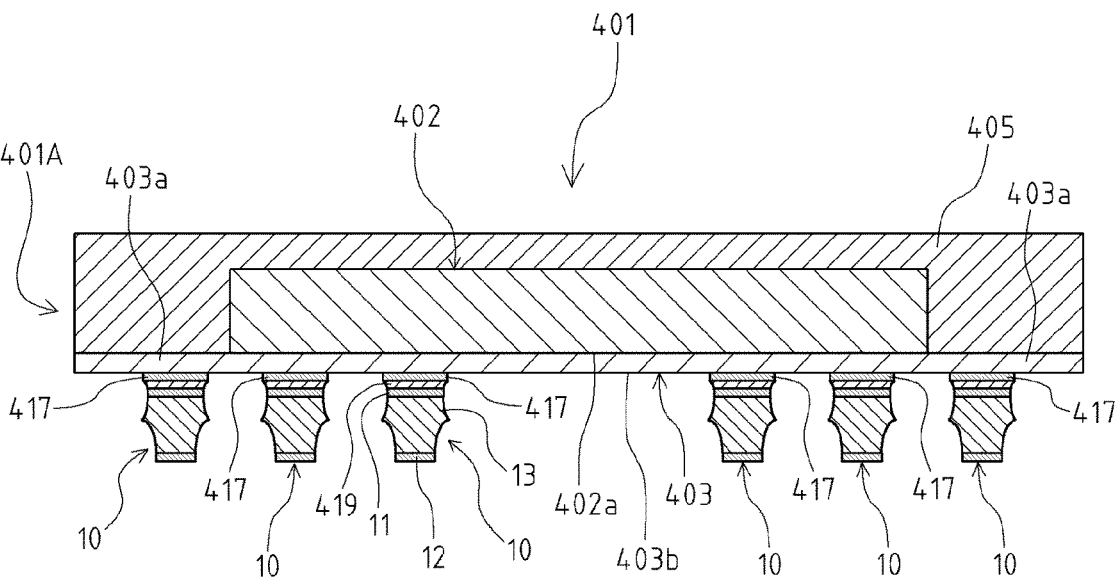

F I G . 5 0
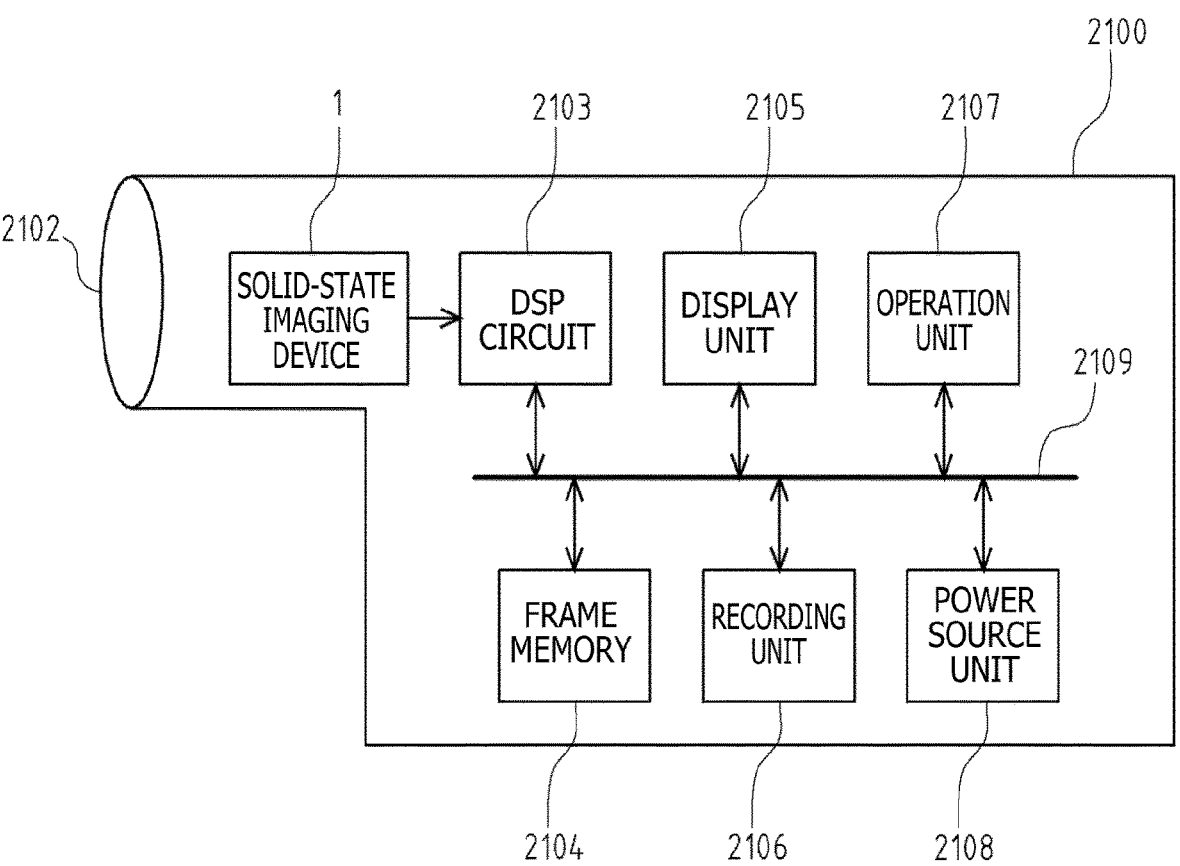

MANUFACTURING METHOD OF SEMICONDUCTOR DEVICE, SEMICONDUCTOR DEVICE, AND ELECTRONIC APPARATUS

CROSS REFERENCE TO RELATED APPLICATIONS

This application is a U.S. National Phase of International Patent Application No. PCT/JP2021/025959 filed on Jul. 9, 2021, which claims priority benefit of Japanese Patent Application No. JP 2020-146202 filed in the Japan Patent Office on Aug. 31, 2020. Each of the above-referenced applications is hereby incorporated herein by reference in its entirety.

TECHNICAL FIELD

The present disclosure relates to a manufacturing method of a semiconductor device, a semiconductor device, and an electronic apparatus.

BACKGROUND ART

A structure called a WL-CSP (wafer level chip size (or scale) package) has been widespread in recent years as a package structure of a semiconductor device. The WL-CSP is manufactured by processing of package formation in a wafer state, and subsequently singulated into a chip size and considerably contributes to size reduction of a device.

PTL 1 discloses a WL-CSP structure which is a configuration produced by joining a semiconductor element to a support substrate. This semiconductor element has a circuit element and the like on one surface of a semiconductor substrate. The semiconductor substrate has a through electrode electrically connected to an electrode pad formed around the circuit element. An external wiring layer is provided on another surface of the semiconductor substrate and electrically connected to the through electrode.

In such a configuration, a metallic post is provided on the other surface of the semiconductor substrate as a connection portion achieving easy connection between the WL-CSP and an external terminal. The metallic post is provided in a state electrically connected with the external wiring layer, and in such a manner as to protrude from a surface of a protection film covering the other surface of the semiconductor substrate.

The metallic post thus provided as an external connection terminal of the WL-CSP includes a method which uses plating such as copper (Cu), nickel (Ni), and gold (Au), for example. Specifically, for example, a protection film having an electrical insulation property and covering the external wiring layer is partially removed by patterning using photolithography at a portion where the metallic post is provided. As a result, the external wiring layer is brought into a state exposed through the removed portion. Thereafter, the removed portion of the protection film is plated with a metal material in such a manner as to be filled with the metal material so as to form a columnar electrode protruding from the protection film and constituting the metallic post.

CITATION LIST

Patent Literature

[PTL 1]
JP 2009-194396A

SUMMARY

Technical Problem

There have been following problems arising from the technology which forms a metallic post as an external connection terminal by using plating in the manner described above.

Initially, at the time of plating, steps such as exposure and development with use of photolithography are needed to achieve a step of partially removing a protection film. Accordingly, there arises a problem of an increase in the number of steps. Moreover, stacking of plating is needed during a step of plating. Accordingly, there arises a problem of an increase in the number of steps. Particularly, the number of steps for plating increases as the metallic post becomes higher. In this case, longer time and higher costs are required.

Further, when the metallic post is low (e.g., several tens $\mu m$), it may be difficult to sufficiently absorb stress produced by a linear expansion coefficient difference between a material of the WL-CSP and a material of a mounting substrate where the WL-CSP is mounted. In a case where the stress between the package and the mounting substrate is not sufficiently absorbed as described above, sufficient reliability of substrate mounting evaluated by a temperature cycle test or the like is difficult to secure.

An object of the present technology is to provide a manufacturing method of a semiconductor device, a semiconductor device, and an electronic apparatus each capable of forming an external connection terminal in a relatively short time and at a low cost, and also improving mounting reliability of a mounting substrate.

Solution to Problem

A manufacturing method of a semiconductor device according to the present technology includes a step of preparing a frame body portion that has a plate shape, and a lead frame that has a plurality of terminal portions paired and provided such that at least a part of the terminal portions overlap with each other on plate surfaces on both sides of the frame body portion in a plate surface view, a step of mounting the lead frame on a semiconductor device body that includes a semiconductor element by joining the terminal portion on one plate surface of the plate surfaces of the frame body portion to an electrode portion of the semiconductor device body, and a step of forming a columnar terminal that protrudes from the electrode portion by partially removing the frame body portion by etching with use of a mask including the terminal portion on another plate surface of the frame body portion.

Another aspect of the manufacturing method of a semiconductor device of the present technology further includes, in addition to the manufacturing method of the semiconductor device described above, a step of partially removing the frame body portion in a plate thickness direction of the frame body portion by etching the one plate surface side of the frame body portion with use of a mask including the terminal portion prior to the step of mounting, and a step of filling a space between the lead frame and the semiconductor device body with a fluid having an insulation property after the step of mounting and before the step of forming the columnar terminal.

According to a further aspect of the manufacturing method of a semiconductor device of the present technology, in addition to the manufacturing method of the semiconductor device described above, the semiconductor device body includes an integrated plate-shaped body that includes a plurality of the semiconductor elements formed in an aggregate state. The method further include a step of singulating the lead frame into a plurality of chips in correspondence with the semiconductor elements is performed after the step of removal, in which the plurality of chips is mounted on the semiconductor device body in the step of mounting.

According to a still further aspect of the manufacturing method of a semiconductor device of the present technology, in addition to the manufacturing method of the semiconductor device described above, the fluid used in the step of filling includes a photoresist.

According to a still further aspect of the manufacturing method of a semiconductor device of the present technology, in addition to the manufacturing method of the semiconductor device described above, the step of preparation includes a step of forming the plurality of terminal portions by plating of the frame body portion, and, in the step of forming the plurality of terminal portions, the terminal portion formed on the one plate surface of the frame body portion is made larger than the terminal portion formed on another plate surface of the frame body portion.

According to a still further aspect of the manufacturing method of a semiconductor device of the present technology, in addition to the manufacturing method of the semiconductor device described above, in the step of forming the plurality of terminal portions, the terminal portions are formed such that the terminal portion formed on the one plate surface of the frame body portion has an elliptic shape and that the terminal portion formed on the other plate surface of the frame body portion has a circular shape, and the terminal portion having the elliptic shape is formed such that a long diameter direction of the elliptic shape extends toward a central portion of the semiconductor element.

A semiconductor device according to the present technology includes a semiconductor base that includes a semiconductor element and has a plurality of electrode portions provided for external connection and disposed on one surface of the semiconductor base, and columnar terminals provided in such a manner as to protrude from the electrode portions of the semiconductor base and each including a part of a lead frame.

According to another aspect of the semiconductor device of the present technology, in the semiconductor device described above, a junction surface of each of the columnar terminals joined to the corresponding electrode portion is larger than a distal end side end surface of the corresponding columnar terminal.

According to a further aspect of the semiconductor device of the present technology, in the semiconductor device described above, each of the columnar terminals is formed such that a junction surface joined to the corresponding electrode portion has an elliptic shape and an end surface on a distal end side has a circular shape, and each of a plurality of the columnar terminals is provided such that a major axis direction of the elliptic shape of the junction surface joined to the corresponding electrode portion extends toward a central portion of the semiconductor base.

A still further aspect of the semiconductor device of the present technology further includes, in the semiconductor device described above, a heat dissipation pad provided on the one surface of the semiconductor base and including a part of the lead frame.

A still further aspect of the semiconductor device of the present technology further includes, in the semiconductor device described above, a reinforcing portion provided on the one surface of the semiconductor base and including a part of the lead frame.

A still further aspect of the semiconductor device of the present technology further includes, in the semiconductor device described above, a GND plain provided on the one surface of the semiconductor base and including a part of the lead frame.

A still further aspect of the semiconductor device of the present technology further includes, in the semiconductor device described above a second semiconductor element provided on the one surface of the semiconductor base, and a shield portion provided on the one surface of the semiconductor base and including a part of the lead frame in such a manner as to cover the second semiconductor element.

An electronic apparatus according to the present technology includes a semiconductor device that includes a semiconductor base that includes a semiconductor element and has a plurality of electrode portions provided for external connection and disposed on one surface of the semiconductor base, and columnar terminals provided in such a manner as to protrude from the electrode portions of the semiconductor base and each including a part of a lead frame.

FIGS. 4A, 4B, 4C, and 4D are explanatory diagrams of a manufacturing method of the solid-state imaging device according to the first embodiment of the present technology.

FIGS. 5A, 5B, 5C, and 5D are explanatory diagrams of the manufacturing method of the solid-state imaging device according to the first embodiment of the present technology.

Figure 6:
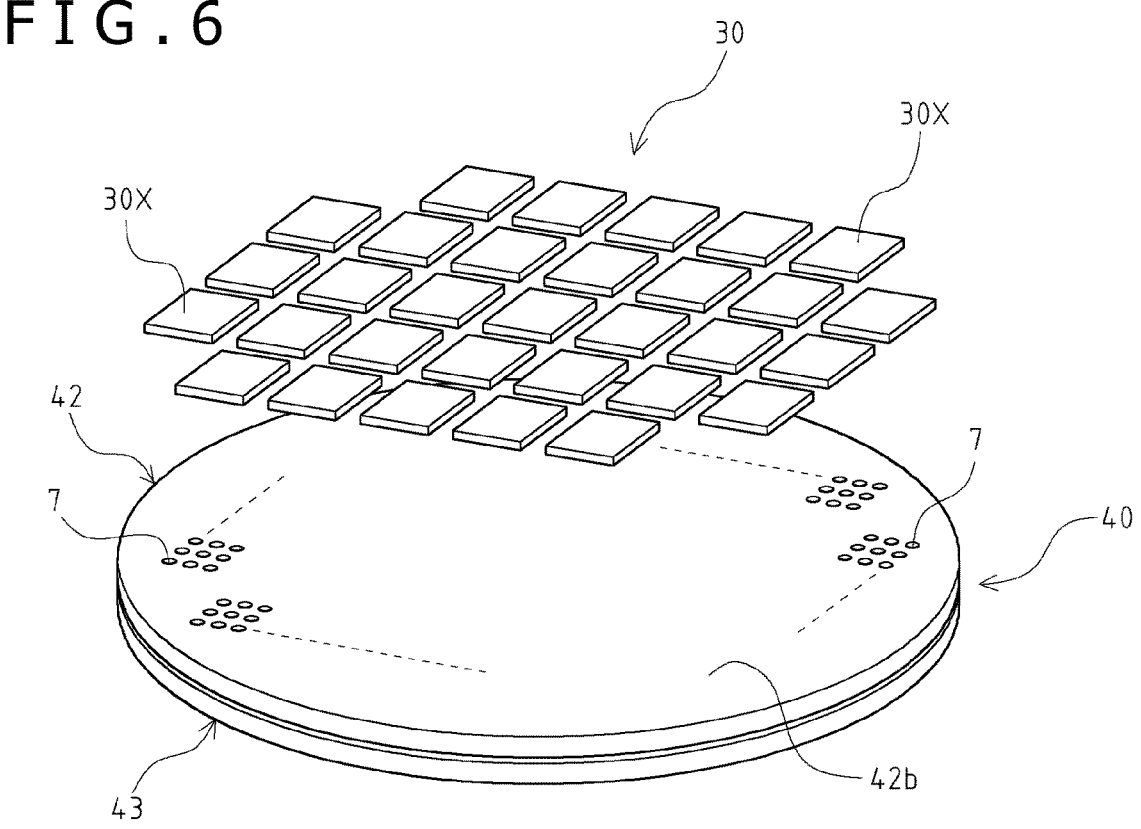

FIG. 6 is a diagram depicting a mode of mounting of a lead frame on a wafer CSP according to the first embodiment of the present technology.

Figure 7A:
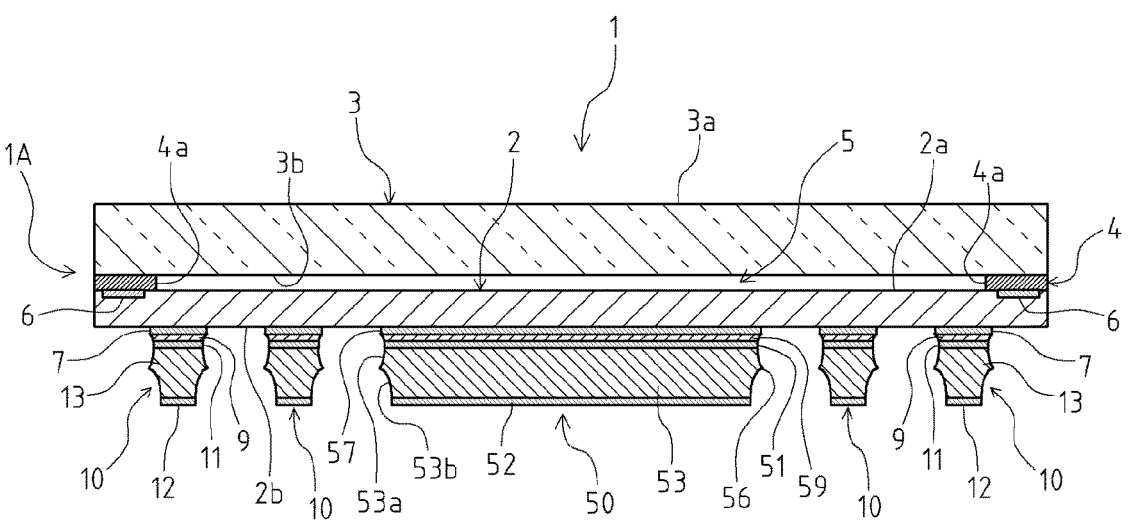
Figure 7B:
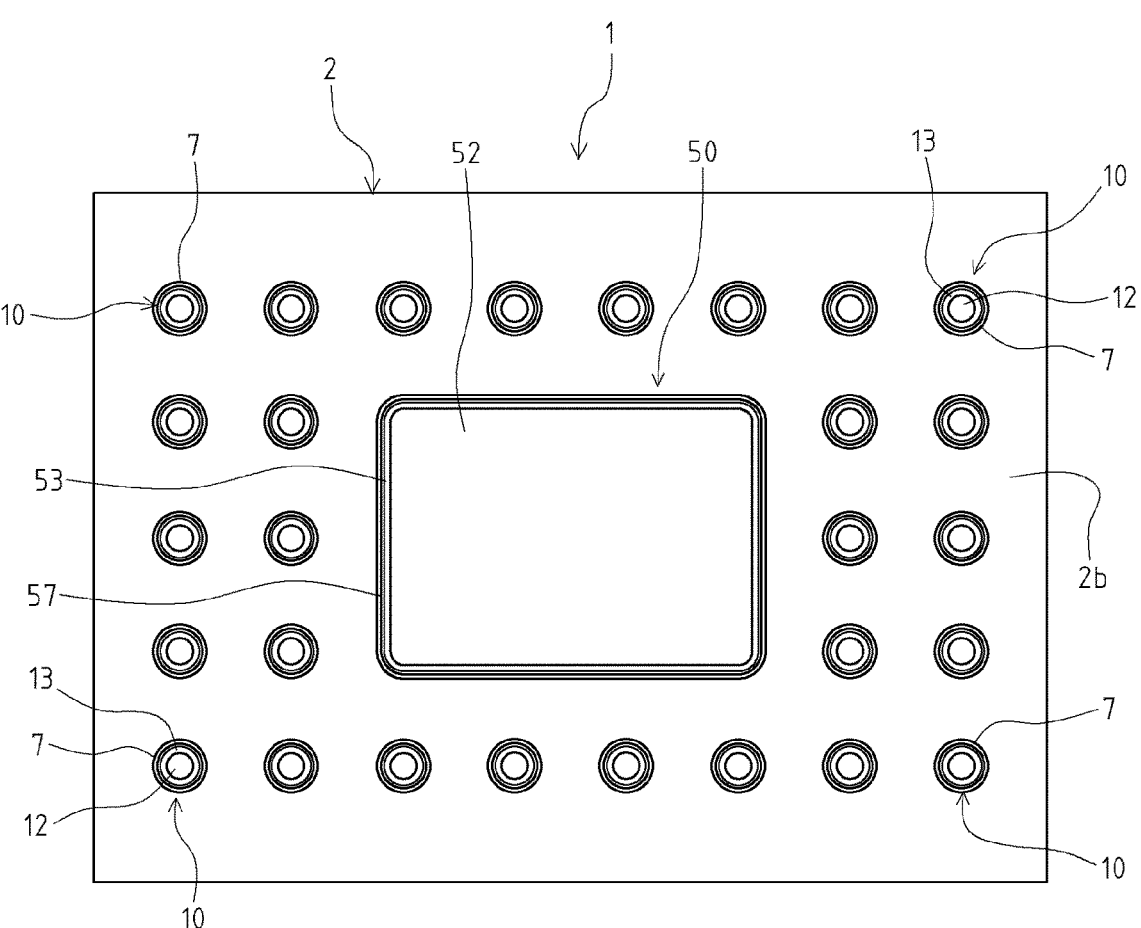

FIGS. 7A and 7B are diagrams depicting a configuration of a solid-state imaging element in modification 1 according to the first embodiment of the present technology. A FIG. 7A is a cross-sectional diagram, and a FIG. 7B is a bottom diagram.

Figure 8A:
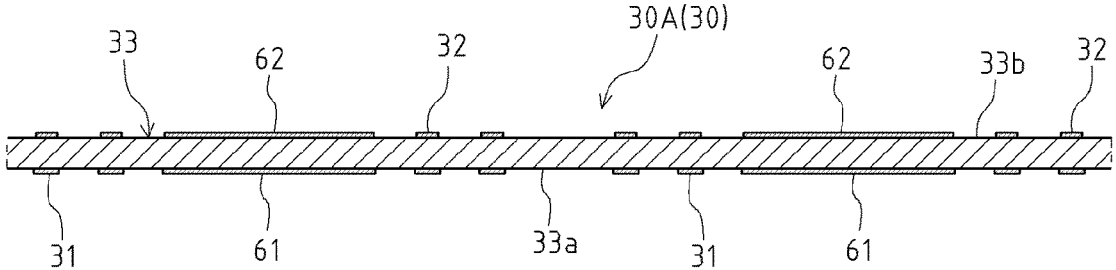
Figure 8B:
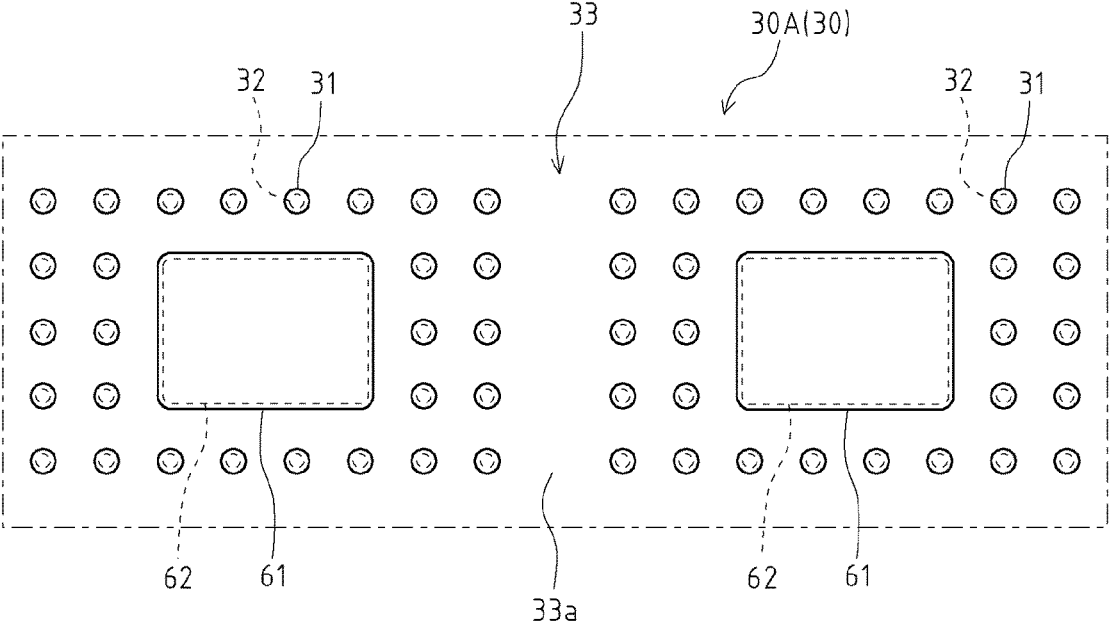

FIGS. 8A and 8B are diagrams depicting a configuration of a lead frame of the solid-state imaging element in modification 1 according to the first embodiment of the present technology. A FIG. 8A is a cross-sectional diagram, and a FIG. 8B is a bottom diagram.

Figure 9A:
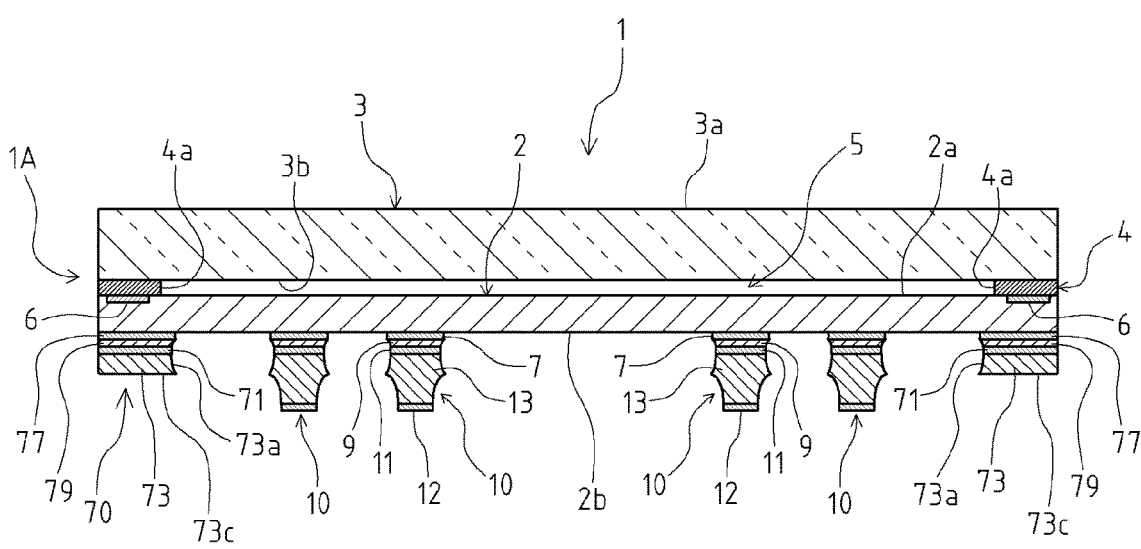
Figure 9B:
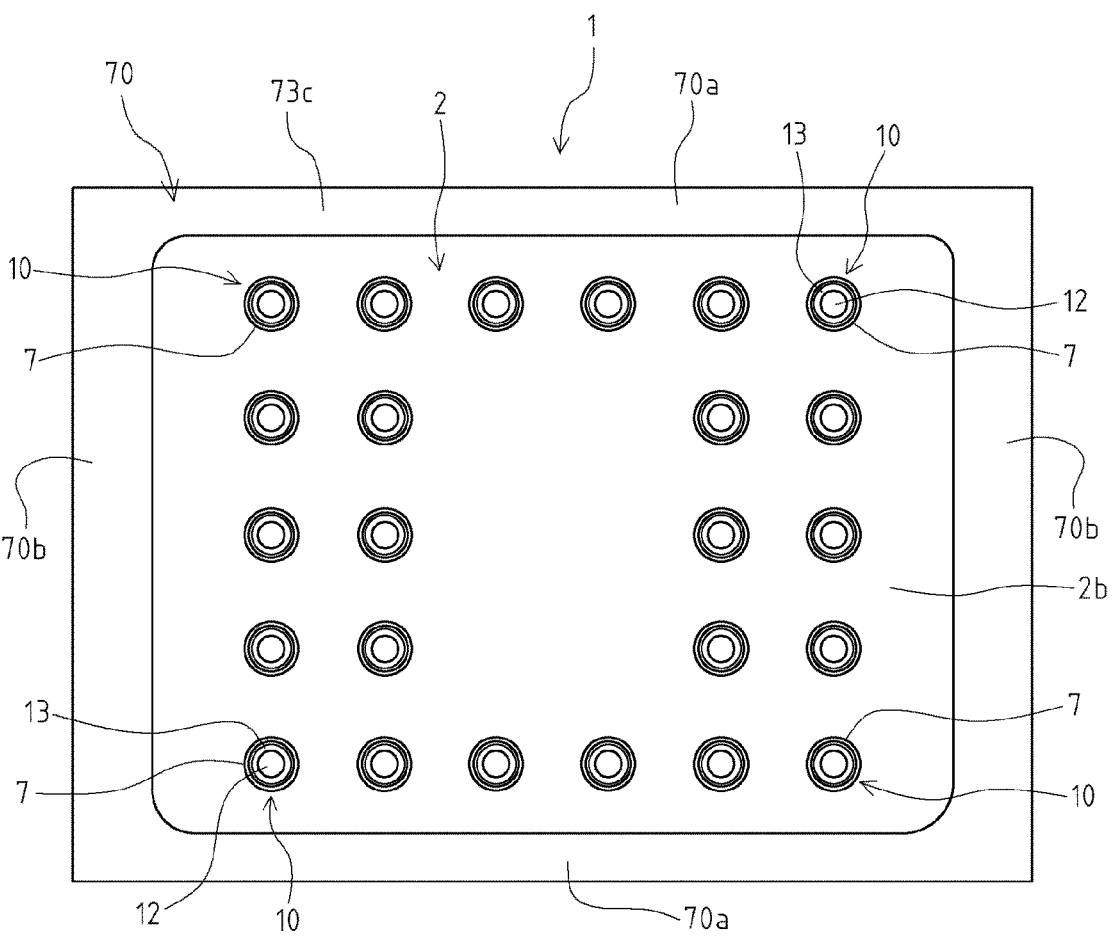

FIGS. 9A and 9B are diagrams depicting a configuration of a solid-state imaging element in modification 2 according to the first embodiment of the present technology. A FIG. 9A is a cross-sectional diagram, and a FIG. 9B is a bottom diagram.

Figure 10A:
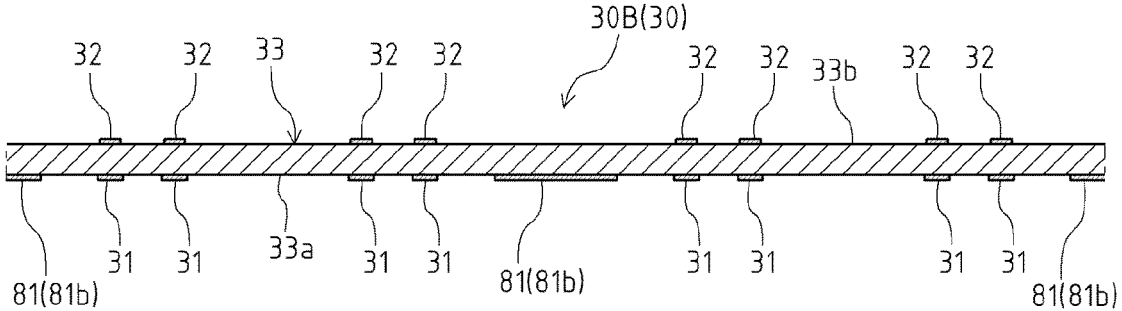
Figure 10B:
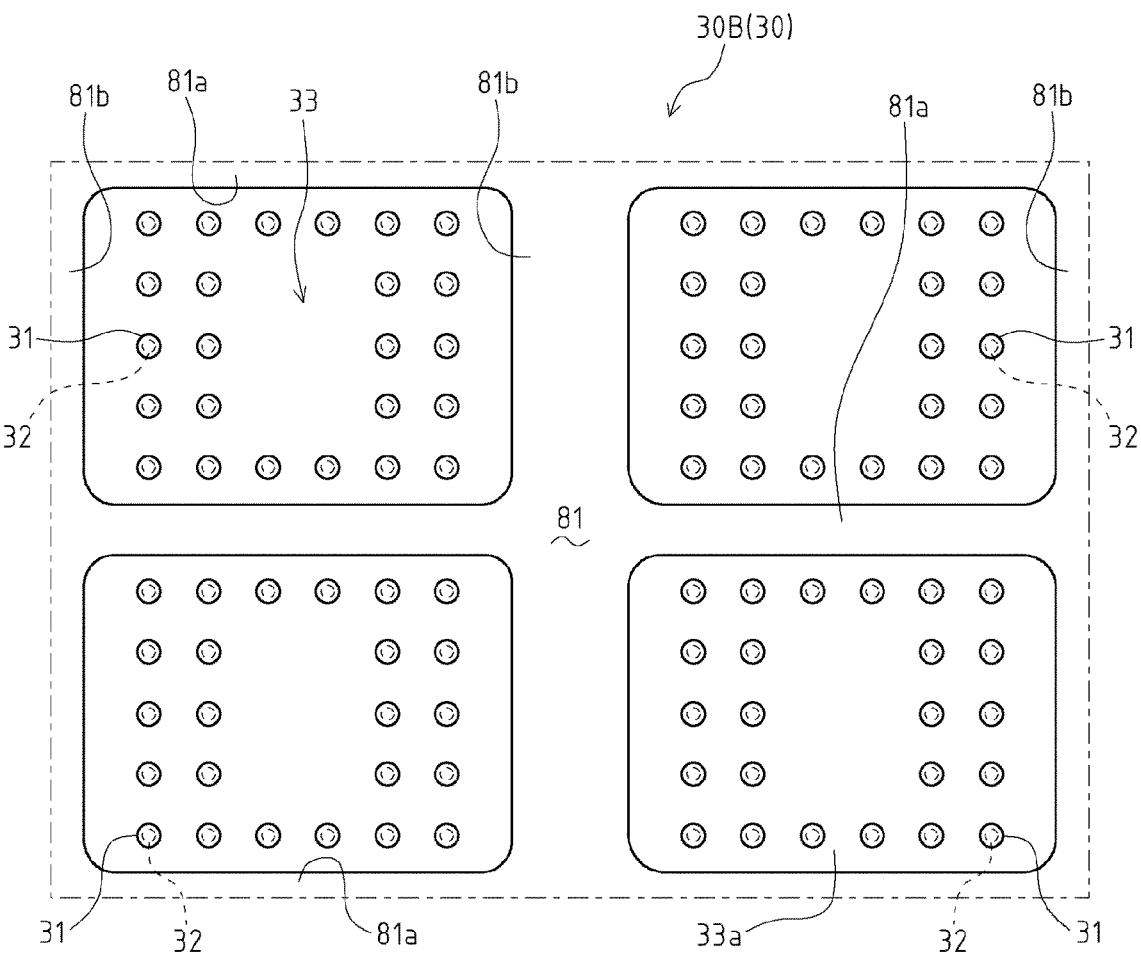

FIGS. 10A and 10B are diagrams depicting a configuration of a lead frame of the solid-state imaging element in modification 2 according to the first embodiment of the present technology. A FIG. 10A is a cross-sectional diagram, and a FIG. 10B is a bottom diagram.

Figure 11A:
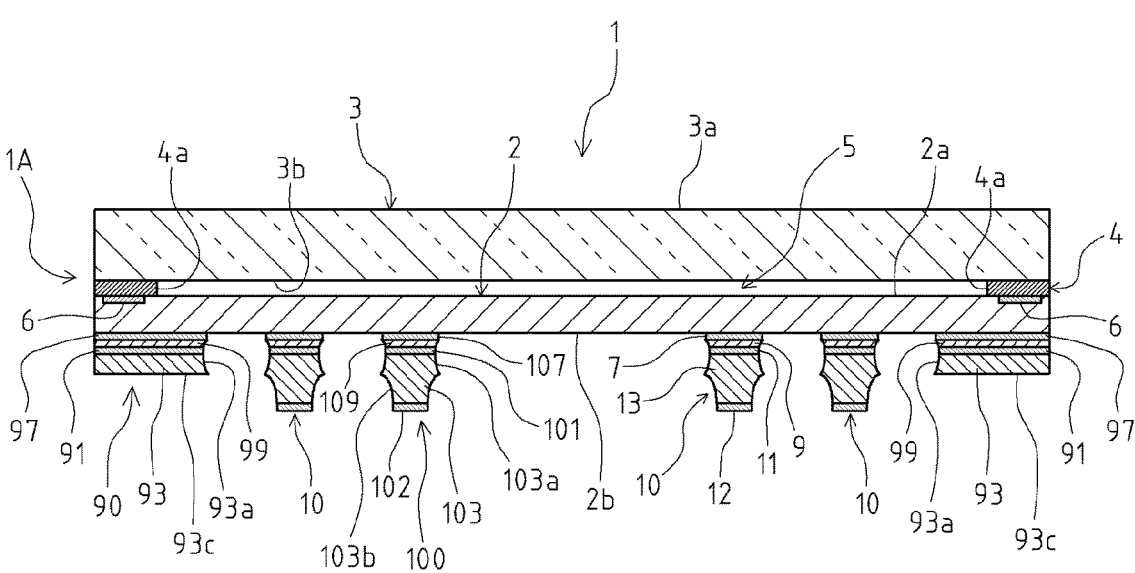
Figure 11B:
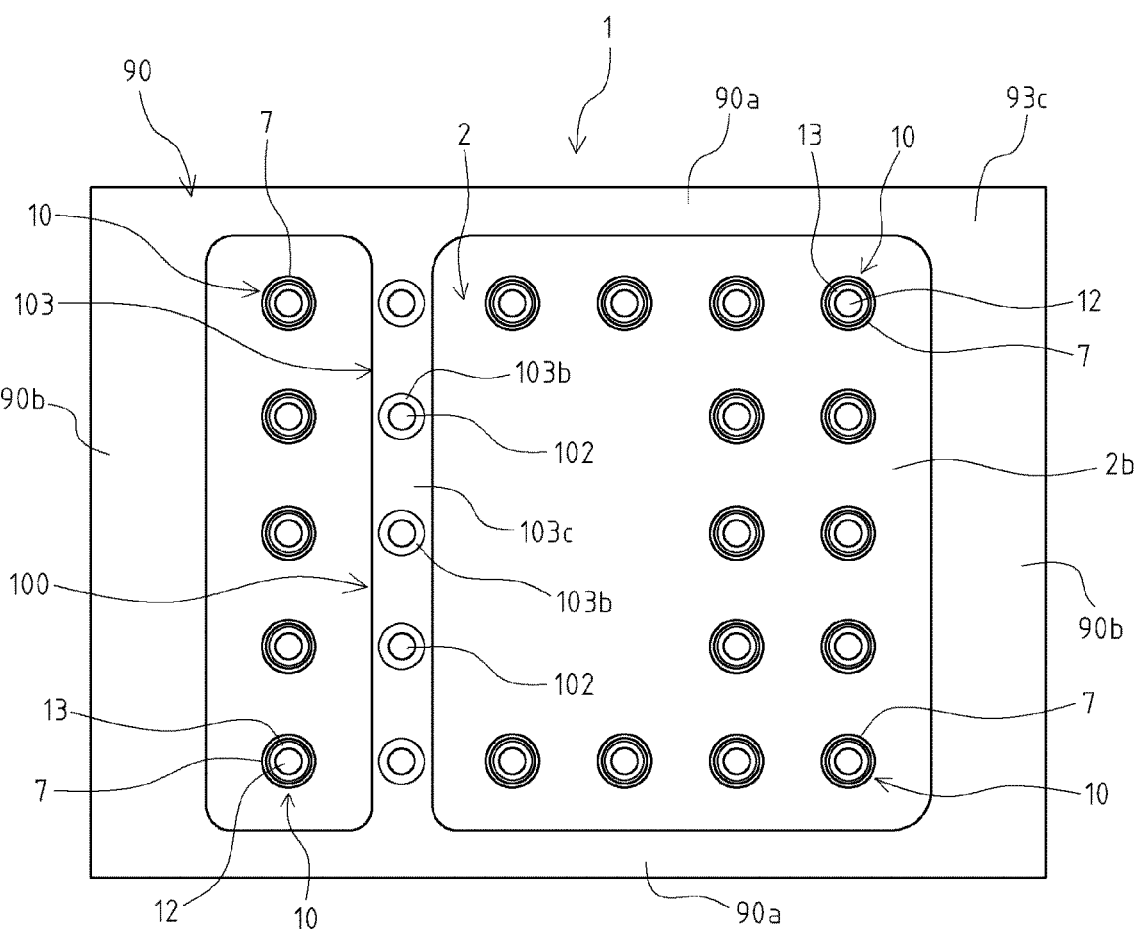

FIGS. 11A and 11B are diagrams depicting a configuration of a solid-state imaging element in modification 3 according to the first embodiment of the present technology. A FIG. 11A is a cross-sectional diagram, and a FIG. 11B is a bottom diagram.

Figure 12A:
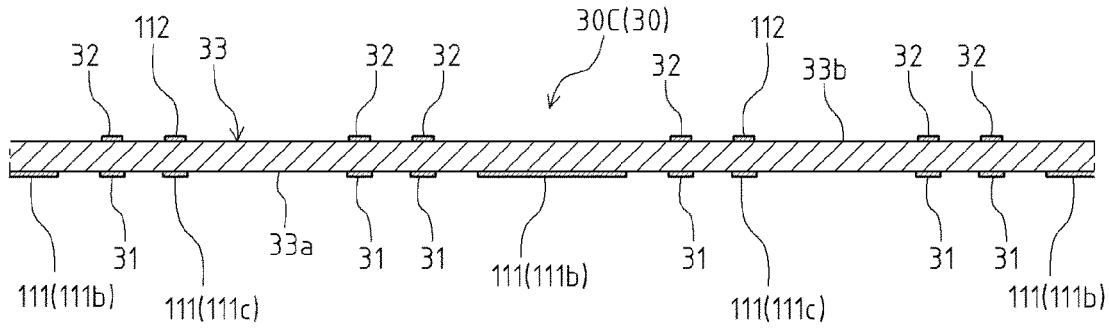
Figure 12B:
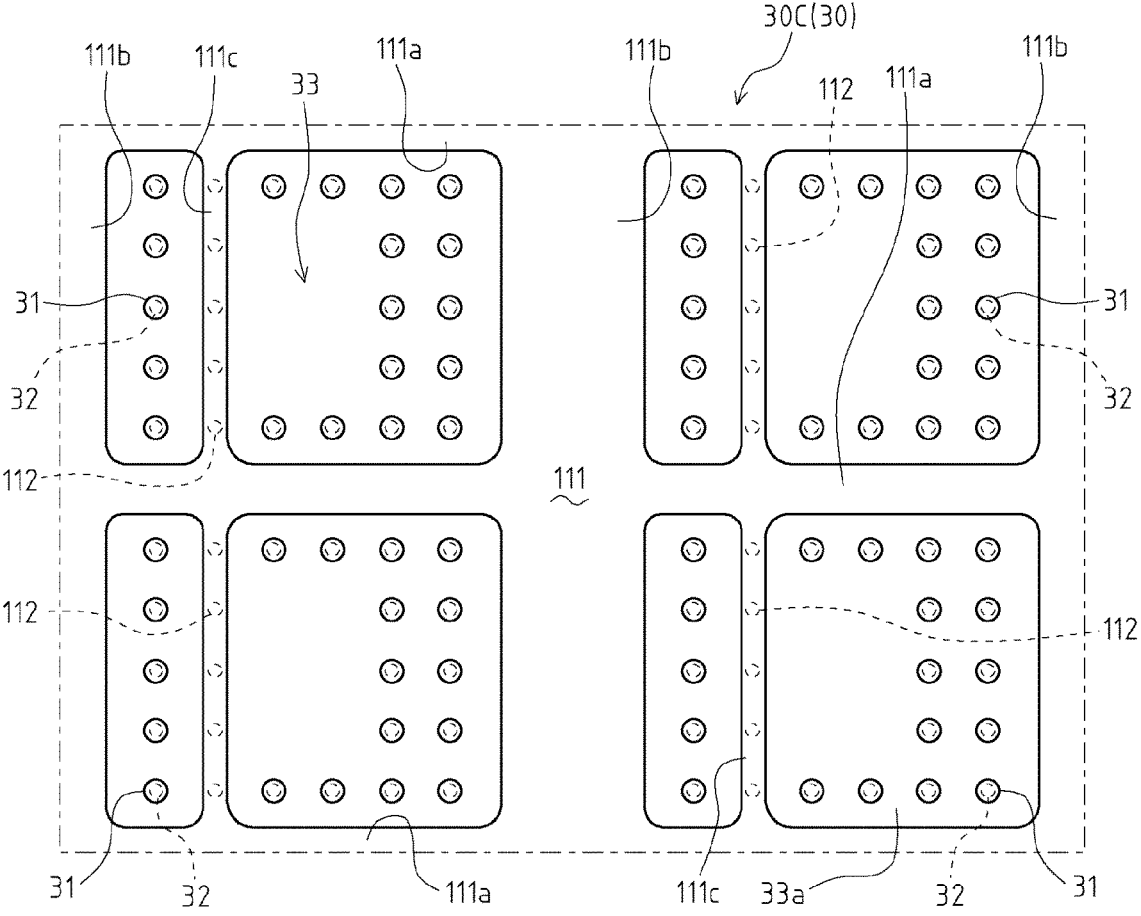

FIGS. 12A and 12B are diagrams depicting a configuration of a lead frame of the solid-state imaging element in modification 3 according to the first embodiment of the present technology. A FIG. 12A is a cross-sectional diagram, and a FIG. 12B is a bottom diagram.

Figure 13A:
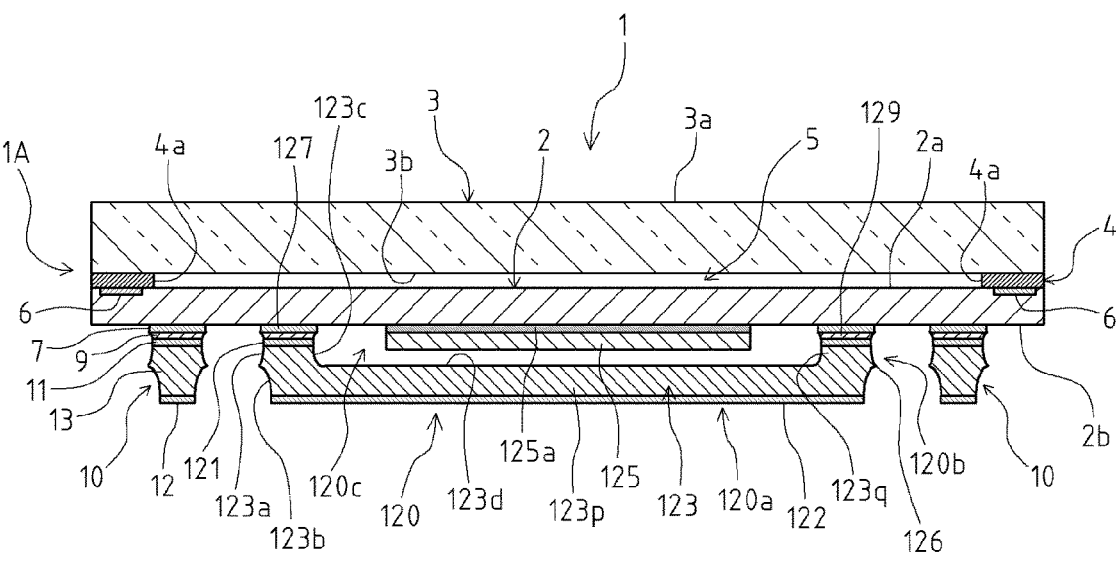
Figure 13B:
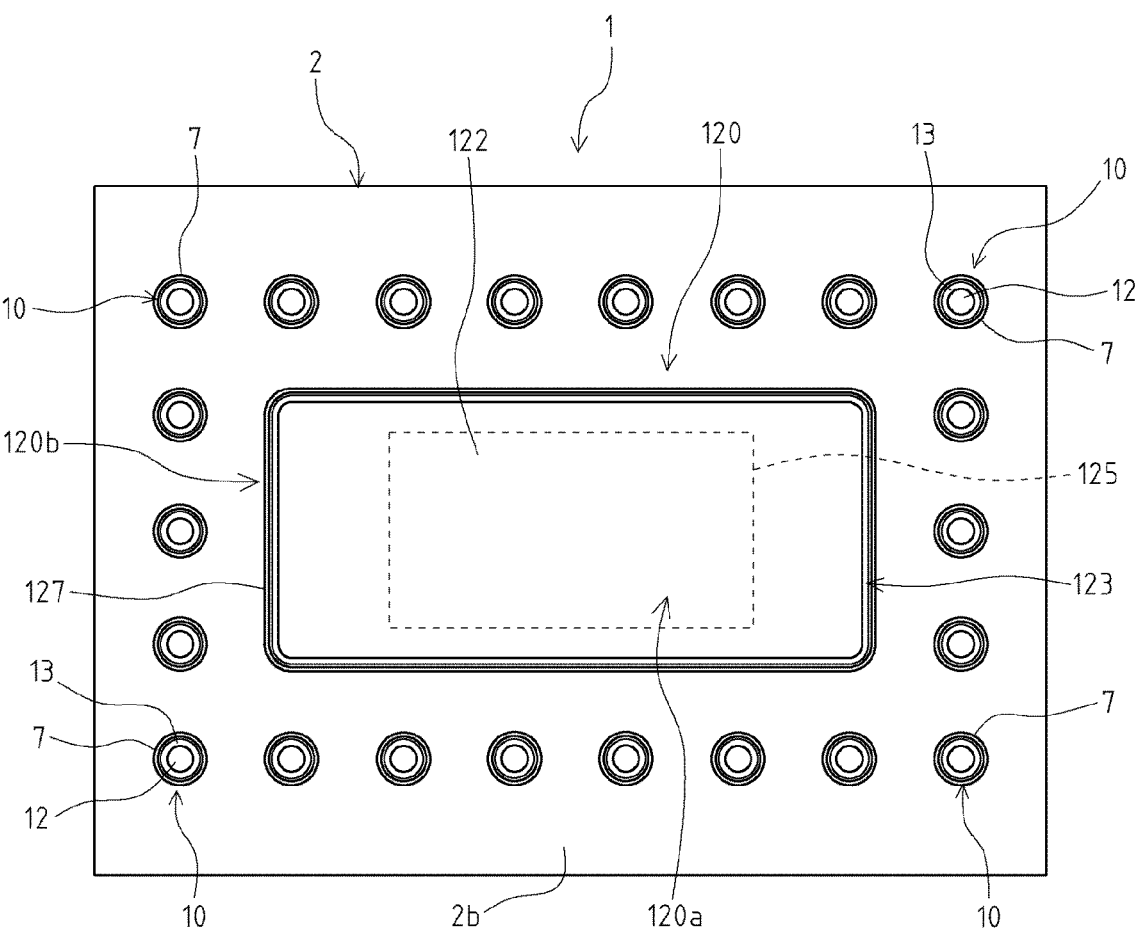

FIGS. 13A and 13B are diagrams depicting a configuration of a solid-state imaging element in modification 4 according to the first embodiment of the present technology. A FIG. 13A is a cross-sectional diagram, and a FIG. 13B is a bottom diagram.

Figure 14A:
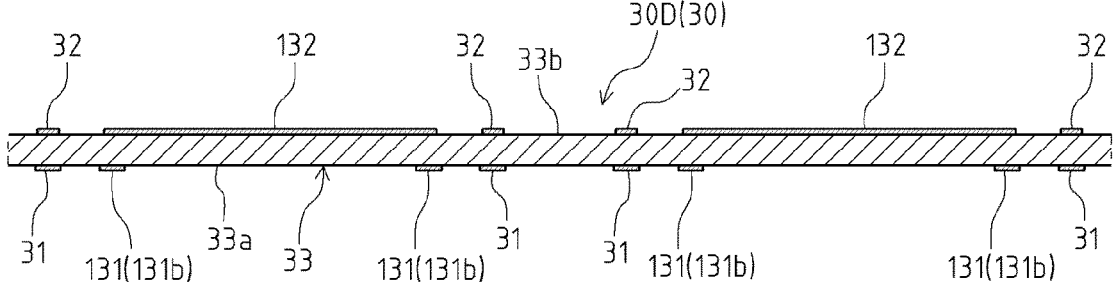
Figure 14B:
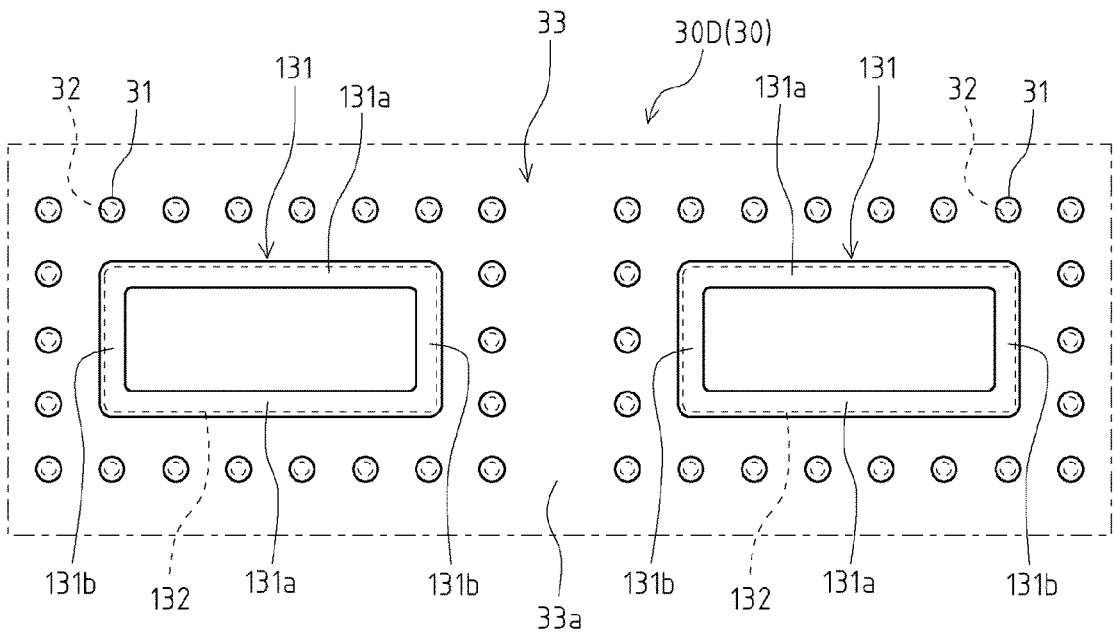

FIGS. 14A and 14B are diagrams depicting a configuration of a lead frame of the solid-state imaging element in modification 4 according to the first embodiment of the present technology. A FIG. 14A is a cross-sectional diagram, and a FIG. 14B is a bottom diagram.

Figure 15A:
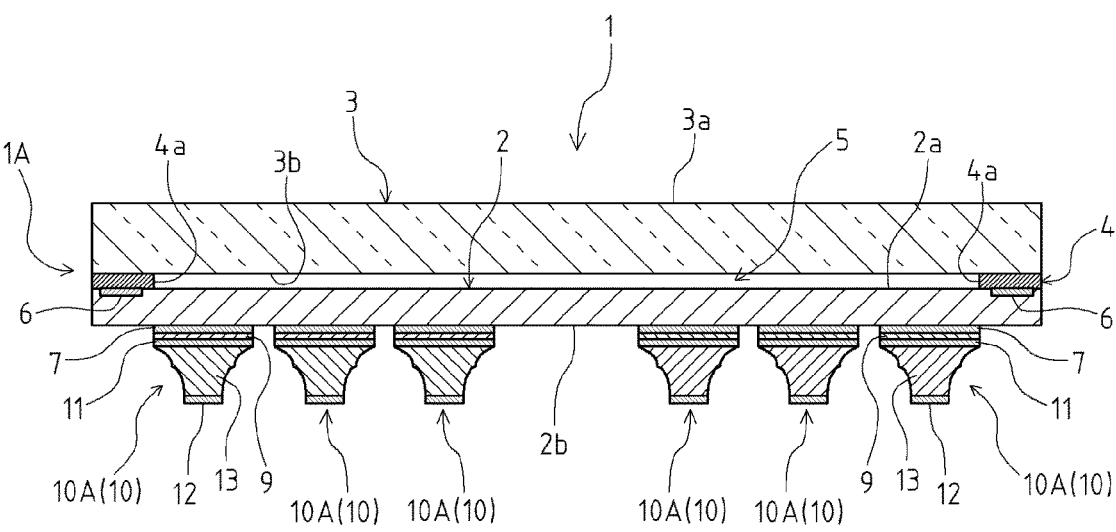
Figure 15B:
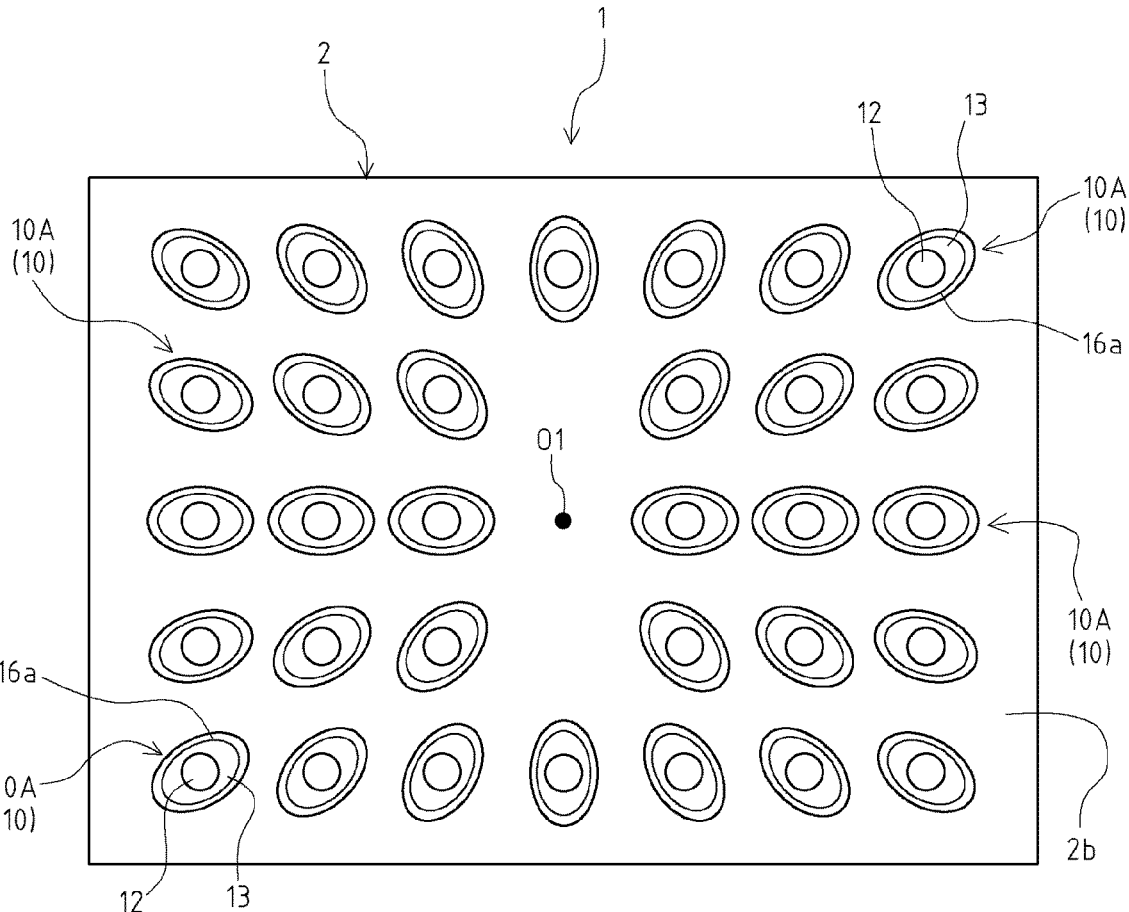

FIGS. 15A and 15B are diagrams depicting a configuration of a solid-state imaging element in modification 5 according to the first embodiment of the present technology. A FIG. 15A is a cross-sectional diagram, and a FIG. 15B is a bottom diagram.

Figure 16A:
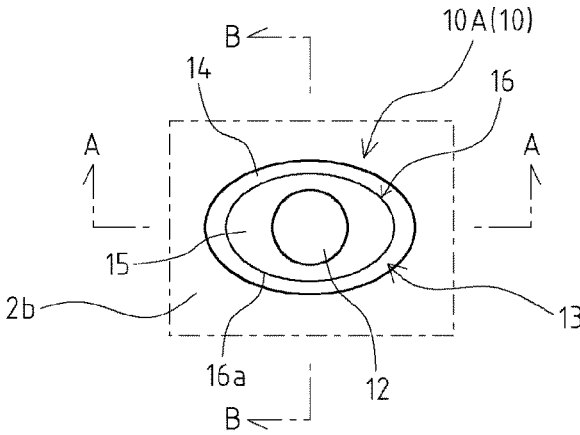
Figure 16B:
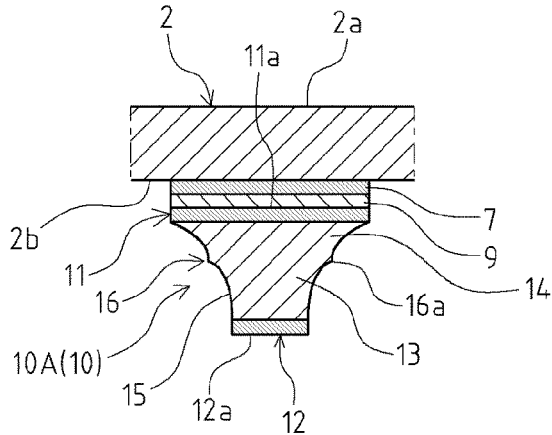
Figure 16C:
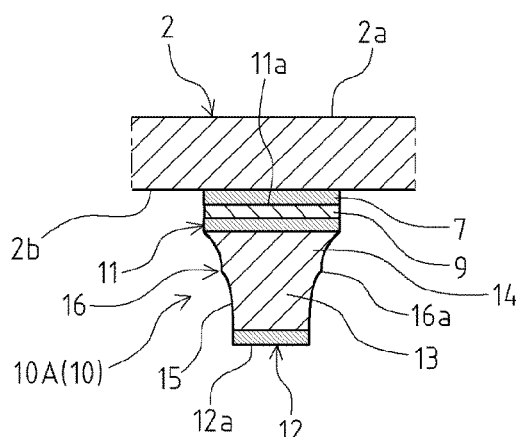

FIGS. 16A, 16B, and 16C are diagrams depicting a configuration of a columnar terminal of the solid-state imaging element in modification 5 according to the first embodiment of the present technology. A FIG. 16A is a bottom diagram, a FIG. 16B is a cross-sectional diagram taken along A-A in the FIG. 16A, and a FIG. 16C is a cross-sectional diagram taken along B-B in the FIG. 16A.

Figure 17A:
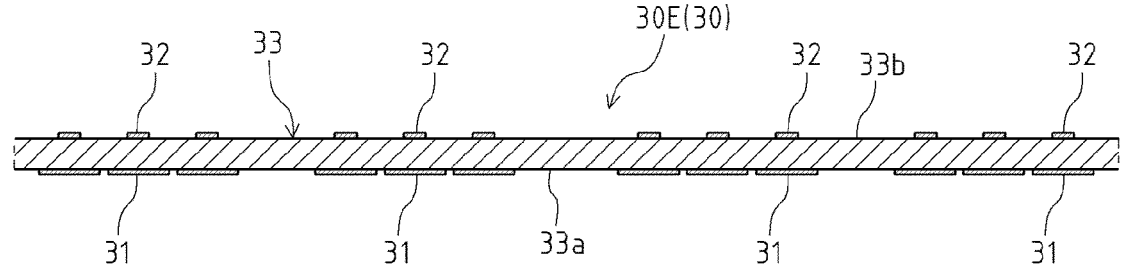
Figure 17B:
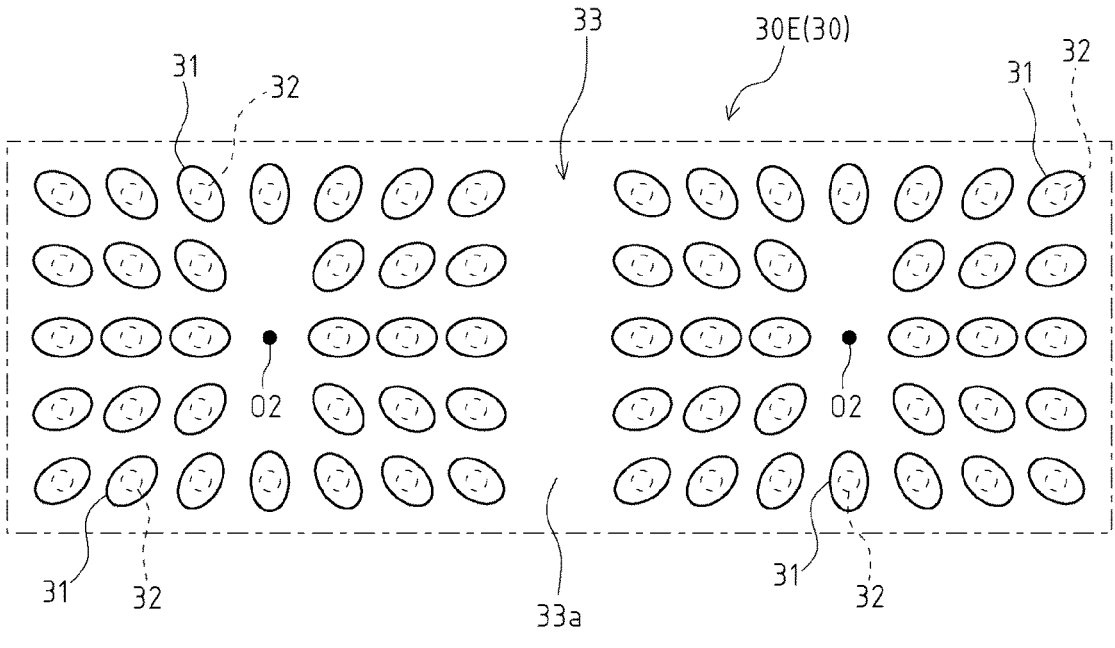

FIGS. 17A and 17B are diagrams depicting a configuration of a lead frame of the solid-state imaging element in modification 5 according to the first embodiment of the present technology. A FIG. 17A is a cross-sectional diagram, and a FIG. 17B is a bottom diagram.

Figure 18:
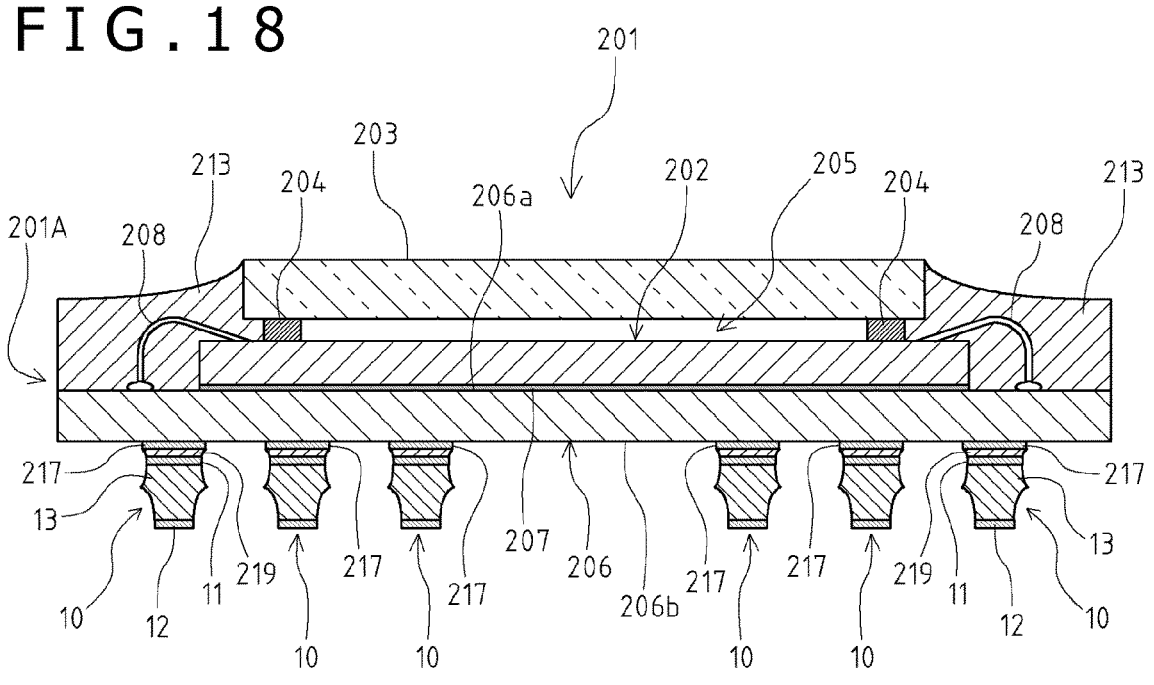

FIG. 18 is a cross-sectional diagram depicting a configuration of a solid-state imaging device according to a second embodiment of the present technology.

Figure 19A:
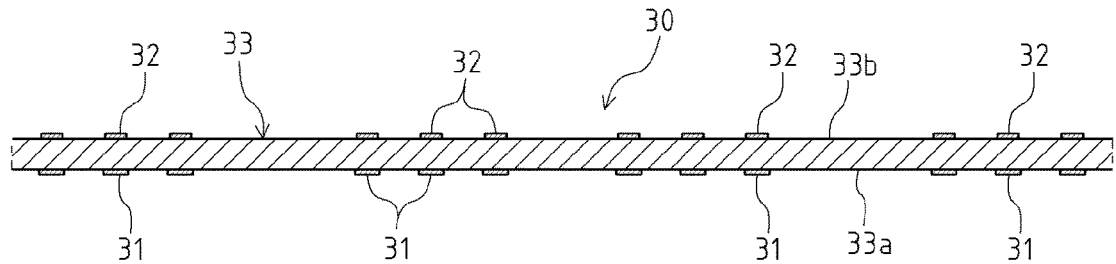
Figure 19B:
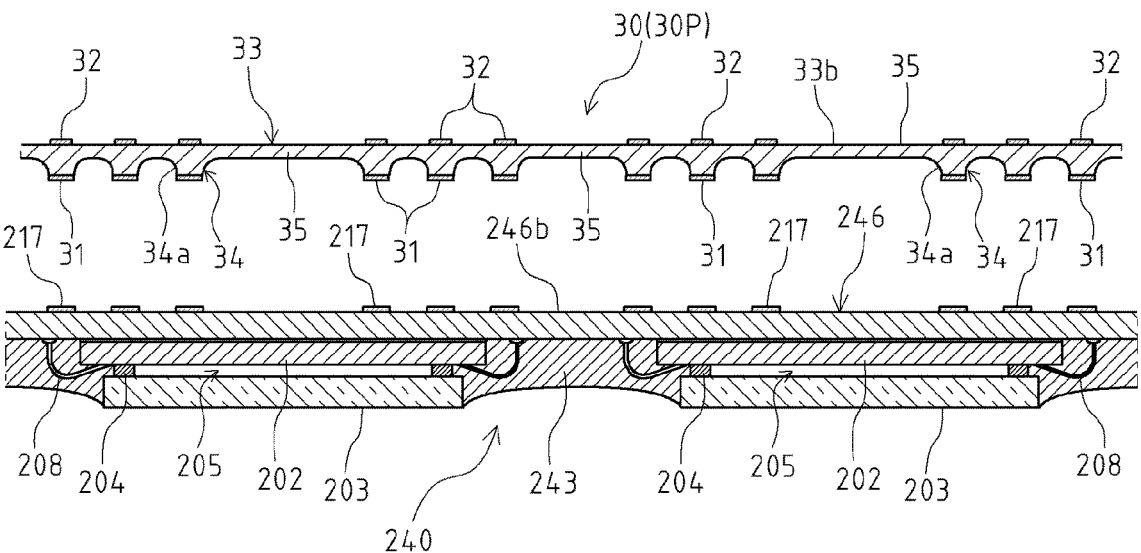
Figure 19C:
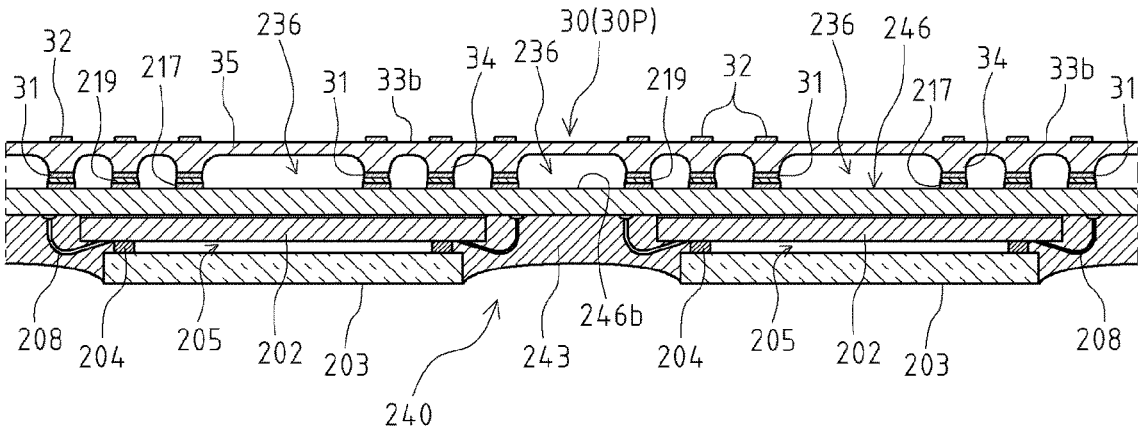

FIGS. 19A, 19B, and 19C are explanatory diagrams of a manufacturing method of the solid-state imaging device according to the second embodiment of the present technology.

Figure 20A:
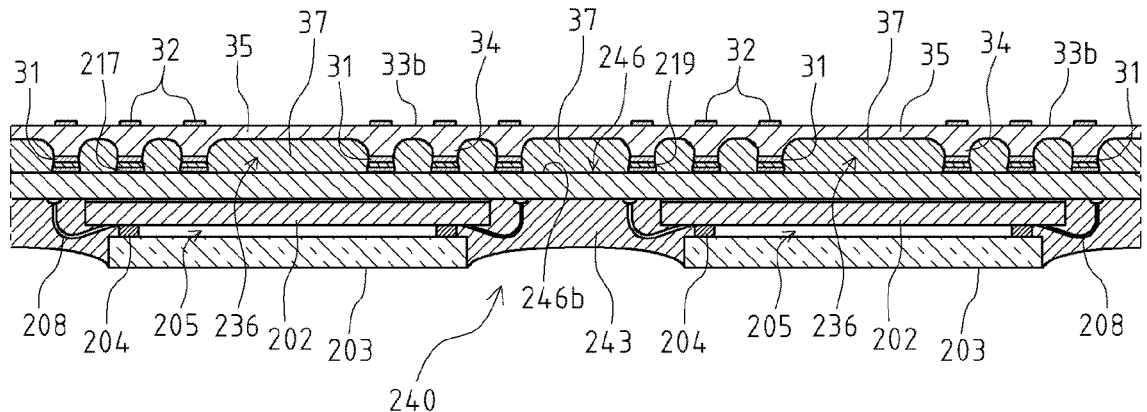
Figure 20B:
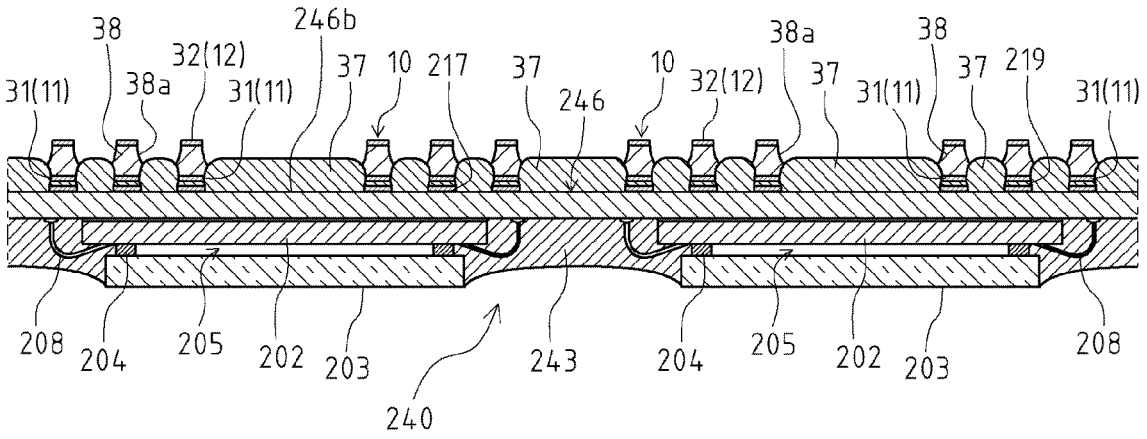
Figure 20C:
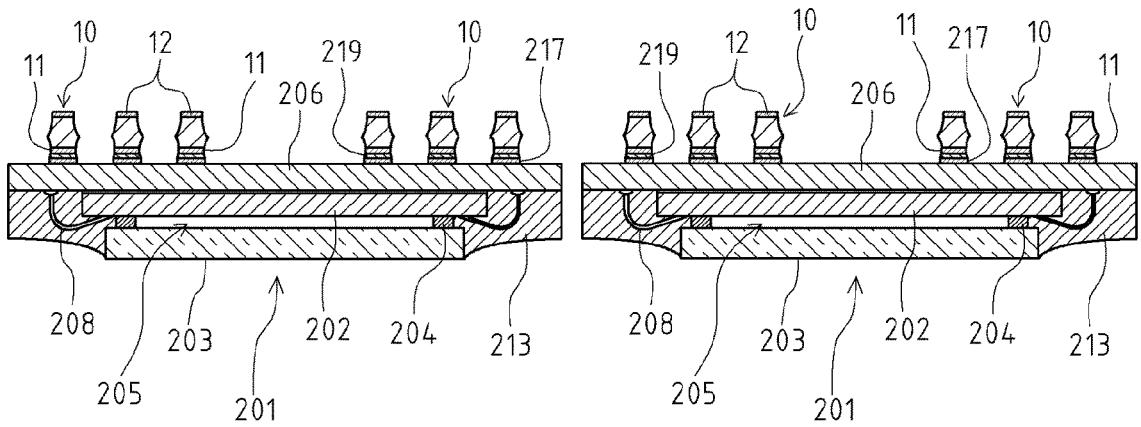

FIGS. 20A, 20B, and 20C are explanatory diagrams of the manufacturing method of the solid-state imaging device according to the second embodiment of the present technology.

Figure 21:
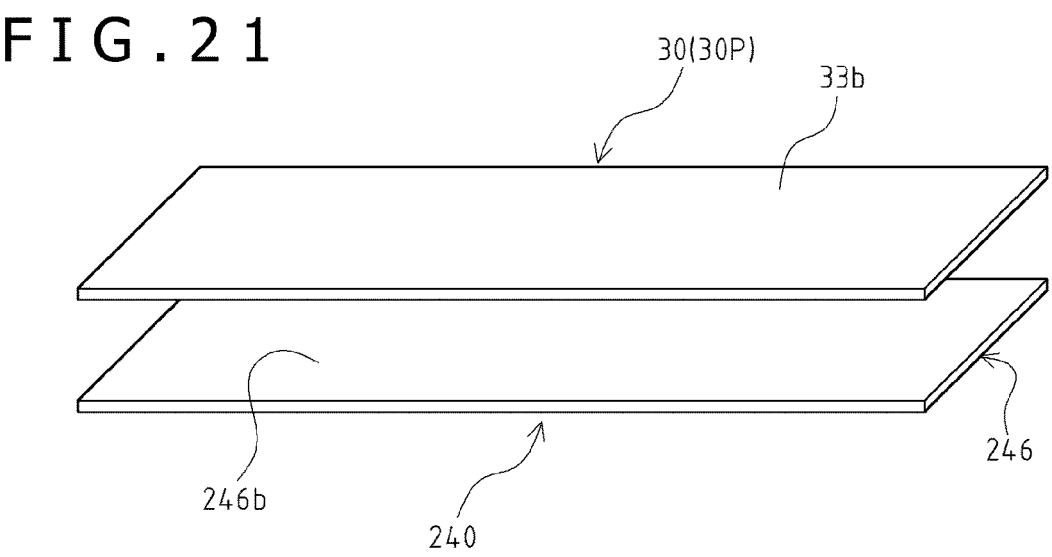

FIG. 21 is a diagram depicting a mode of mounting of a lead frame on an organic substrate package according to the second embodiment of the present technology.

Figure 22:
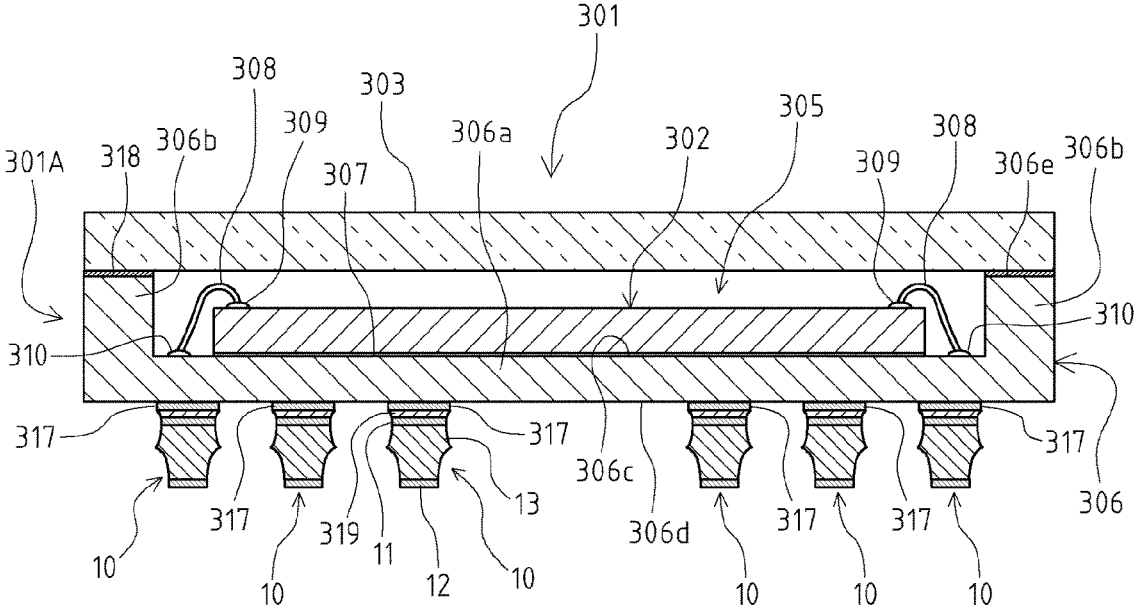

FIG. 22 is a cross-sectional diagram depicting a configuration of a solid-state imaging device according to a third embodiment of the present technology.

FIGS. 23A, 23B, 23C, and 23D are explanatory diagrams of a manufacturing method of the solid-state imaging device according to the third embodiment of the present technology.

FIGS. 24A, 24B, 24C, and 24D are explanatory diagrams of the manufacturing method of the solid-state imaging device according to the third embodiment of the present technology.

FIG. 25 is a diagram depicting a mode of mounting of a lead frame on a ceramic package according to the third embodiment of the present technology.

FIG. 26 is a cross-sectional diagram depicting a configuration of a semiconductor device according to a fourth embodiment of the present technology.

FIGS. 27A, 27B, 27C, and 27D are explanatory diagrams of a manufacturing method of the semiconductor device according to the fourth embodiment of the present technology.

Figure 28A:
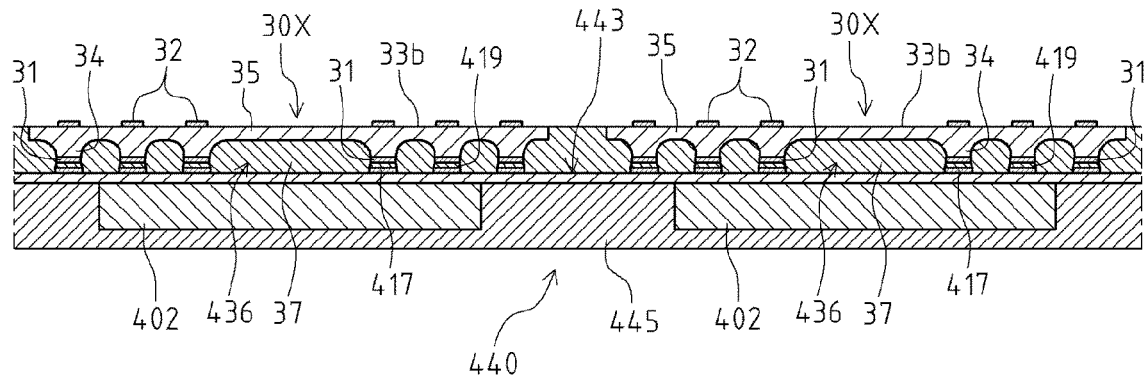
Figure 28B:
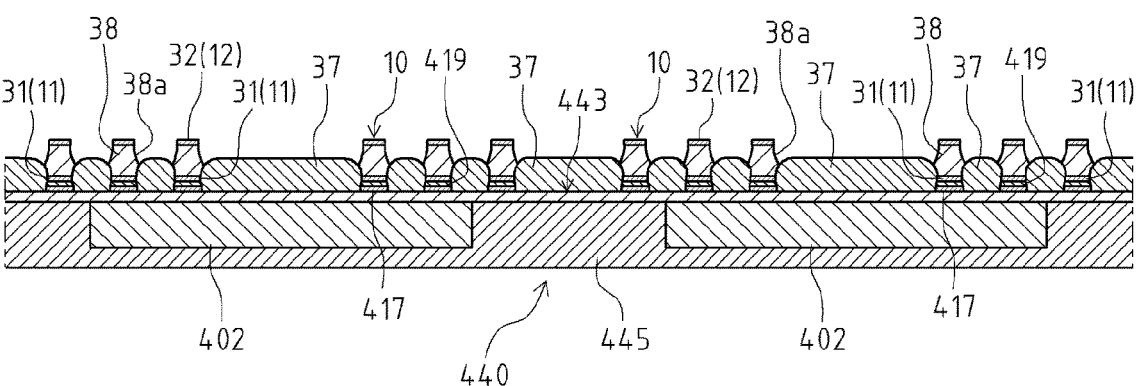
Figure 28C:
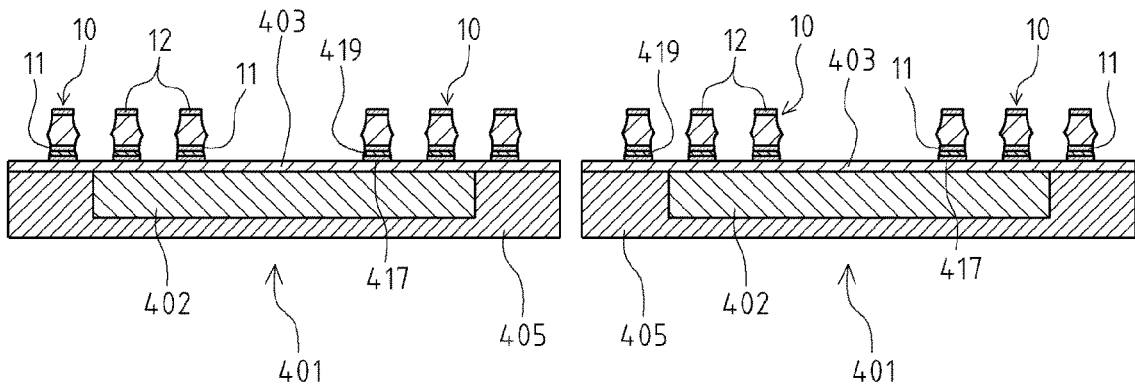

FIGS. 28A, 28B, and 28C are explanatory diagrams of the manufacturing method of the semiconductor device according to the fourth embodiment of the present technology.

Figure 29:
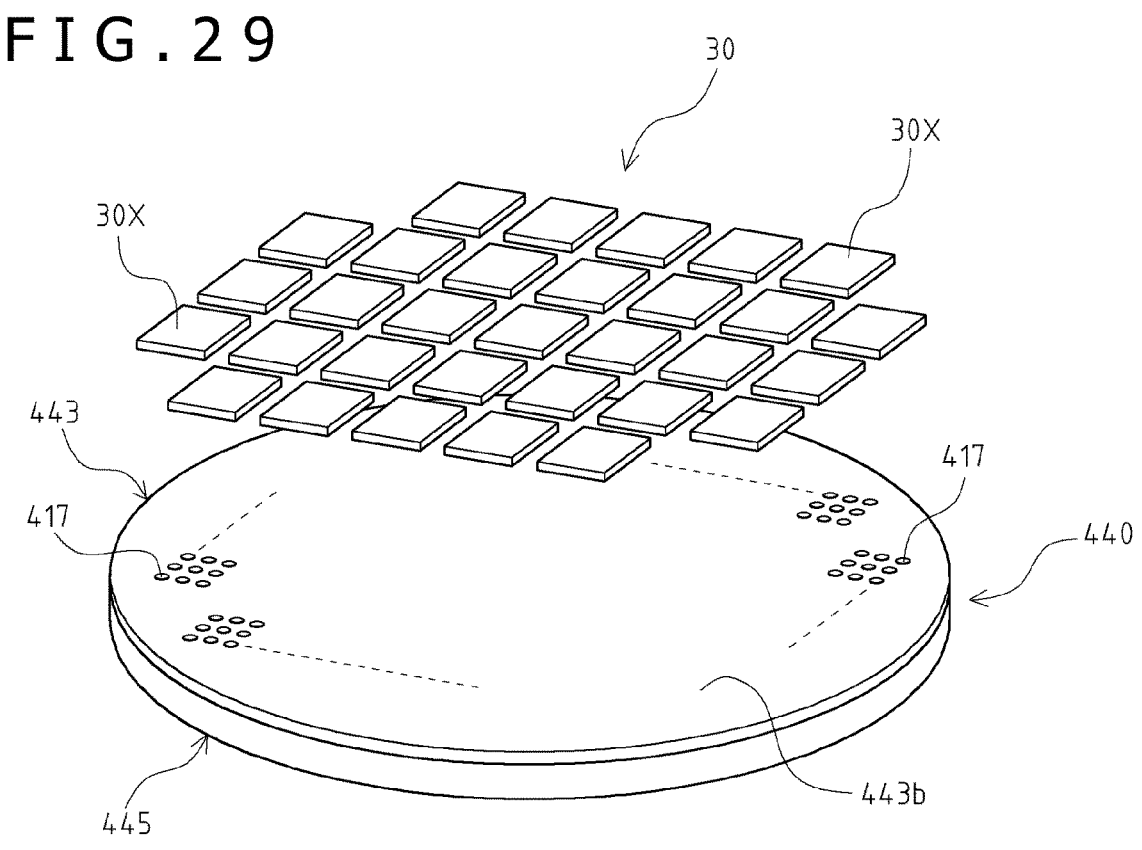

FIG. 29 is a diagram depicting a mode of mounting of a lead frame on a wafer FOWLP according to the fourth embodiment of the present technology.

Figure 30:
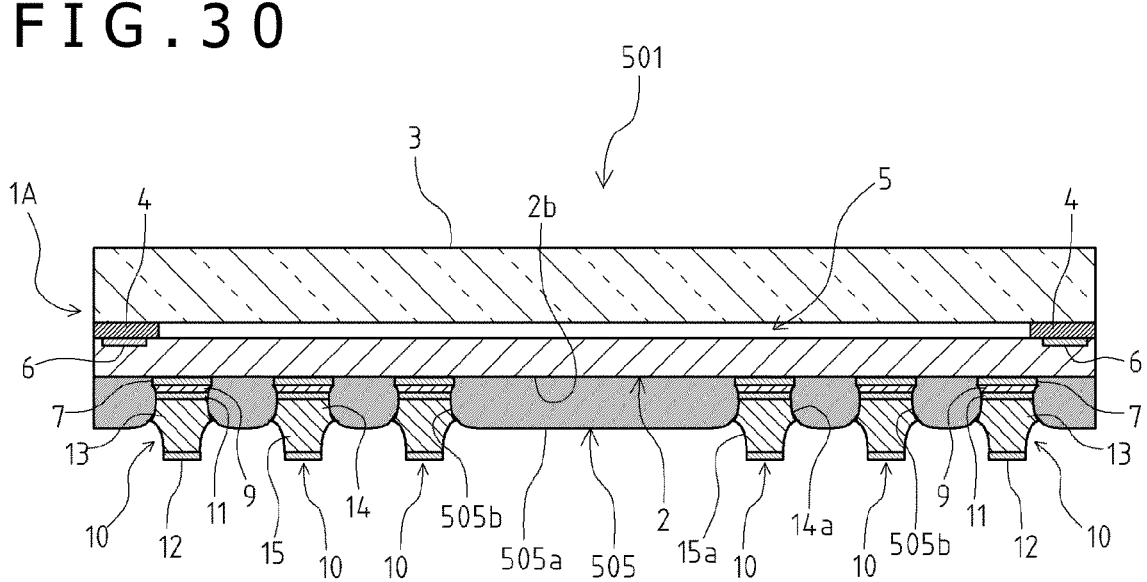

FIG. 30 is a cross-sectional diagram depicting a configuration of a solid-state imaging device according to a fifth embodiment of the present technology.

FIGS. 31A, 31B, 31C, and 31D are explanatory diagrams of a manufacturing method of the solid-state imaging device according to the fifth embodiment of the present technology.

Figure 32A:
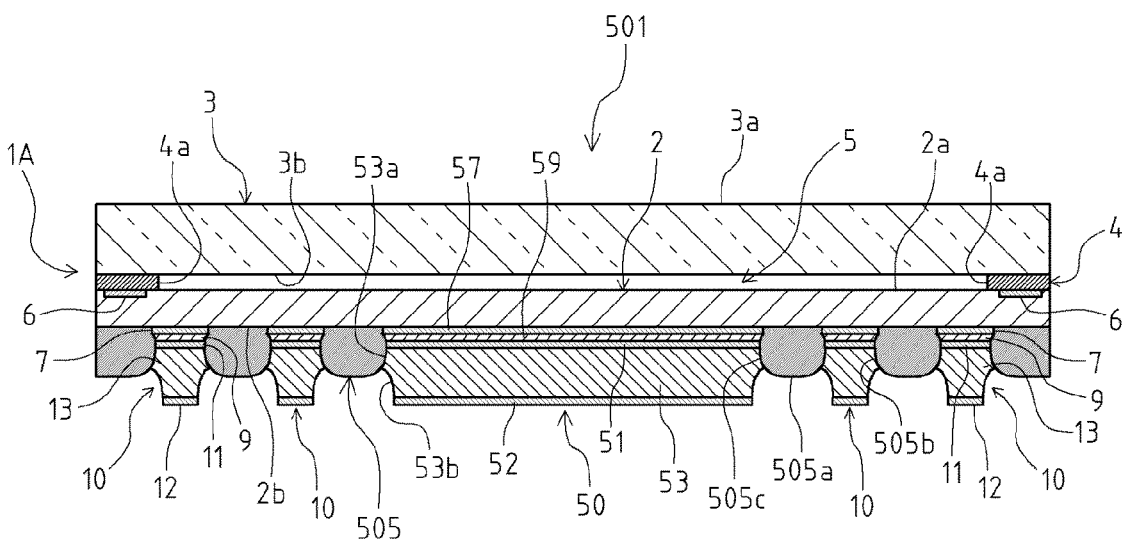
Figure 32B:
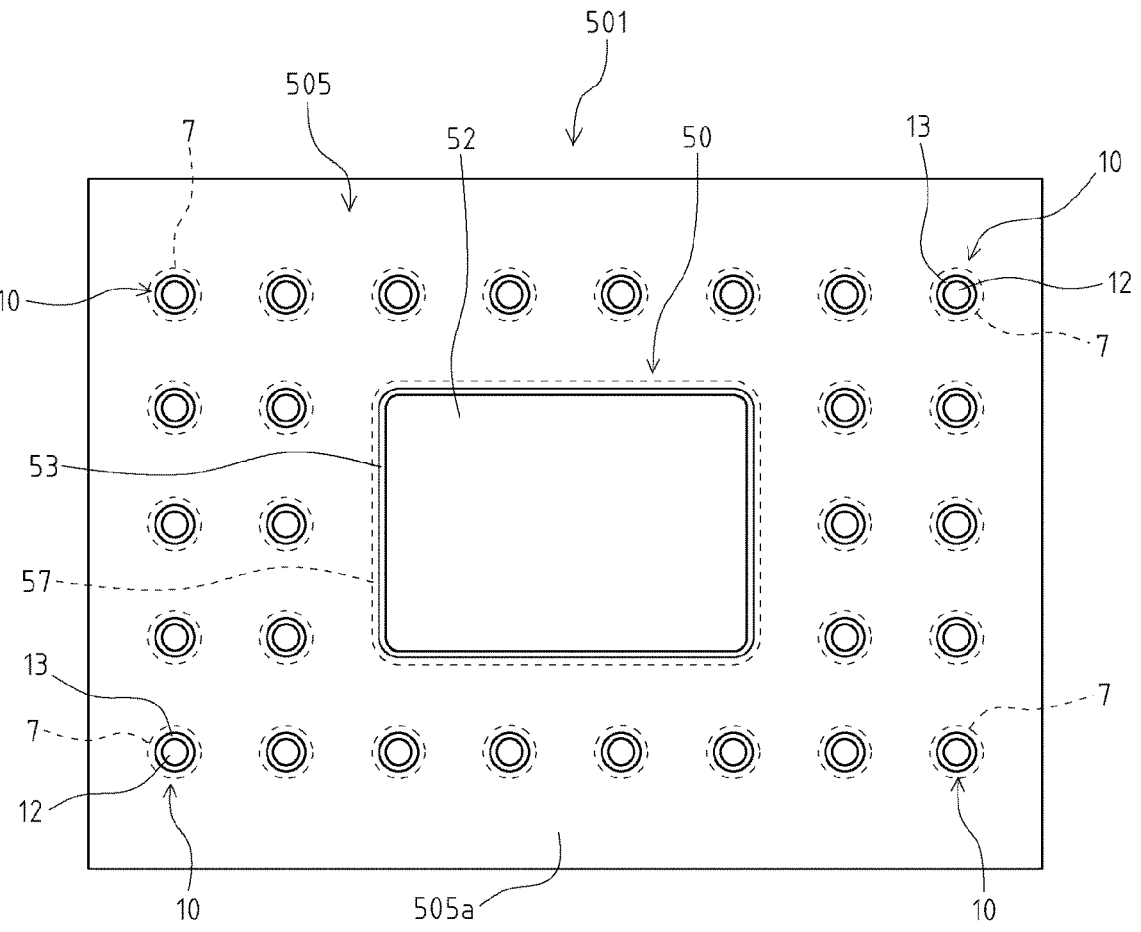

FIGS. 32A and 32B are diagrams depicting a configuration of a solid-state imaging element in modification 1 according to the fifth embodiment of the present technology. A FIG. 32A is a cross-sectional diagram, and a FIG. 32B is a bottom diagram.

Figure 33A:
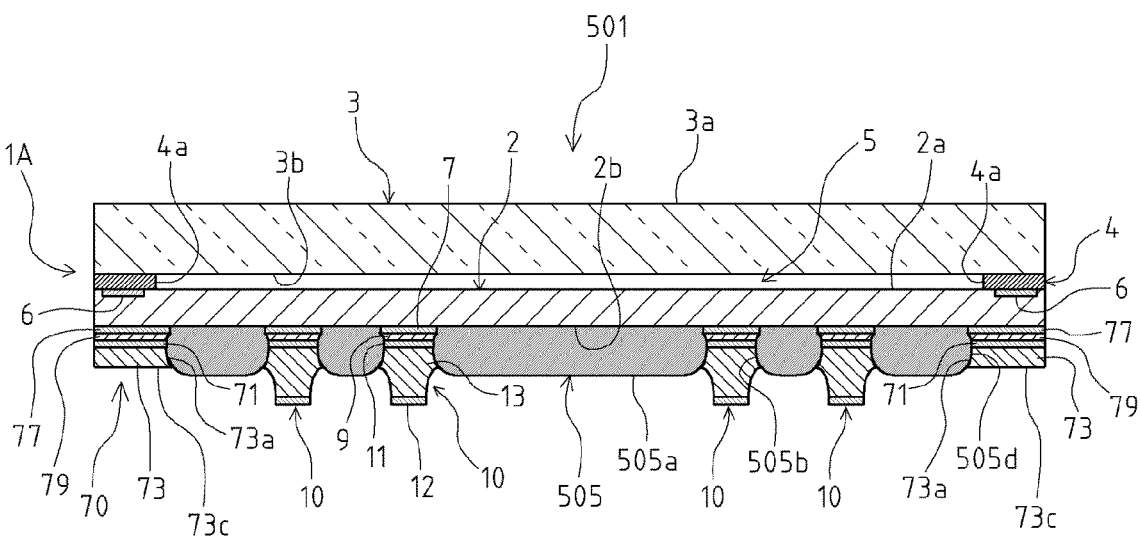
Figure 33B:
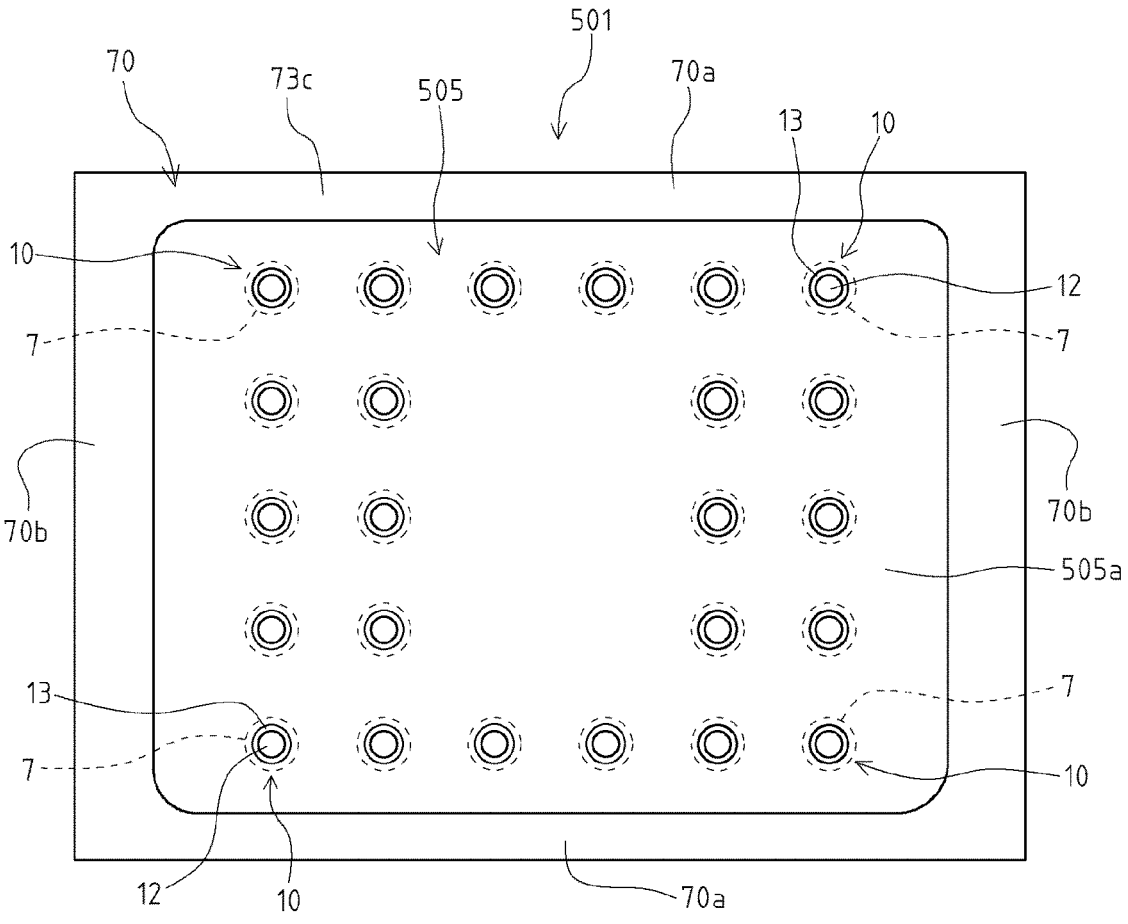

FIGS. 33A and 33B are diagrams depicting a configuration of a solid-state imaging element in modification 2 according to the fifth embodiment of the present technology. A FIG. 33A is a cross-sectional diagram, and a FIG. 33B is a bottom diagram.

Figure 34A:
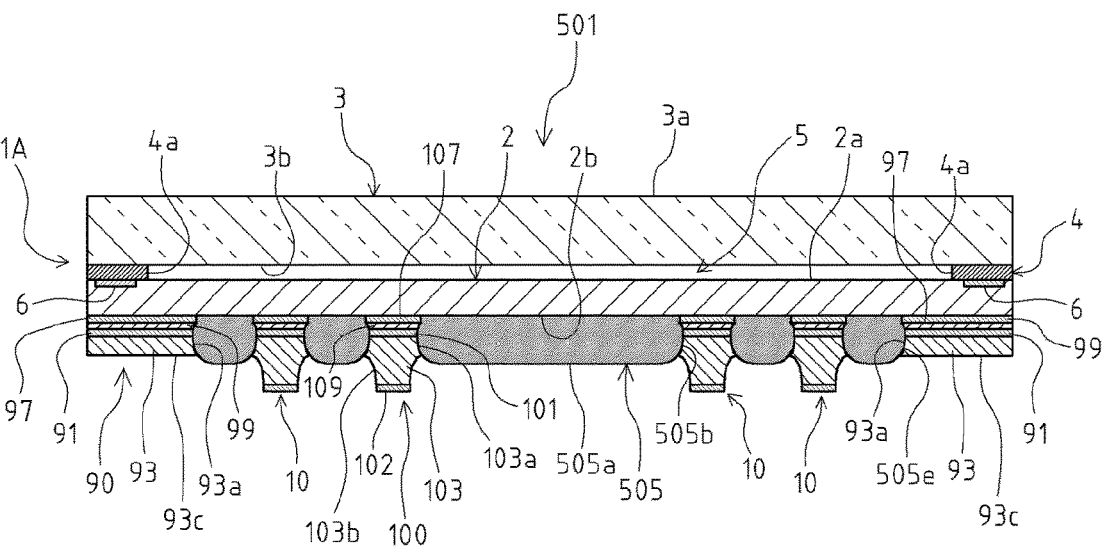
Figure 34B:
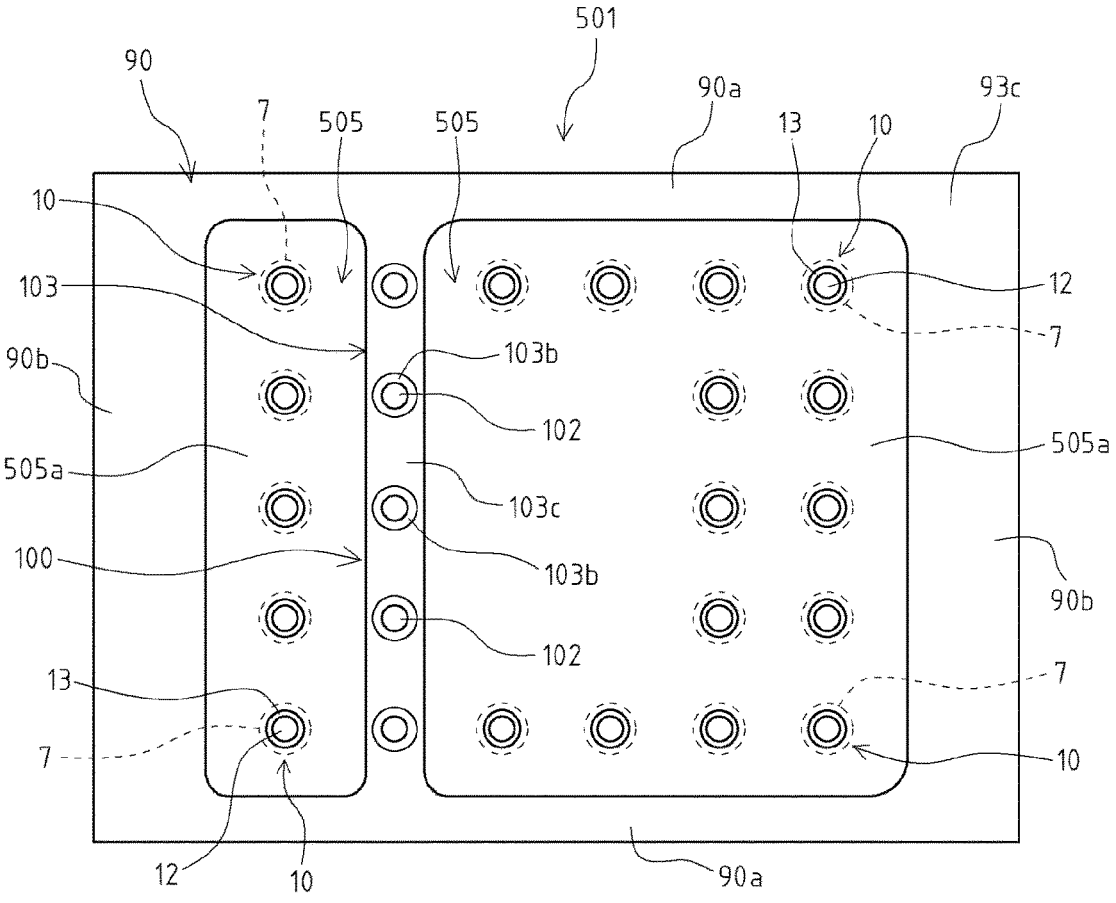

FIGS. 34A and 34B are diagrams depicting a configuration of a solid-state imaging element in modification 3 according to the fifth embodiment of the present technology. A FIG. 34A is a cross-sectional diagram, and a FIG. 34B is a bottom diagram.

Figure 35A:
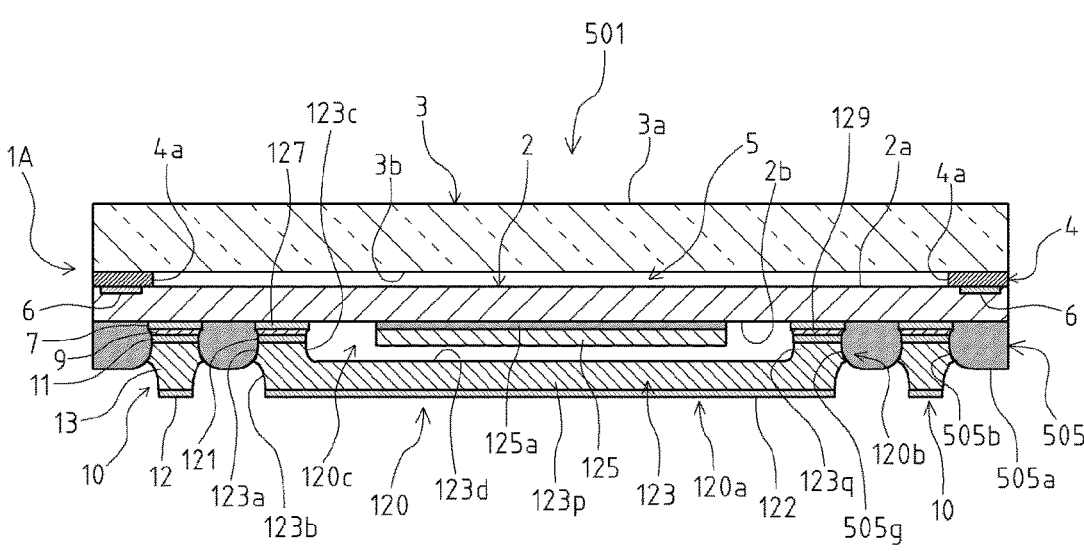
Figure 35B:
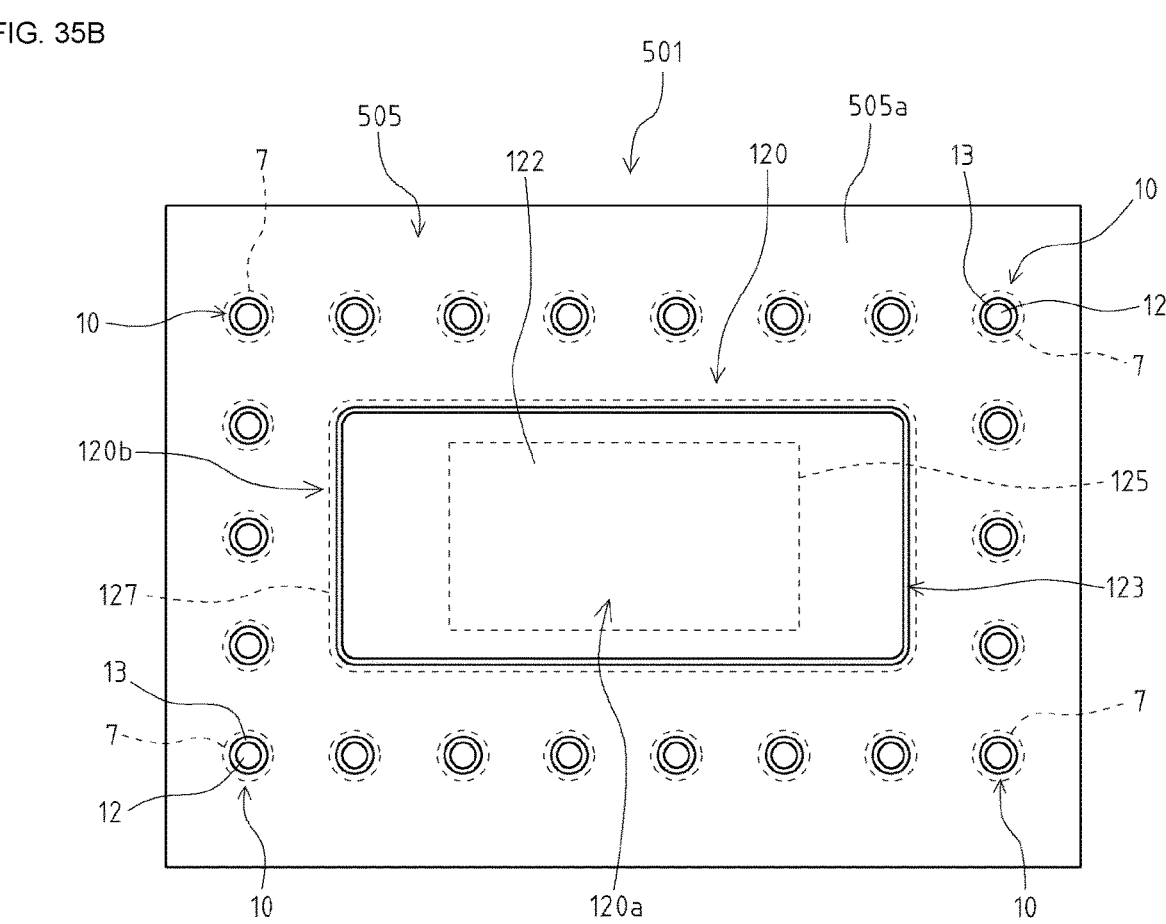

FIGS. 35A and 35B are diagrams depicting a configuration of a solid-state imaging element in modification 4 according to the fifth embodiment of the present technology. A FIG. 35A is a cross-sectional diagram, and a FIG. 35B is a bottom diagram.

Figure 36A:
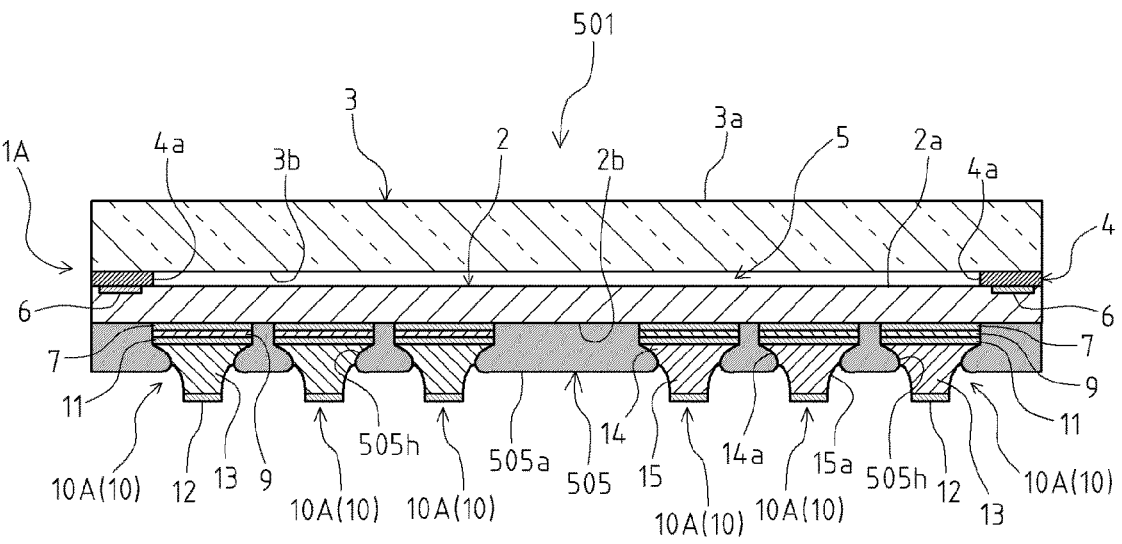
Figure 36B:
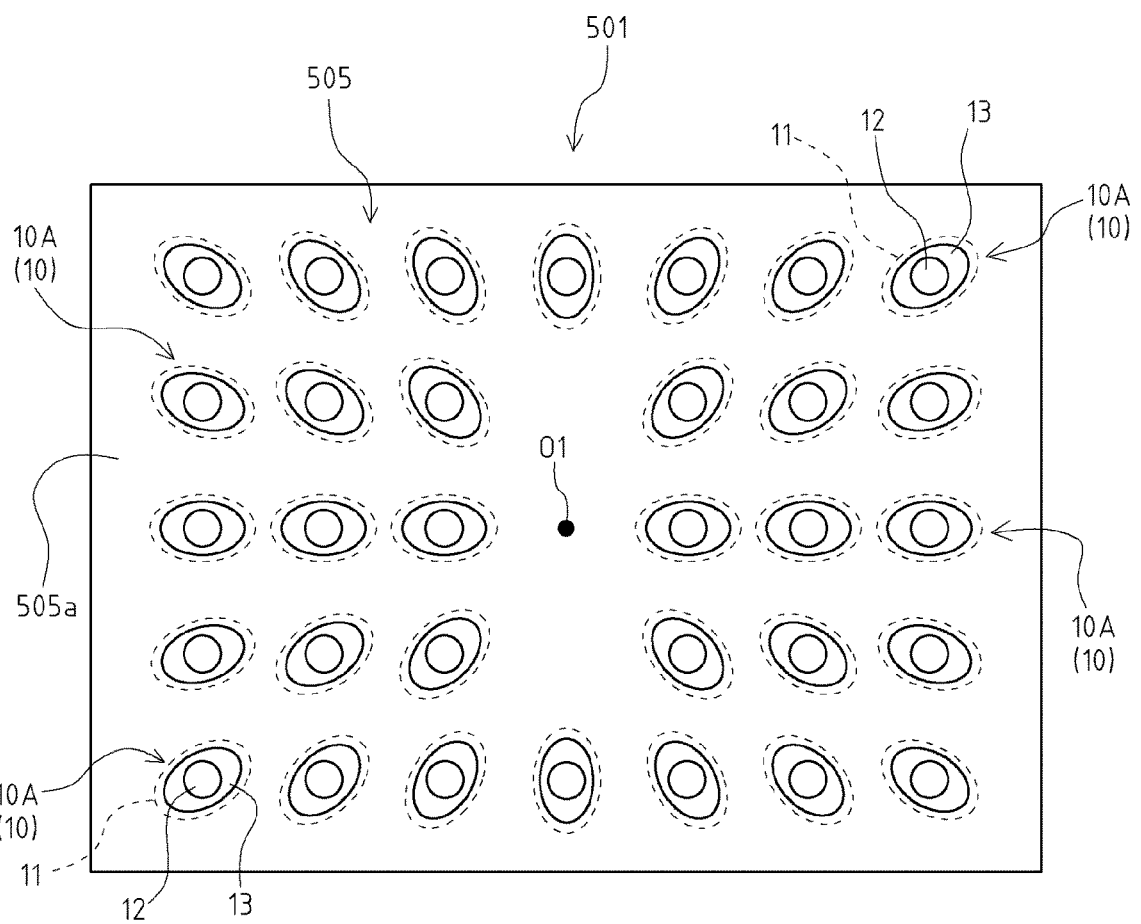

FIGS. 36A and 36B are diagrams depicting a configuration of a solid-state imaging element in modification 5 according to the fifth embodiment of the present technology. A FIG. 36A is a cross-sectional diagram, and a FIG. 36B is a bottom diagram.

Figure 37:
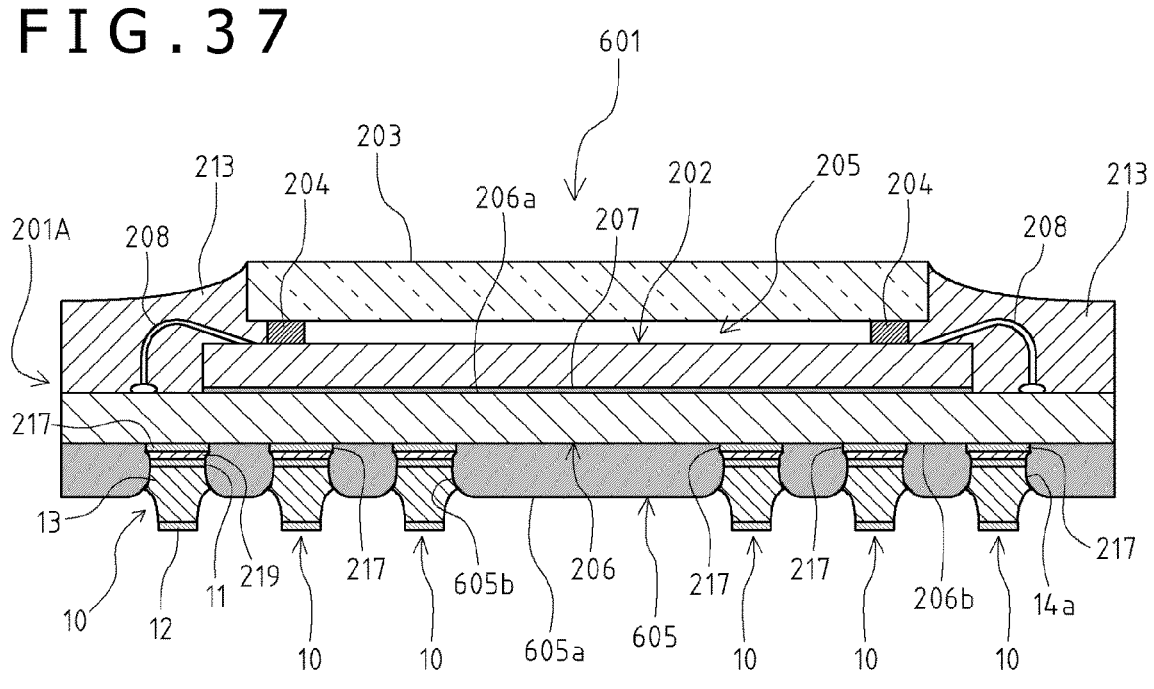

FIG. 37 is a cross-sectional diagram depicting a configuration of a solid-state imaging device according to a sixth embodiment of the present technology.

Figure 38A:
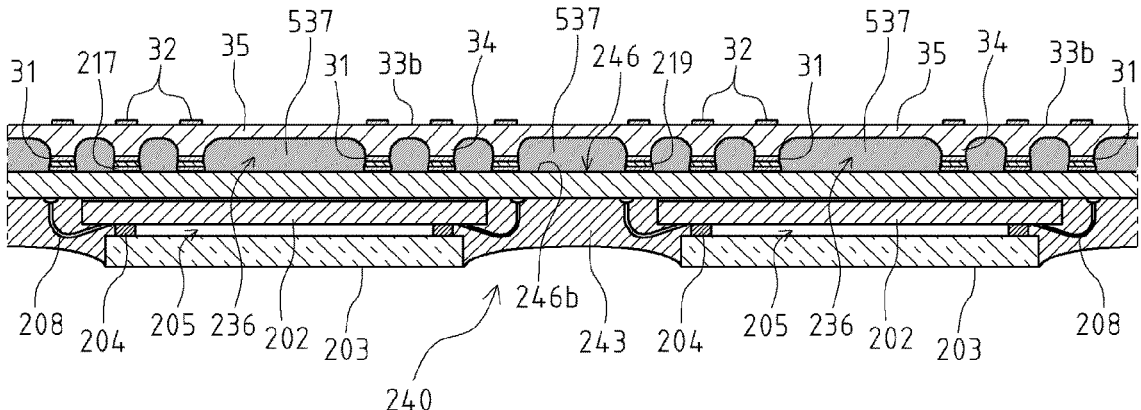
Figure 38B:
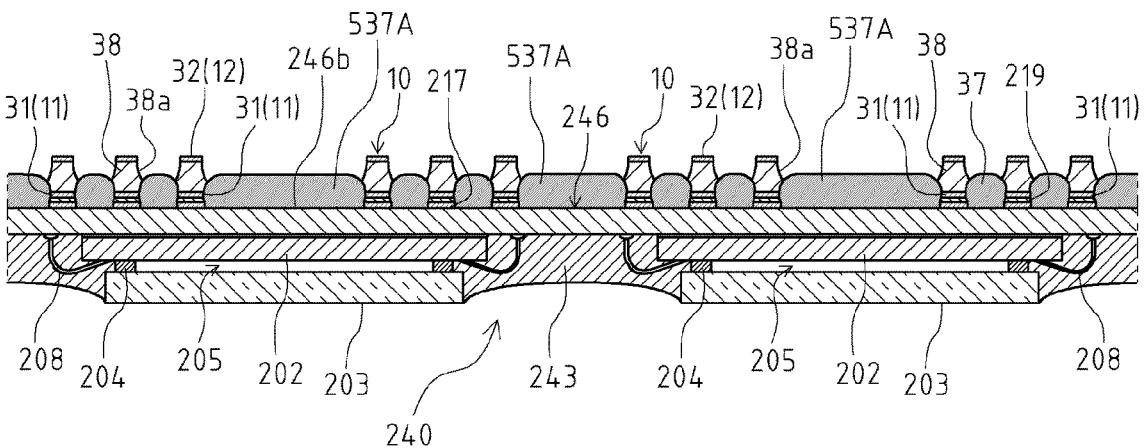
Figure 38C:
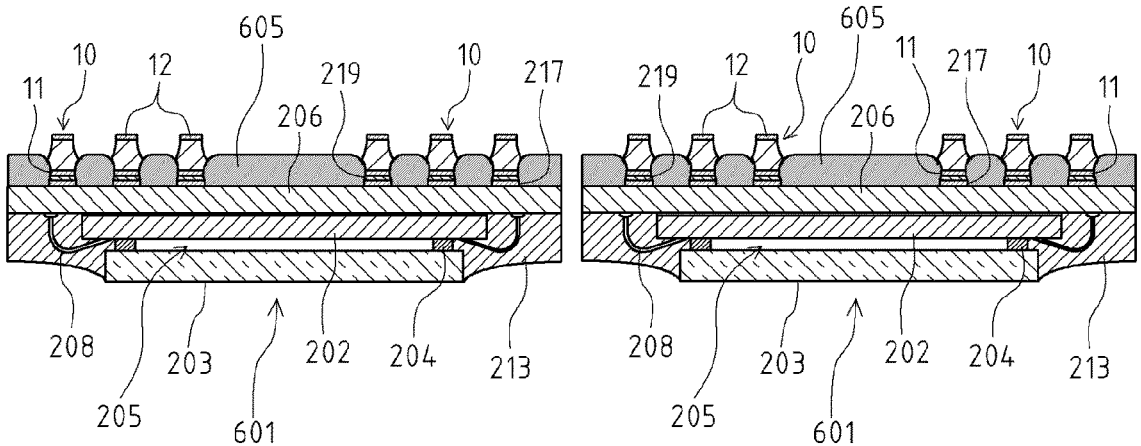

FIGS. 38A, 38B, and 38C are explanatory diagrams of a manufacturing method of the solid-state imaging device according to the sixth embodiment of the present technology.

Figure 39:
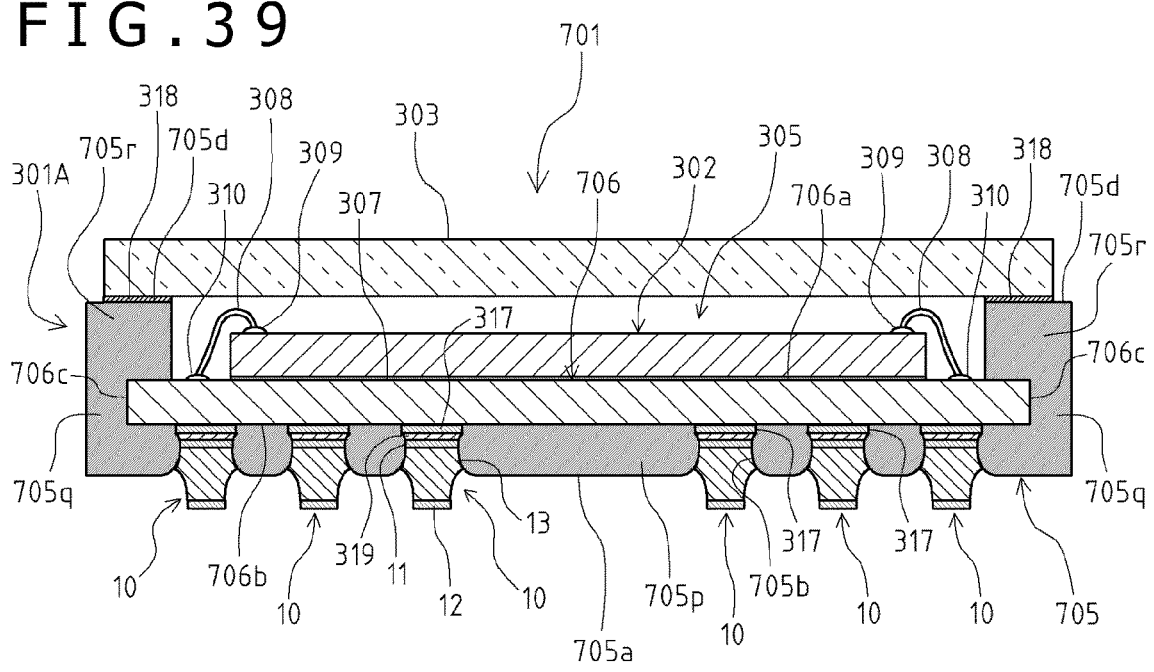

FIG. 39 is a cross-sectional diagram depicting a configuration of a solid-state imaging device according to a seventh embodiment of the present technology.

FIGS. 40A, 40B, 40C, and 40D are explanatory diagrams of a manufacturing method of the solid-state imaging device according to the seventh embodiment of the present technology.

FIGS. 41A, 41B, 41C, and 41D are explanatory diagrams of the manufacturing method of the solid-state imaging device according to the seventh embodiment of the present technology.

Figure 42:
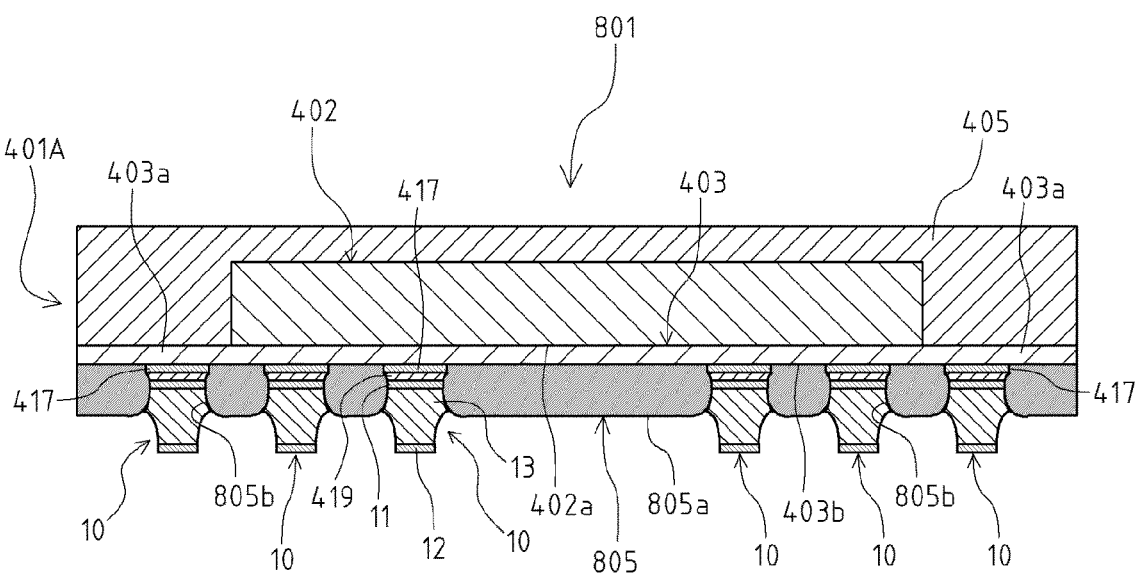

FIG. 42 is a cross-sectional diagram depicting a configuration of a semiconductor device according to an eighth embodiment of the present technology.

Figure 43A:
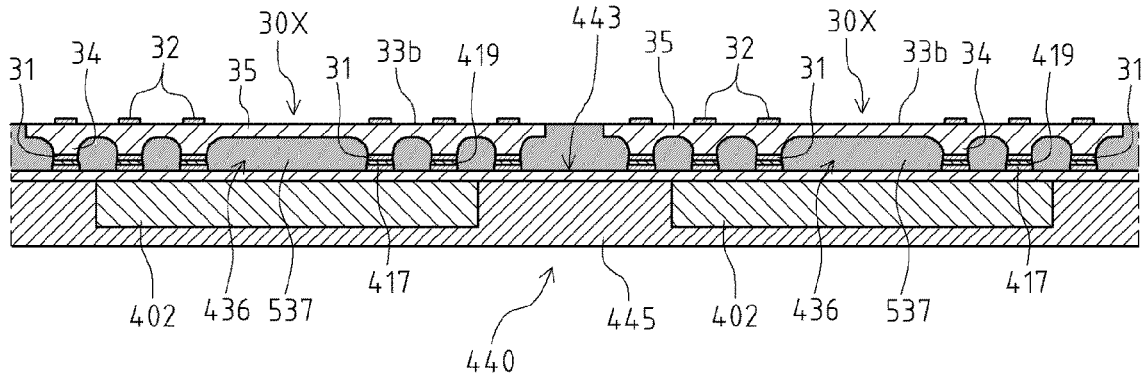
Figure 43B:
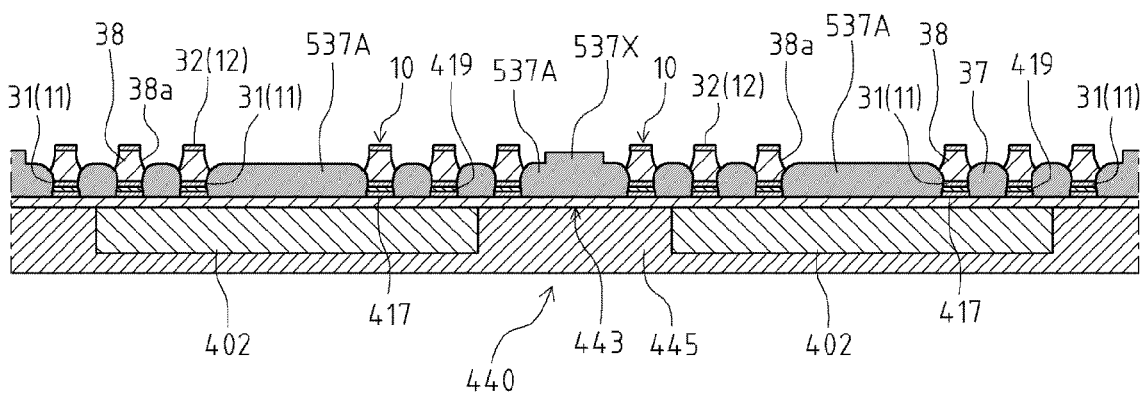
Figure 43C:
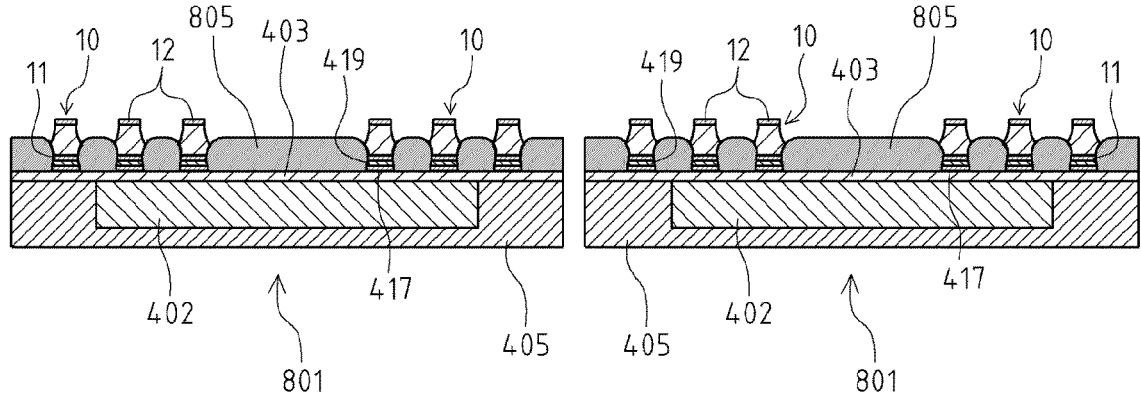

FIGS. 43A, 43B, and 43C are explanatory diagrams of a manufacturing method of the semiconductor device according to the eighth embodiment of the present technology.

Figure 44A:
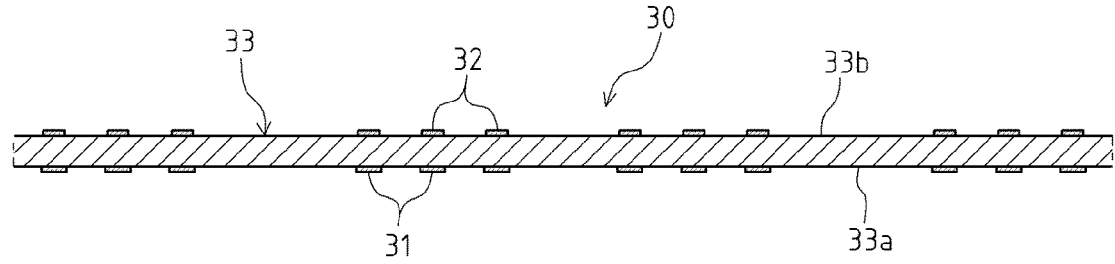
Figure 44B:
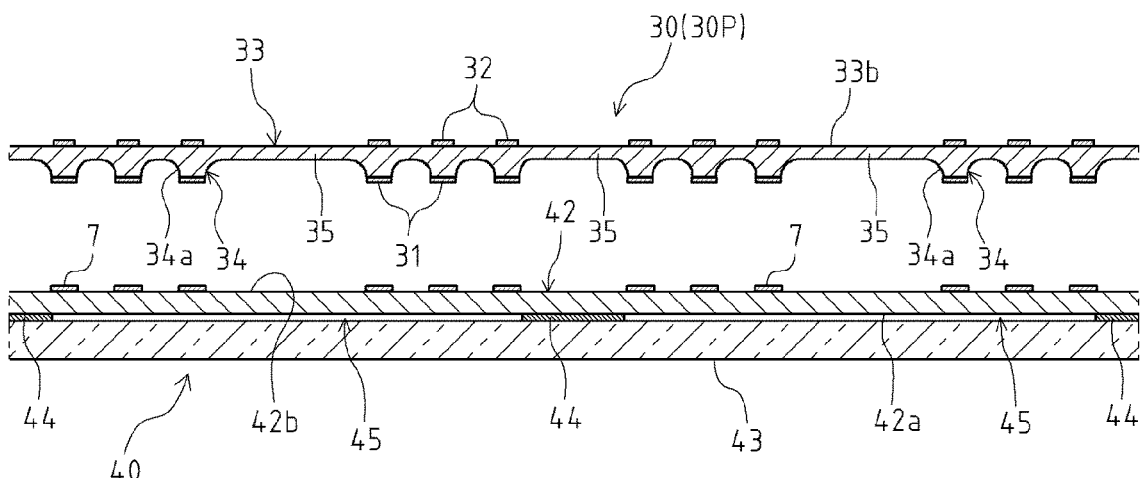
Figure 44C:
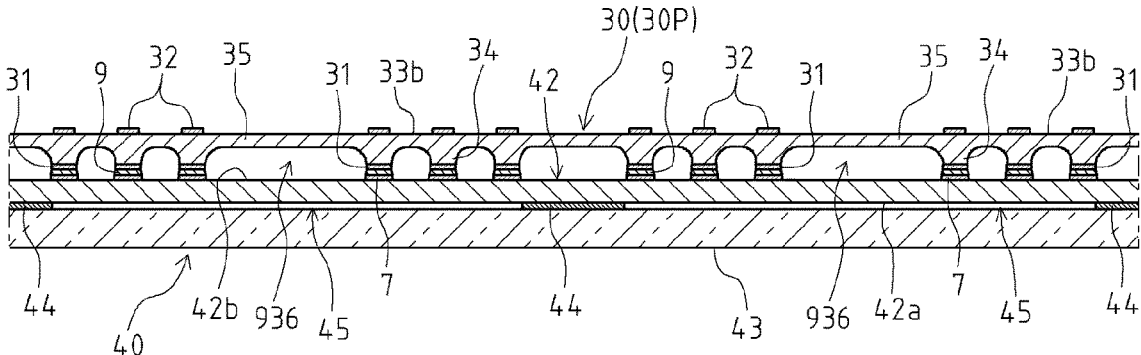

FIGS. 44A, 44B, and 44C are explanatory diagrams of a manufacturing method of a solid-state imaging device according to a ninth embodiment of the present technology.

Figure 45A:
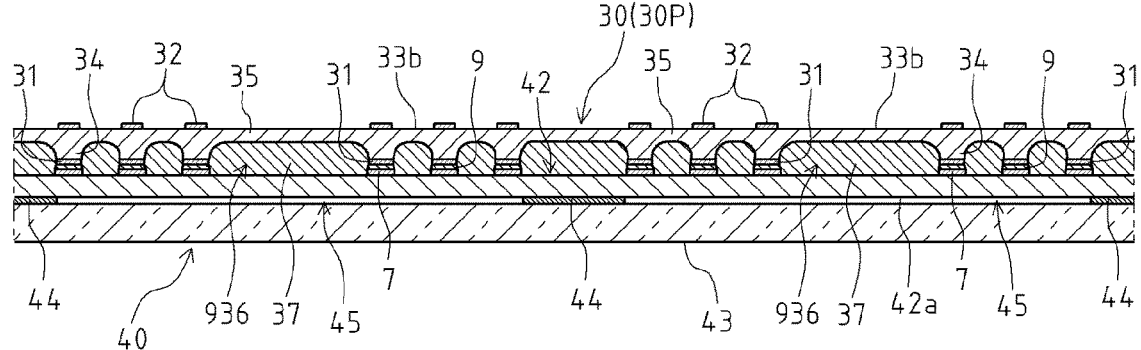
Figure 45B:
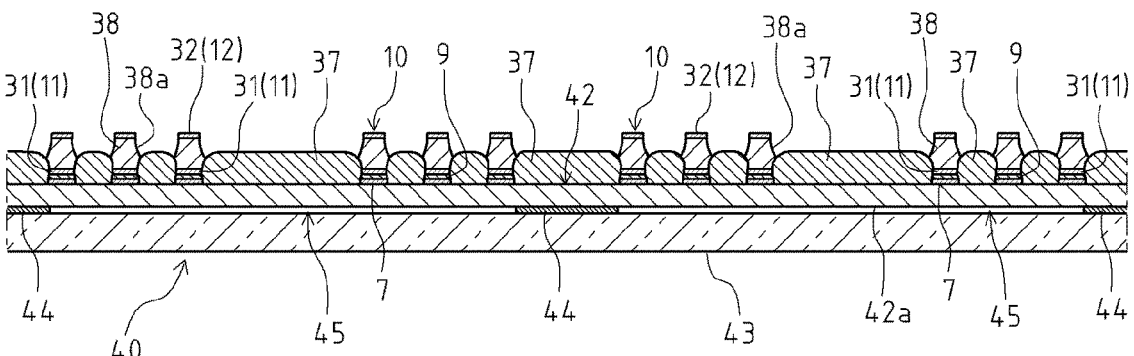
Figure 45C:
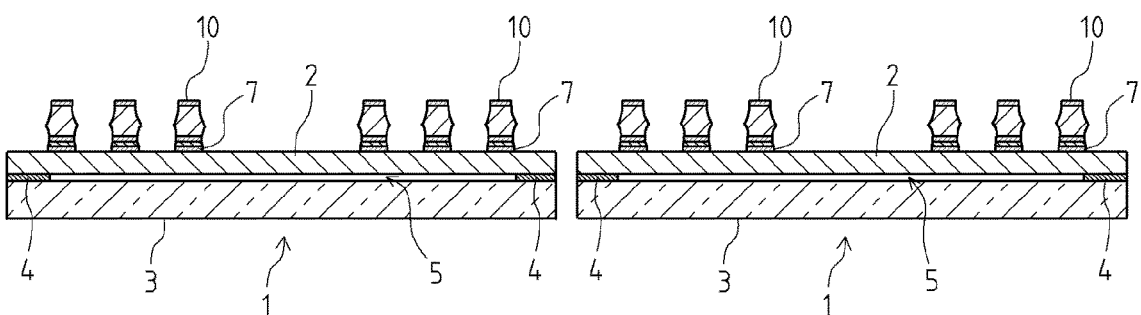

FIGS. 45A, 45B, and 45C are explanatory diagrams of the manufacturing method of the solid-state imaging device according to the ninth embodiment of the present technology.

Figure 46:
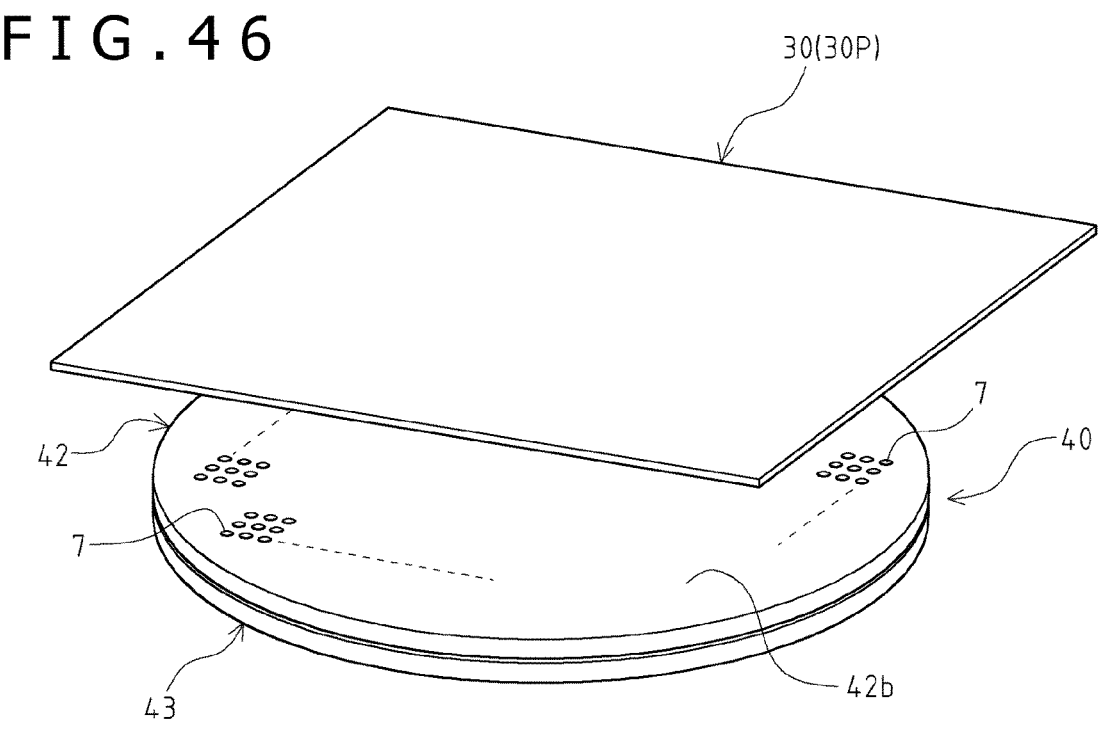

FIG. 46 is a diagram depicting a mode of mounting of a lead frame on a wafer CSP according to the ninth embodiment of the present technology.

Figure 47:
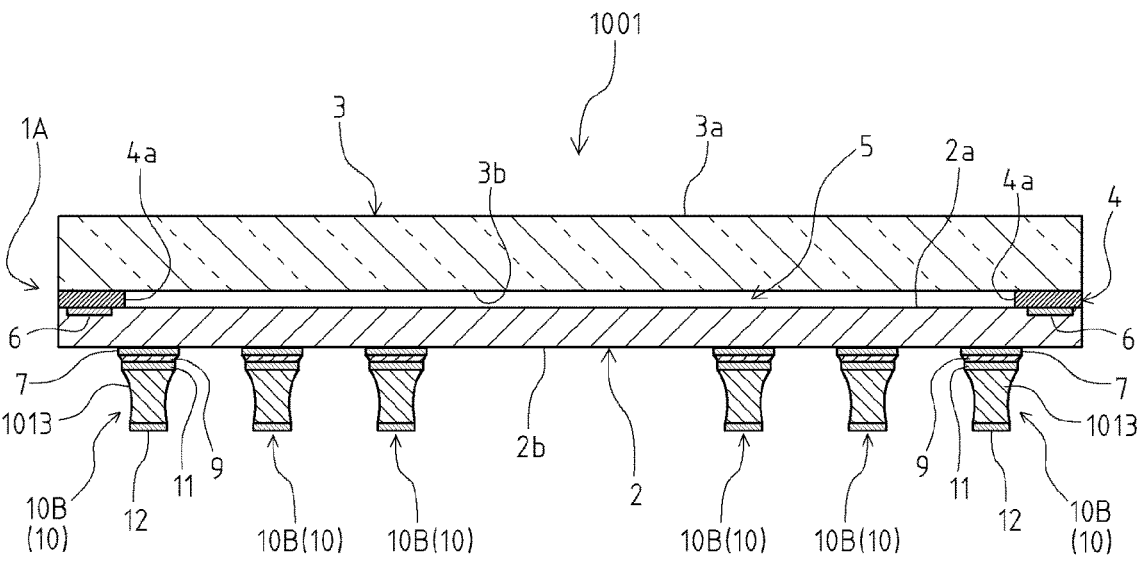

FIG. 47 is a cross-sectional diagram depicting a configuration of a solid-state imaging device according to a tenth embodiment of the present technology.

Figure 48:
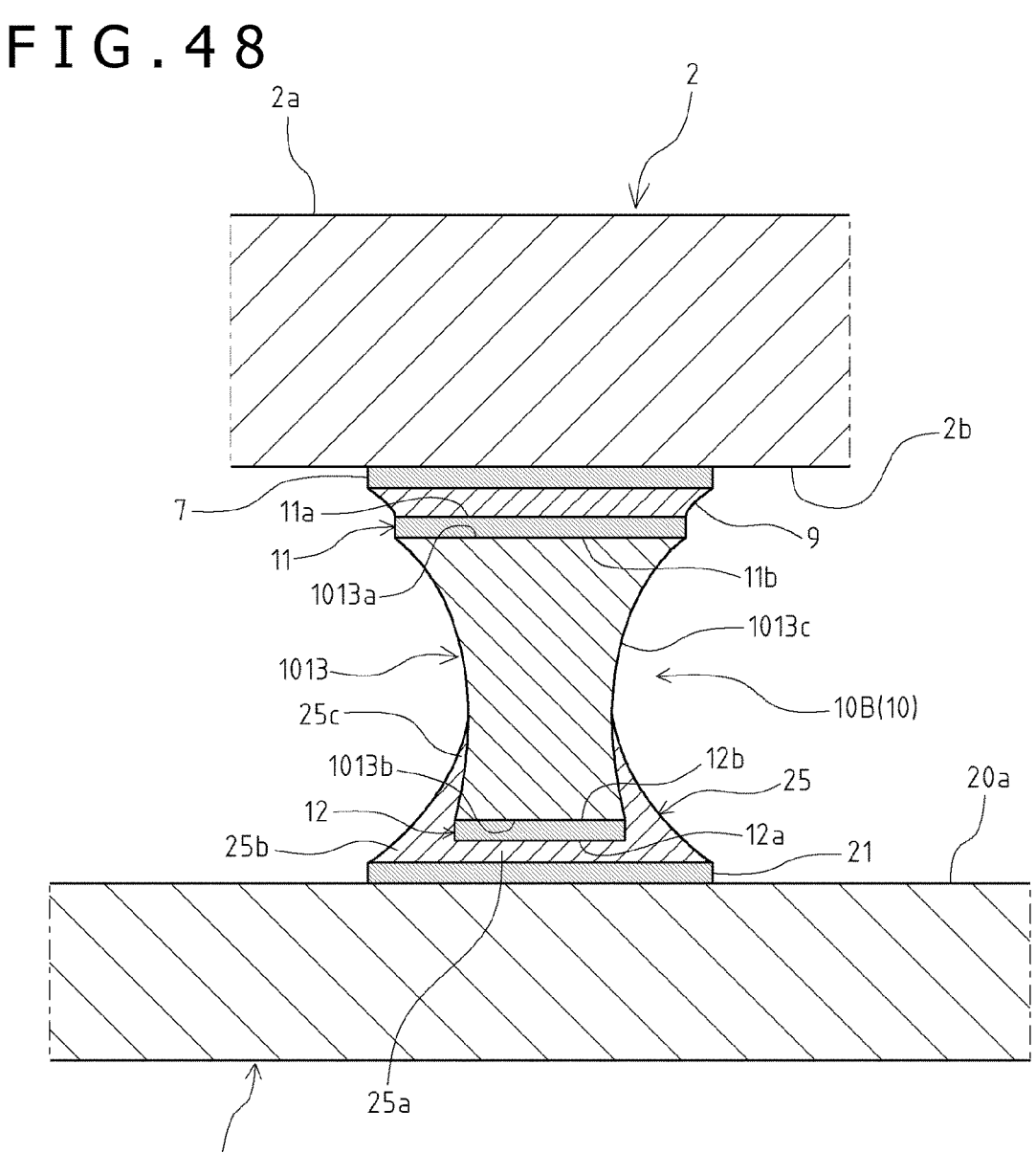

FIG. 48 is a cross-sectional diagram depicting a configuration of a columnar terminal and a mode of substrate mounting according to the tenth embodiment of the present technology.

FIGS. 49A, 49B, 49C, and 49D are explanatory diagrams of a manufacturing method of the solid-state imaging device according to the tenth embodiment of the present technology.

FIG. 50 is a block diagram depicting a configuration example of an electronic apparatus including the semiconductor device according to the embodiment of the present technology.

DESCRIPTION OF EMBODIMENTS

The present technology forms a columnar external connection terminal of a package structure of a semiconductor device with use of a plate-shaped lead frame processed by etching or other methods to achieve reduction of manufacturing costs and improvement of substrate mounting reliability.

Modes for carrying out the present technology (hereinafter referred to as "embodiments") will be hereinafter described with reference to the drawings. Note that the embodiments will be described in a following order.

1. Configuration example of semiconductor device of first embodiment
2. Manufacturing method of semiconductor device of first embodiment
3. Modifications of semiconductor device of first embodiment
4. Configuration example of semiconductor device of second embodiment
5. Manufacturing method of semiconductor device of second embodiment
6. Configuration example of semiconductor device of third embodiment
7. Manufacturing method of semiconductor device of third embodiment
8. Configuration example of semiconductor device of fourth embodiment
9. Manufacturing method of semiconductor device of fourth embodiment
10. Configuration example of semiconductor device of fifth embodiment
11. Manufacturing method of semiconductor device of fifth embodiment
12. Modifications of semiconductor device of fifth embodiment
13. Configuration example of semiconductor device of sixth embodiment
14. Manufacturing method of semiconductor device of sixth embodiment
15. Configuration example of semiconductor device of seventh embodiment
16. Manufacturing method of semiconductor device of seventh embodiment 17. Configuration example of semiconductor device of eighth embodiment
18. Manufacturing method of semiconductor device of eighth embodiment
19. Manufacturing method of semiconductor device of ninth embodiment
20. Configuration example of semiconductor device of tenth embodiment
21. Manufacturing method of semiconductor device of tenth embodiment
22. Configuration example of electronic apparatus

1. Configuration Example of Semiconductor Device of First Embodiment

A configuration example of a semiconductor device according to a first embodiment of the present technology will be described with reference to FIGS. 1, 2, and 3. Described as an example of the semiconductor device in the present embodiment will be a solid-state imaging device 1 including an image sensor as a semiconductor element. Note that the up-down direction in FIG. 1 corresponds to the up-down direction of the solid-state imaging device 1.

Figure 1:
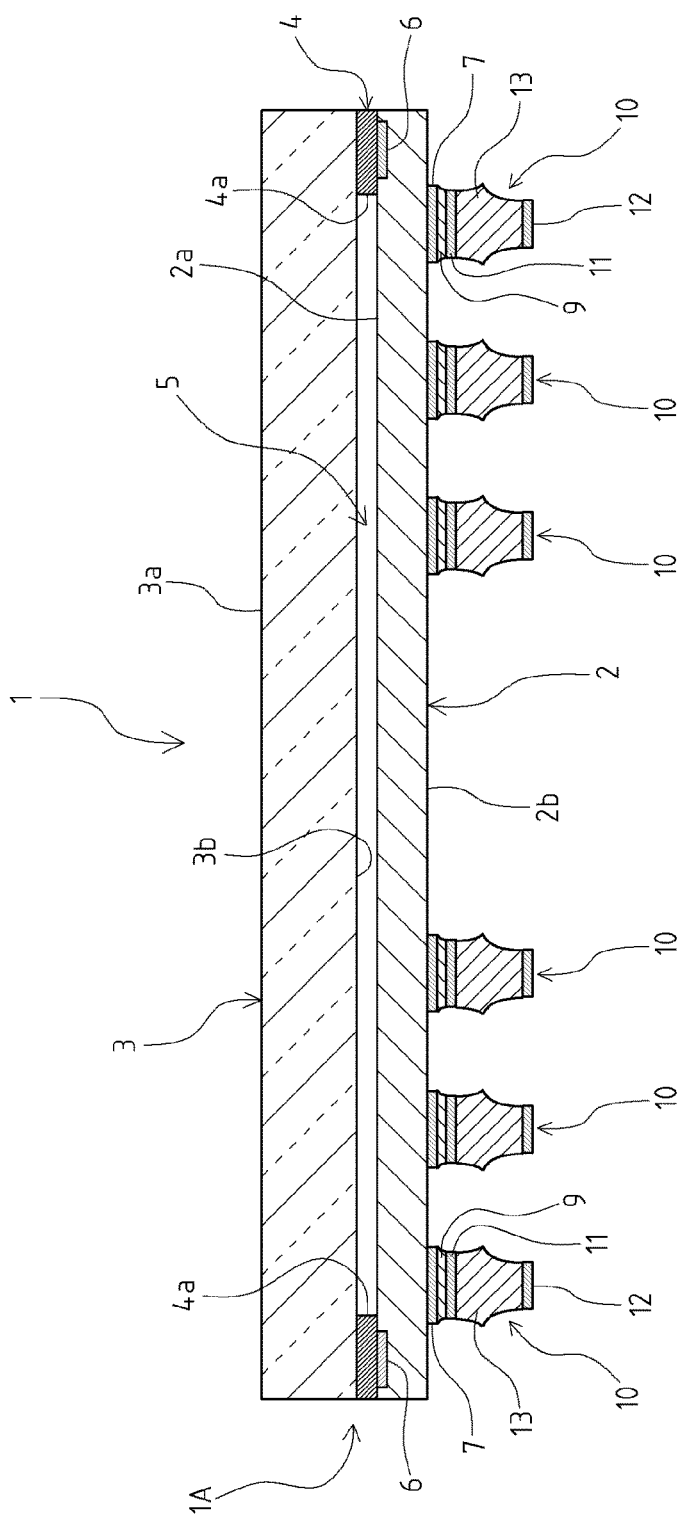
FIG. 1 is a cross-sectional diagram depicting a configuration of a solid-state imaging device according to a first embodiment of the present technology.
Figure 2:
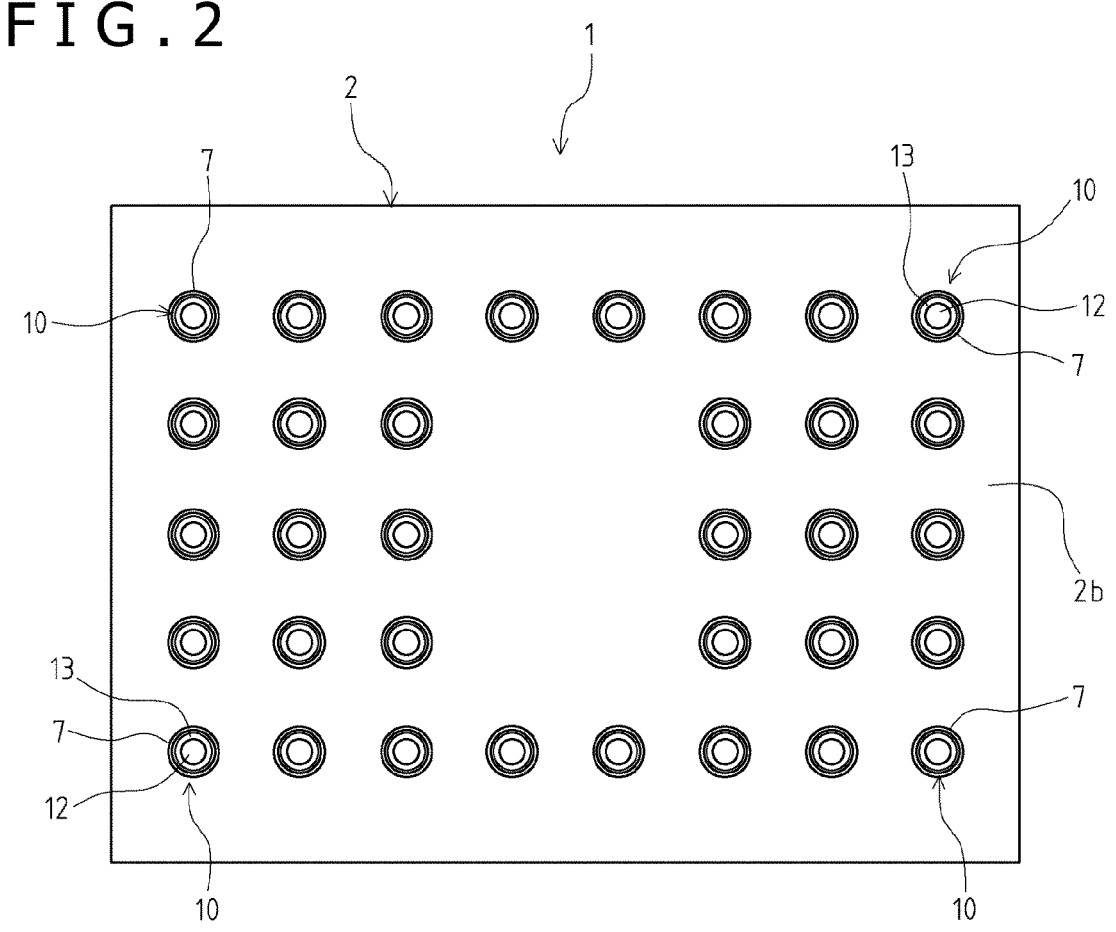
FIG. 2 is a diagram depicting a rear surface side of the solid-state imaging device according to the first embodiment of the present technology.

As depicted in FIG. 1, the solid-state imaging device 1 includes an image sensor 2 provided as a solid-state imaging element, a glass 3 provided as a material transparent to light, and a rib portion 4 provided as a support portion for supporting the glass 3 on the image sensor 2. The solid-state imaging device 1 has a package structure which includes the glass 3 mounted on the image sensor 2 via the rib portion 4, and a cavity 5 having a void shape and provided as a hollow portion between the image sensor 2 and the glass 3. The solid-state imaging device 1 adopts a generally-called WL-CSP structure as the package structure.

The image sensor 2 is a chip which has a rectangular plate shape, and includes a semiconductor substrate including silicon (Si) which is an example of a semiconductor. A front surface 2$a$ which is one of plate surfaces of the image sensor 2 corresponds to a light reception side, while a rear surface 2$b$ corresponds to the opposite plate surface. A plurality of light reception elements is provided on the front surface 2$a$ side of the image sensor 2. The image sensor 2 is a CMOS (Complementary Metal Oxide Semiconductor) type image sensor. However, the image sensor 2 may be a CCD (Charge Coupled Device) type image sensor.

An image sensor element is provided on the front surface 2$a$ side of the image sensor 2. The image sensor 2 has a pixel region on the front surface 2$a$ side as a light reception unit. This pixel region is a light reception region containing a large number of pixels provided in a predetermined layout such as Bayer layout. A region surrounding the pixel region is designated as a peripheral region. The pixel region includes a valid pixel region where generation, amplification, and readout of signal charges are carried out by photoelectric conversion for each pixel. Each of the pixels in the pixel region has a photodiode having a photoelectric conversion function and provided as a photoelectric conversion unit, and a plurality of pixel transistors.

A color filter and an on-chip lens are provided for the semiconductor substrate on the front surface 2$a$ side of the image sensor 2 in correspondence with each of the pixels. An anti-reflection film including an oxide film or the like, a flattening film including an organic material, and others are interposed between the color filter and the on-chip lens and the semiconductor substrate. Light entering each of the on-chip lenses passes through the color filter, the flattening film, and the like, and is received by the corresponding photodiode.

For example, the image sensor 2 has a configuration of a front-illuminated type (Front Side Illumination) where the pixel region is formed on the front surface side of the semiconductor substrate, a configuration of a back-illuminated type (Back Side Illumination) where photodiodes and the like are disposed on the opposite side to designate the back surface side of the semiconductor substrate as the light reception surface side and thereby improve light transmittance, a configuration where peripheral circuits of a pixel group are stacked to constitute one chip, or other configurations. However, the image sensor 2 according to the present technology is not limited to these configurations.

The glass 3 is an example of a transparent member, and has an external shape of a rectangular plate, and an external size substantially equivalent to that of the image sensor 2 in a plan view. The glass 3 is disposed on the light reception side of the image sensor 2 and provided so as to have an external shape substantially identical to an external shape of the image sensor 2 in the plan view, and become parallel with the image sensor 2 with a predetermined space left from the image sensor 2. The glass 3 has a lower surface 3b corresponding to a plate surface on the side facing the image sensor 2 and an upper surface 3a corresponding to the opposite side surface. The glass 3 is supported by the rib portion 4 in a state fixed to the image sensor 2.

The glass 3 transmits various types of light entering through an optical system such as a lens positioned above the glass 3. The light having passed through the glass 3 reaches the light reception surface of the image sensor 2 via the cavity 5. The glass 3 has a function of protecting the light reception surface side of the image sensor 2. Note that a plastic plate, a silicon plate transmitting only infrared light, or the like may be employed instead of the glass 3, for example.

The rib portion 4 is disposed in the peripheral region other than the pixel region on the front surface 2a of the image sensor 2, and formed so as to surround the pixel region. The rib portion 4 is interposed between the front surface 2a of the image sensor 2 and the lower surface 3b of the glass 3 and produces the cavity 5 between the image sensor 2 and the glass 3. The rib portion 4 functions as a sealing portion for sealing the periphery of the cavity 5, and blocks moisture (vapor), dust, or the like entering the cavity 5 from the outside in cooperation with the glass 3.

The rib portion 4 has a wall shape extending through an entire circumference along the external shape of the glass 3, and is provided so as to form a rectangular frame shape in the plan view. The rib portion 4 is located within a range of the external shape of the glass 3 along an outer edge of the glass 3 in the plan view. For example, the rib portion 4 is provided such that the outside surface of the rib portion 4 is substantially flush with the outside surface of the glass 3.

For example, the rib portion 4 includes a photosensitive adhesive such as a UV (ultraviolet light) curable resin which is an acryl-based resin, a thermosetting resin such as an epoxy-based resin, or a mixture of these. The rib portion 4 is formed on the front surface 2a of the image sensor 2 by application with a dispenser, patterning using photolithography, or other methods. Generally, a photosensitive resin allowing free pattern formation using photolithography is preferably adopted as the material of the rib portion 4.

In a case where the rib portion 4 includes a resin material, the rib portion 4 functions as an adhesive which bonds the image sensor 2 and the glass 3 in such a condition as to keep the image sensor 2 and the glass 3 away from each other. However, the rib portion 4 is not required to include a resin but may have a configuration produced by affixing a structure including an inorganic material such as ceramics like glass, metal, and silicon, to the image sensor 2 and the glass 3 with use of an adhesive or the like, for example.

The cavity 5 is a space portion having a flat rectangular shape and formed between the image sensor 2 and the glass 3. The cavity 5 is defined by the front surface 2a of the image sensor 2, the lower surface 3b of the glass 3, and an inner surface 4a of the rib portion 4.

Moreover, according to the solid-state imaging device 1, a plurality of electrode pads 6 is provided on the front surface 2a side of the image sensor 2 as terminals for transmission and reception of signals to and from the outside. The electrode pads 6 are provided in the peripheral region on the front surface 2a side of the image sensor 2, and disposed in a portion immediately below the rib portion 4, for example. However, the arrangement positions of the electrode pads 6 are not particularly limited. For example, each of the electrode pads 6 include an aluminum material or other materials.

On the other hand, a plurality of electrode terminals 7 is provided on the rear surface 2b side of the image sensor 2 as a plurality of electrode portions for external connection. Each of the electrode terminals 7 include a circular and layered portion. For example, the plurality of electrode terminals 7 is two-dimensionally arranged in a form of grid points following the rectangular external shape of the image sensor 2 (see FIG. 2). For example, each of the electrode terminals 7 includes plating using nickel (Ni), gold (Au), or the like. The electrode pads 6 are electrically connected to the electrode terminals 7.

The electrode pads 6 are connected to the electrode terminals 7 via not-depicted wiring portions. For example, the electrode pads 6 are connected to the electrode terminals 7 via a wiring layer provided so as to be embedded in a through via (TSV: Through Silicon Via) formed in the image sensor 2 from the rear surface 2b side.

For example, the wiring layer formed in the through via includes a low-resistance metal material such as copper (Cu). The wiring layer has an in-hole wiring portion disposed within the through via and connected to the rear surface side of the electrode pads 6, and a planar wiring portion formed so as to extend along the rear surface 2b from the in-hole wiring portion and connected to the electrode terminals 7. Note that an insulation film is interposed between the wiring layer and a silicon substrate constituting the image sensor 2.

Moreover, a not-depicted solder resist (solder mask) including an insulating resin is formed on the rear surface 2b side of the image sensor 2 in such a manner as to cover the entire rear surface 2b with the electrode terminals 7 exposed to the outside. The solder resist is formed so as to be embedded in the through via and cover the wiring layer.

The solid-state imaging device 1 having the above configuration includes a plurality of columnar terminals 10 as external connection terminals to allow mounting of the image sensor 2. The columnar terminals 10 are produced by processing a plate-shaped lead frame.

Each of the columnar terminals 10 is a portion having a substantially cylindrical external shape and having a center axis direction aligned with a plate thickness direction of the image sensor 2, and provided in such a state as to protrude from the corresponding electrode terminal 7 provided on the rear surface 2b side of the image sensor 2. Each of the columnar terminals 10 has a shape of a substantially rotation body having a rotation axis aligned with the center axis of the columnar terminal 10.

Each of the columnar terminals 10 is electrically connected to the corresponding electrode terminal 7 via a solder portion 9. The solder portion 9 is a circular layer portion, and has substantially the same size as the size of the electrode terminal 7.

Each of the columnar terminals 10 has a proximal end side terminal portion 11 constituting a proximal end side (image sensor 2 side end) end portion of the columnar terminal 10, a distal end side terminal portion 12 constituting a distal end side end portion of the columnar terminal 10, and a terminal body portion 13 corresponding to a portion between the proximal end side terminal portion 11 and the distal end side terminal portion 12 and constituting a body portion of the columnar terminal 10.

Each of the proximal end side terminal portion 11 and the distal end side terminal portion 12 is provided as a circular and thin-layer portion in correspondence with the electrode terminal 7. For example, each of the proximal end side terminal portion 11 and the distal end side terminal portion 12 includes plating using nickel (Ni), gold (Au), or the like. The proximal end side terminal portion 11 corresponds to a portion connected with the corresponding electrode terminal 7 via the solder portion 9. Specifically, each of the columnar terminals 10 is provided such that the proximal end side terminal portion 11 faces the corresponding electrode terminal 7. The solder portion 9 as an electric connection portion is interposed between the electrode terminal 7 and the proximal end side terminal portion 11.

The terminal body portion 13 is a columnar portion constituting a major part of the columnar terminal 10. The terminal body portion 13 is formed such that the shape and the size of an upper surface 13*a*, which corresponds to a junction surface joined to the proximal end side terminal portion 11, are substantially identical to those of a lower surface 11*b* of the proximal end side terminal portion 11, and such that the shape and the size of a lower surface 13*b*, which corresponds to a junction surface joined to the distal end side terminal portion 12, are substantially identical to those of an upper surface 12*b* of the distal end side terminal portion 12.

For example, the terminal body portion 13 include a low-resistance metal material which has a low resistance value and is advantageous in view of transmission of high-speed signals such as copper (Cu) and a copper alloy. Note that the terminal body portion 13 may include a material other than copper and the like such as tungsten (W), titanium (Ti), tantalum (Ta), a titanium tungsten alloy (TiW), and polysilicon, for example.

The terminal body portion 13 has a proximal end side portion 14 which is an upper (proximal end side) and substantially half portion, and a distal end side portion 15 which is a lower (distal end side) and substantially half portion. Each of the proximal end side portion 14 and the distal end side portion 15 has a narrow center shape produced by gradually decreasing the outside diameter of the shape from both ends toward a central portion in the up-down direction. Accordingly, each outer circumferential surface of an upper outer circumferential surface 14*a* corresponding to an outer circumferential surface of the proximal end side portion 14, and a lower outer circumferential surface 15*a* corresponding to an outer circumferential surface of the distal end side portion 15 forms a recess curve which has the projection side on the center axis side of the columnar terminal 10 in a longitudinal cross-sectional view of the columnar terminal 10.

As described above, the terminal body portion 13 shaped to have a narrow center in each of the upper part and the lower part has a diameter expansion portion 16 which is provided on a boundary portion between the proximal end side portion 14 and the distal end side portion 15, and forms a mountain shape having the projection side on the outside in a radial direction in the longitudinal cross-sectional view of the columnar terminal 10. The diameter expansion portion 16 forms a ridgeline 16*a* extending along the circular shape around the center axis of the columnar terminal 10.

As described above, the solid-state imaging device 1 has a semiconductor base 1A which includes the image sensor 2 corresponding to the semiconductor element, and the columnar terminals 10 each including a part of a lead frame. According to the present embodiment, the semiconductor base 1A is a structure which has the glass 3 provided on the front surface 2*a* side of the image sensor 2 via the rib portion 4, and the plurality of electrode terminals 7 for external connection on the rear surface 2*b* of the image sensor 2 corresponding to one side surface. In addition, the columnar terminals 10 are provided on the semiconductor base 1A in such a manner as to protrude from the respective electrode terminals 7.

Moreover, concerning the columnar terminals 10, the junction surface of each of the columnar terminals 10 joined to the corresponding electrode terminals 7 is larger than the distal end side end surface of the corresponding columnar terminal 10. According to the present embodiment, the junction surface of each of the columnar terminals 10 joined to the corresponding electrode terminal 7 is the upper surface 11*a* of the proximal end side terminal portion 11, while the distal end side end surface of each of the columnar terminals 10 is the lower surface 12*a* of the distal end side terminal portion 12.

Each of the proximal end side terminal portion 11 and the distal end side terminal portion 12 is a thin-film portion including plating. Both the surfaces of each of the terminal portions have substantially the same size. According to a size relation between the upper surface 11*a* of the proximal end side terminal portion 11 and the lower surface 12*a* of the distal end side terminal portion 12, therefore, the area of the proximal end side terminal portion 11 is larger than the area of the distal end side terminal portion 12 in each of the columnar terminals 10.

Each of the proximal end side terminal portion 11 and the distal end side terminal portion 12 is a portion having a circular shape and disposed concentric with each other. Accordingly, considering the size relation between the terminal portions described above, a circumferential edge portion of the proximal end side terminal portion 11 projects in an annular shape to the outside of the distal end side terminal portion 12 in an axial direction view of each of the columnar terminals 10. In a configuration presented only by way of example, a diameter D1 of the proximal end side terminal portion 11 has a length 1.5 times or twice larger than that of a diameter D2 of the distal end side terminal portion 12.

Figure 3:
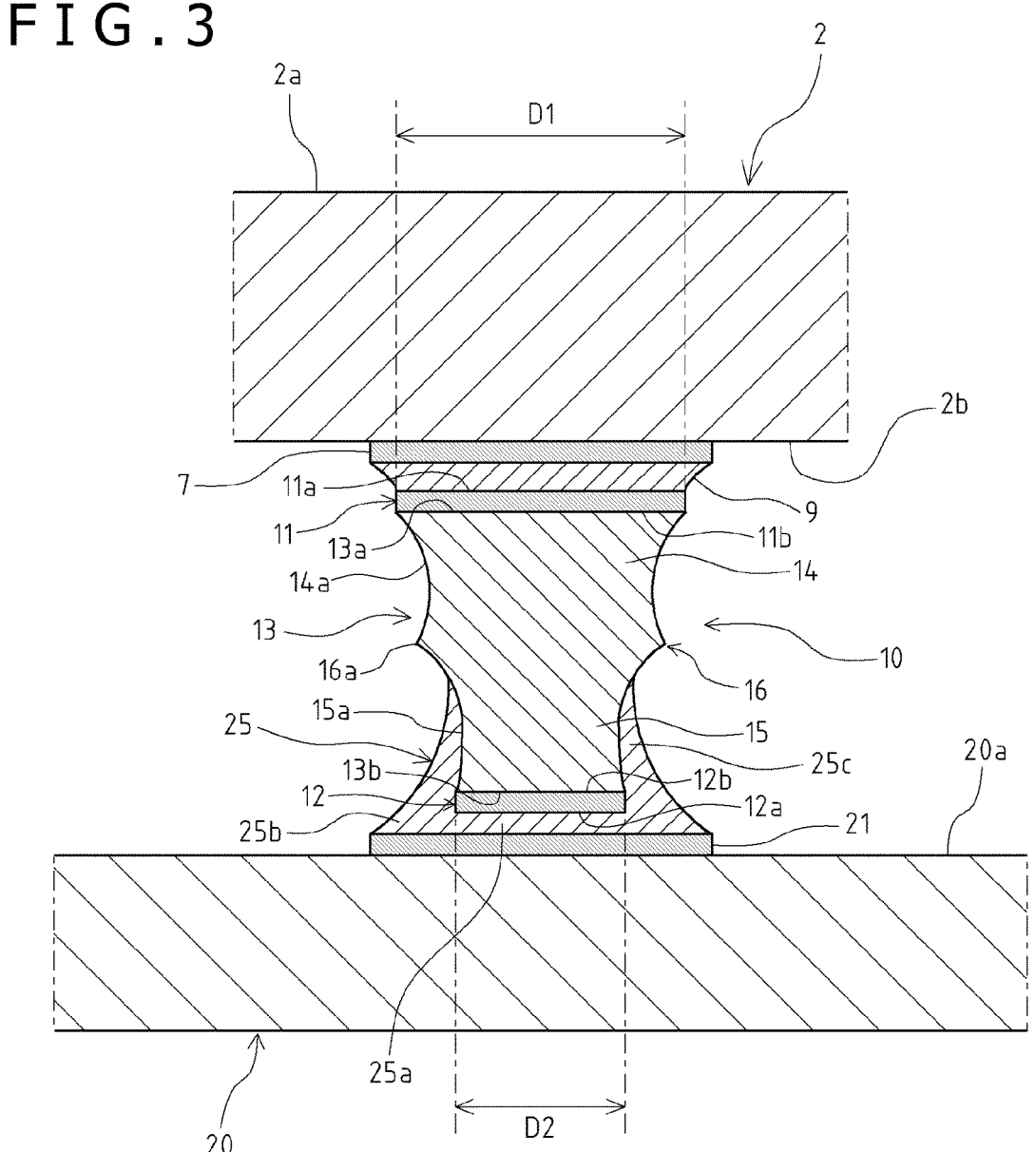
FIG. 3 is a cross-sectional diagram depicting a configuration of a columnar terminal and a mode of substrate mounting according to the first embodiment of the present technology.

As depicted in FIG. 3, the solid-state imaging device 1 having the above configuration is mounted on a mounting substrate 20 with use of the columnar terminals 10 as connection terminals. For example, the mounting substrate 20 is an interposer substrate, a substrate of a semiconductor package on which a bear chip of a semiconductor chip is mounted, or the like. The mounting substrate 20 has land electrodes 21 on a mounting surface 20*a* corresponding to a plate surface on the side to which the solid-state imaging device 1 is connected.

Each of the land electrodes 21 is a conductor to which the corresponding columnar terminal 10 is joined. For example, each of the land electrodes 21 includes copper (Cu) and has a circular shape or a rectangular shape. For example, each of the land electrodes 21 has substantially the same size as the size of each of the electrode terminals 7. The land electrodes 21 are provided on the mounting surface 20*a* of the mounting substrate 20 at positions corresponding to the arrangement of the plurality of columnar terminals 10 included in the solid-state imaging device 1. A plurality of the land electrodes 21 is connected to each other via predetermined wiring provided on the mounting substrate 20.

Each of the columnar terminals 10 is joined to the corresponding land electrode 21 by soldering. Accordingly, a solder portion 25 is present between the columnar terminal 10 and the land electrode 21. The solder portion 25 fills a gap between the proximal end side terminal portion 11 and the land electrode 21 facing each other with a predetermined clearance left therebetween by utilizing wettability of solder of the solder portion 25 to the columnar terminal 10 and the land electrode 21, and covers a lower part of the columnar terminal 10 while forming a downward flaring shape. Specifically, the solder portion 25 has a terminal interposition portion 25*a* interposed between the columnar terminal 10 and the land electrode 21, a lower end outer circumference portion 25*b* outside the terminal interposition portion 25*a*, and a circumferential wall portion 25*c* having a cylindrical shape and extending upward from the lower end outer circumference portion 25*b* along a circumferential surface of a lower portion of the columnar terminal 10.

According to a mounting mode of the solid-state imaging device 1 with use of the columnar terminals 10 as described above, conductor portions each shaped to have an expanded diameter on both the upper and lower end sides with respect to an intermediate portion in the up-down direction are provided as electric connection portions between the electrode terminals 7 of the image sensor 2 and the land electrodes 21 of the mounting substrate 20. Specifically, these conductor portions are portions connecting the electrode terminals 7 and the land electrodes 21, and each correspond to a columnar portion including the solder portion 9, the columnar terminal 10, and the solder portion 25, and have a substantially vertically symmetric shape with respect to a center located at the diameter expansion portion 16 in the longitudinal cross-sectional view.

2. Manufacturing Method of Semiconductor Device of First Embodiment

A manufacturing method of the semiconductor device according to the first embodiment of the present technology will be described with reference to FIGS. 4A, 4B, 4C, 4D, 5A, 5B, 50, 5D, and 6. The manufacturing method of the semiconductor device according to the present embodiment chiefly relates to a method forming the columnar terminals 10 included in the solid-state imaging device 1, and presents a method forming package terminals with use of a lead frame.

The manufacturing method of the solid-state imaging device 1 according to the present embodiment has steps roughly divided in a following manner. Specifically, the manufacturing method of the solid-state imaging device 1 has a step of preparing a lead frame, a step of mounting the prepared lead frame, in a state subjected to predetermined processing or kept unchanged without processing, on a semiconductor device body including the image sensor 2, and a step of performing predetermined processing for the lead frame mounted on the semiconductor device body to form the columnar terminals 10. The manufacturing method of the solid-state imaging device 1 according to the present embodiment will be described in detail.

Figure 4A:
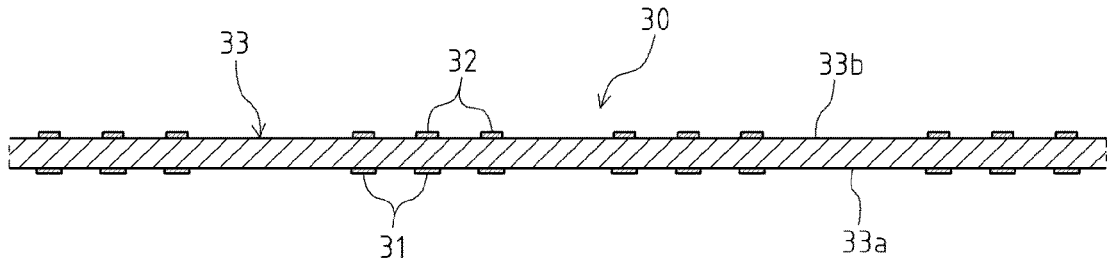

In the manufacturing method of the solid-state imaging device 1, a step of preparing a lead frame 30 is initially performed as depicted in a FIG. 4A. The lead frame 30 is a component having a plate shape on the whole and includes a frame body portion 33 having a plate shape, and plating terminal portions 31 and 32 constituting a plurality of terminal portions provided on plate surfaces on both sides of the frame body portion 33.

The frame body portion 33 includes a low-resistance metal material which has a low resistance value and is advantageous in view of transfer of high-speed signals, such as copper (Cu) and a copper alloy. For example, the frame body portion 33 has a plate thickness substantially similar to the thickness of the image sensor 2 or the glass 3. The frame body portion 33 corresponds to a portion constituting the terminal body portions 13 of the columnar terminals 10. It is assumed that one plate surface of the frame body portion 33 is a facing surface 33*a* facing the semiconductor device body side, and that the other plate surface on the opposite side is an opposite surface 33*b*.

Each of the plating terminal portions 31 and 32 includes plating using nickel (Ni), gold (Au), or the like, for example, and constitutes a circular thin-layer portion. The first plating terminal portions 31 included in the plating terminal portions 31 and 32 and provided on the facing surface 33*a* side of the frame body portion 33 correspond to portions constituting the proximal end side terminal portions 11 of the columnar terminals 10. On the other hand, the second plating terminal portions 32 included in the plating terminal portions 31 and 32 and provided on the opposite surface 33*b* side of the frame body portion 33 correspond to portions constituting the distal end side terminal portions 12 of the columnar terminals 10.

The plating terminal portions 31 and 32 are provided on the plate surfaces on both sides of the frame body portion 33 and paired such that at least a part of the plating terminal portions 31 and 32 overlap with each other in a plate surface view. Specifically, the first plating terminal portions 31 and the second plating terminal portions 32 are provided such that at least a part of the paired plating terminal portions 31 and 32 overlap with each other in the plate surface view of the lead frame 30.

According to the present embodiment, the plating terminal portions 31 and 32 each constitute a circular plating portion, and are concentrically disposed around a center axis direction aligned with the direction perpendicular to the plate surface of the lead frame 30. Moreover, the plating terminal portions 31 and 32 are formed such that the first plating terminal portions 31 have an outside diameter larger than an outside diameter of the second plating terminal portions 32. For example, the plurality of plating terminal portions 31 and 32 is two-dimensionally arranged in a form of grid points in correspondence with the plurality of electrode terminals 7 included in the image sensor 2.

The step of preparing the lead frame 30 includes a step of plating the frame body portion 33 to form the plurality of plating terminal portions 31 and 32. In addition, in the step of forming the plurality of plating terminal portions 31 and 32, the plating terminal portions 31 formed on the facing surface 33*a* of the frame body portion 33 are made larger than the second plating terminal portions 32 formed on the opposite surface 33*b* of the frame body portion 33. The plating terminal portions 31 and 32 can include a known patterning technology using photolithography or the like to constitute plating portions having a predetermined shape pattern.

Moreover, in the manufacturing method of the solid-state imaging device 1, a step of preparing a wafer CSP 40 which is a WL-CSP in a wafer state is performed. The wafer CSP 40 corresponds to an aggregate state of the semiconductor bases 1A of the solid-state imaging devices 1 and has a disk shape in correspondence with a shape of a silicon wafer constituting the semiconductor substrate, for example, as depicted in FIG. 6.

Figure 4B:
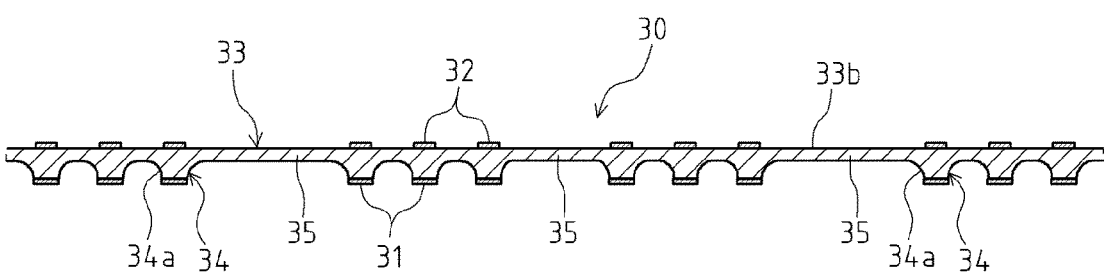
Figure 4C:
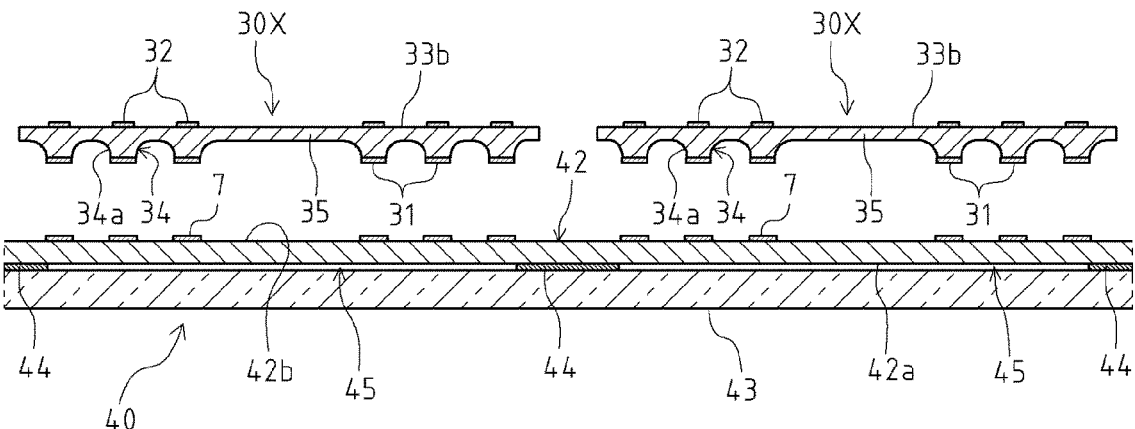

As depicted in FIGS. 4C and 6, the wafer CSP 40 has a configuration produced by affixing a circular glass plate 43 constituting the glass 3, via a wall portion 44 constituting the rib portion 4, to a silicon wafer 42 obtained after various steps for forming the image sensor 2. The silicon wafer 42 is a semiconductor wafer where a plurality of parts each constituting the image sensor 2 is formed in a predetermined layout. The plurality of electrode terminals 7 each constituting the external connection terminal is formed in a predetermined layout on a plate surface 42*b* on the side opposite to the glass plate 43 side of the silicon wafer 42.

Formation of the wall portion 44 and affixation of the glass plate 43 are carried out for the silicon wafer 42. In this step, the glass plate 43 may be affixed after the wall portion 44 is formed on a front surface 42*a* of the silicon wafer 42, or the glass plate 43 on which the wall portion 44 is formed beforehand may be affixed to the front surface 42*a* of the silicon wafer 42.

The glass plate 43 is an example of a plate component transparent to light. The wall portion 44 is formed in a predetermined layout in such a manner as to surround the pixel region of each of the image sensors 2. The wall portion 44 is formed so as to have a predetermined width and provided in a grid shape in the plan view in correspondence with each of the rectangular regions finally constituting the solid-state imaging devices 1. For example, the wall portion 44 includes a method such as patterning using photolithography, screen printing, etching, and application using a dispenser. Space portions 45 constituting the cavities 5 of the respective solid-state imaging devices 1 are produced by joining the silicon wafer 42 and the glass plate 43 to each other via the wall portion 44.

According to the present embodiment as described above, the wafer CSP 40 which is an integrated plate-shaped body including the plurality of image sensors 2 formed in an aggregate state is adopted as a semiconductor device body on which the lead frame 30 is mounted.

Subsequently, as depicted in a FIG. 4B, one-side half etching is performed for the lead frame 30 from the facing surface 33*a* side of the frame body portion 33. Performed herein is a step of partially removing the frame body portion 33 in the plate thickness direction by etching the facing surface 33*a* side of the frame body portion 33 with use of a mask including the first plating terminal portions 31.

This step is performed before a step of mounting the lead frame on the wafer CSP 40. In this step of half-etching, the thickness of the frame body portion 33 is reduced from the facing surface 33*a* side by dry etching or wet etching to a thickness about half the original thickness in a portion other than the portions where the first plating terminal portions 31 are provided.

By this step, as depicted in the FIG. 4B, the lead frame 30 in the portions where the first plating terminal portions 31 relatively protrude from the portion other than the portions where the first plating terminal portions 31 are provided to constitute projection portions 34 each having an end surface portion corresponding to the first plating terminal portion 31. In other words, the lead frame 30 has such a form that a plurality of the projection portions 34 is connected by a thin plate portion 35 supporting the opposite surface 33*b* and having substantially the half plate thickness of the original plate thickness of the frame body portion 33. By etching in this step, outer circumferential surfaces 34*a* of the projection portions 34 are formed to constitute the upper outer circumferential surfaces 14*a* of the proximal end side portions 14 of the columnar terminals 10.

After the step of half-etching, a step of singulating the etched lead frame 30 into a plurality of chips each corresponding to the image sensor 2 is performed as depicted in a FIG. 4C.

In this step of singulation, the lead frame 30 is diced along predetermined grid-shaped dicing lines to divide the lead frame 30 into individual pieces corresponding to the respective image sensors 2 formed on the silicon wafer 42. By this step, the lead frame 30 is divided into a plurality of lead frame pieces 30X. The lead frame pieces 30X are rectangular-plate-shaped chips each having a size corresponding to the size of the solid-state imaging device 1 (see FIG. 6).

Subsequently, as depicted in a FIG. 4D, a step of mounting the plurality of lead frame pieces 30X on the wafer CSP 40 is performed. Specifically, a step of mounting the lead frame pieces 30X on the wafer CSP 40 is achieved by joining the first plating terminal portions 31 of the respective lead frame pieces 30X to the electrode terminals 7 corresponding to terminals of the wafer CSP 40.

In this step, solder paste containing flux is initially applied to at least either the first plating terminal portions 31 of the lead frame pieces 30X or the electrode terminals 7 by a method such as printing. Thereafter, the plurality of lead frame pieces 30X is placed on the wafer CSP 40 with use of a chip mounter or the like at predetermined positions where the respective first plating terminal portions 31 correspond to the electrode terminals 7, and reflow is performed at a predetermined temperature.

By this step, the plurality of lead frame pieces 30X is brought into a state where the respective first plating terminal portions 31 are joined to the electrode terminals 7 via the solder portions 9 produced by solidifying the solder paste. According to the present embodiment as described above, the lead frame pieces 30X which are a plurality of chips produced by singulating the lead frame 30 are mounted on the wafer CSP 40 by reflow in the step of mounting the lead frame 30 (see FIG. 6). FIG. 6 depicts an image of mounting of the lead frame 30 according to the present embodiment.

Figure 4D:
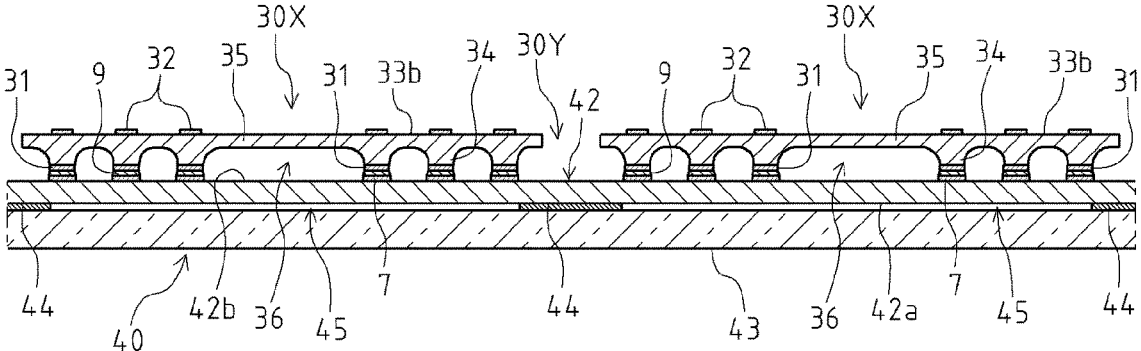

As depicted in the FIG. 4D, the lead frame pieces 30X each of which has the projection portions 34 each having a protruded shape are brought into a state of separation between the thin plate portion 35 and the silicon wafer 42 by this protruded shape. Specifically, in the state where the plurality of lead frame pieces 30X is mounted on the wafer CSP 40, space portions 36 are produced between the lead frame pieces 30X and the silicon wafer 42.

Figure 5A:
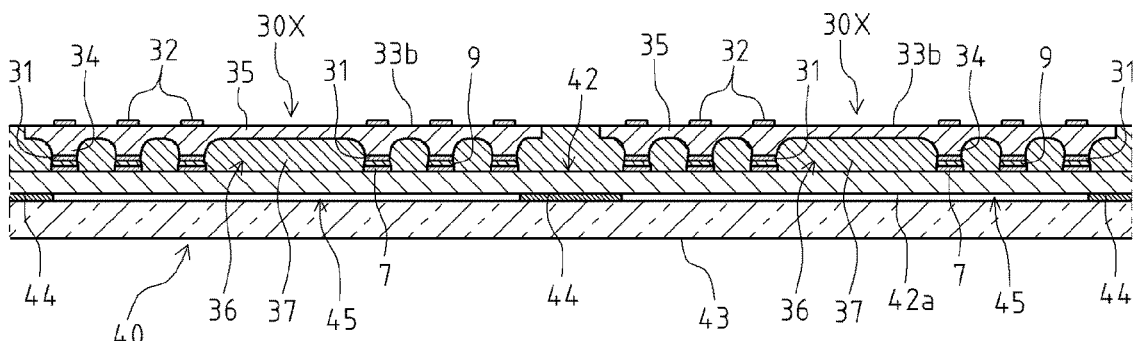

Subsequently performed is a step of filling the space portions 36 which are spaces between the lead frame pieces 30X and the wafer CSP 40, with resist 37 which is a fluid having an insulating property as depicted in a FIG. 5A. This step of filling with the resist 37 is carried out after the step of mounting the lead frame 30 and before a step of forming the columnar terminals 10.

The resist 37 is photoresist including a predetermined photosensitive material. For example, the resist 37 is ejected from a nozzle of a dispenser, and applied through clearances 30Y between the adjoining lead frame pieces 30X (see the FIG. 4D) in such a manner as to fill the space portions 36 which are clearances between the lead frame pieces 30X and the silicon wafer 42. The resist 37 flows by a capillary action or the like and fills the inside of the space portions 36. According to the present embodiment as described above, the resist 37 is employed as a fluid filling the clearances between the lead frame pieces 30X and the silicon wafer 42.

Subsequently, as depicted in a FIG. 5B, the lead frame pieces 30X mounted on the wafer CPS 40 are etched from the opposite surface 33b side. Specifically, a step of forming the columnar terminals 10 protruding from the electrode terminals 7 is performed by partially removing the frame body portion 33 of each of the lead frame pieces 30X by etching using a mask including the second plating terminal portions 32 on the opposite surface 33b of the frame body portion 33.

In this step of the opposite surface etching, the thin plate portion 35 included in the frame body portion 33 is removed from each of the lead frame pieces 30X by dry etching or wet etching. Specifically, the portion connecting the plurality of projection portions 34 is removed by etching the lead frame 30 from the opposite surface side where etching is not yet performed.

Figure 5B:
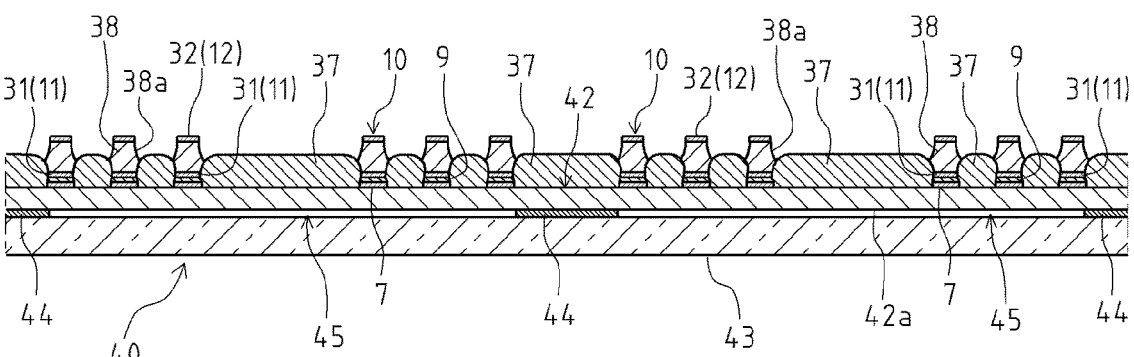

By this step, the thin plate portion 35 is removed as depicted in a FIG. 5B. As a result, portions included in the frame body portions 33 of each of the lead frame pieces 30X and located between the first plating terminal portions 31 and the second plating terminal portions 32 are left as columnar portions 38. Specifically, the frame body portion 33 of each of the lead frame pieces 30X is separated into a plurality of columnar portions 38 remaining between the upper and lower plating terminal portions 31 and 32.

These columnar portions including the upper and lower plating terminal portions 31 and 32 and the columnar portions 38 constitute the columnar terminals 10 standing on the electrode terminals 7 via the solder portions 9. By etching in this step, outer circumferential surfaces 38a of portions of the columnar portions 38 on the second plating terminal portion 32 side are formed as surfaces corresponding to the lower outer circumferential surfaces 15a of the distal end side portions 15 of the columnar terminals 10. Specifically, the first plating terminal portions 31 constitute the proximal end side terminal portions 11, the second plating terminal portions 32 constitute the distal end side terminal portions 12, and the columnar portions 38 constitute the terminal body portions 13. In such a manner, the columnar terminals 10 are produced.

Figure 5C:
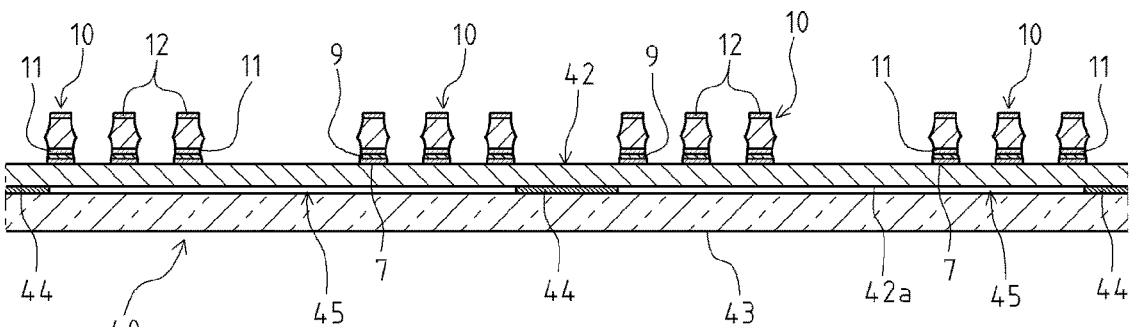

Subsequently, as depicted in a FIG. 5C, a step of removing the resist 37 is performed. In this step, the resist 37 remaining on the silicon wafer 42 is removed with use of a dedicated liquid such as a stripper and a rinse liquid, for example. As a result, the whole of the columnar terminals 10 is exposed.

Figure 5D:
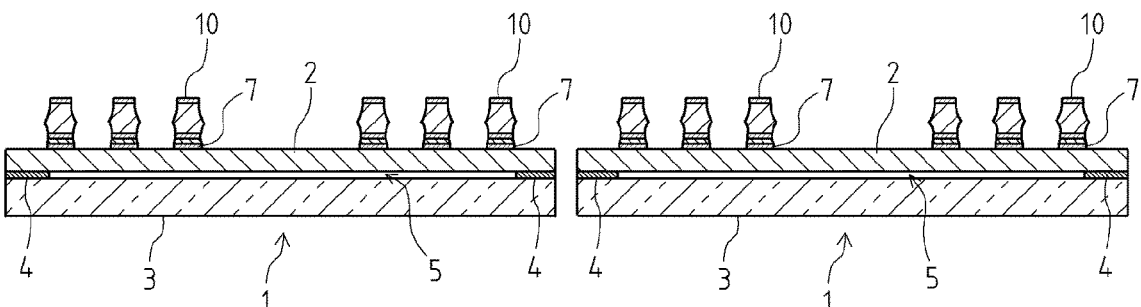

After completion of the foregoing steps, performed as depicted in a FIG. 5D is a step of dicing and singulating the wafer CSP 40 on which the columnar terminals 10 are formed. In this step, the silicon wafer 42 on which the columnar terminals 10 are formed, the wall portion 44, and the glass plate 43 are cut and singulated using a dicing blade along predetermined grid-shaped dicing lines corresponding to the layout of the image sensors 2.

By this dicing step, a plurality of the solid-state imaging devices 1 is obtained. Specifically, the silicon wafer 42 is separated into a plurality of the image sensors 2, the glass plate 43 is separated into a plurality of the glasses 3, and the wall portion 44 is separated into a plurality of the rib portions 4. These separations produce a plurality of solid-state imaging devices 1 each having the cavity 5 between the image sensor 2 and the glass 3, and the columnar terminals 10 provided in correspondence with the respective electrode terminals 7.

According to the solid-state imaging device 1 and the manufacturing method of the solid-state imaging device 1 of the present embodiment, external connection terminals can be formed in a relatively short time and at a low cost, and mounting reliability of the mounting substrate 20 can be raised.

Concerning formation of the external connection terminals, in a case where columnar metal terminals constituting the external connection terminals include plating stacking, for example, the number of steps increases, and more time and costs are required as the height of the columnar metal terminals increases. However, in a case where the height of the columnar terminals is insufficient (e.g., a case of several tens μm), stress caused by a linear expansion coefficient difference between the material of the image sensor 2 and the material of the mounting substrate 20 is difficult to completely absorb by the metal terminals. Accordingly, sufficient substrate mounting reliability is difficult to secure.

On the other hand, the solid-state imaging device 1 of the present embodiment includes the external connection terminals which are the columnar terminals 10 including processing such as etching performed for the lead frame 30 including metal. Accordingly, the external connection terminals can be collectively formed at low cost and in short time by using an etching technique.

Further, according to the present technology, each of the columnar terminals 10 has a height equivalent to the plate thickness of the lead frame 30 (e.g., approximately 150 to 200 μm). Accordingly, a sufficient height of the columnar terminals 10 is easily securable. In such a manner, the plurality of columnar terminals 10 is allowed to function as buffering members between the semiconductor base 1A and the mounting substrate 20, and the stress caused by the linear expansion coefficient difference between the material of the image sensor 2 and the mounting substrate 20 can be absorbed by the columnar terminals 10. As a result, substrate mounting reliability of the solid-state imaging device 1 can considerably improve.

In addition, the manufacturing method according to the present embodiment forms the columnar terminals 10 by performing double-step etching, i.e., half-etching from one side and etching from the opposite side, for the lead frame 30. Moreover, the manufacturing method according to the present embodiment has the step of filling the inside of the space portion 36 with the resist 37 after the lead frame pieces 30X are mounted on the wafer CSP 40. According to this manufacturing method, the diameter expansion portion 16 can be formed on each of the terminal body portions 13 of the columnar terminals 10 by the effect of the double-step etching from both the surfaces of the lead frame 30. In such a manner, a strength of the columnar terminals 10 can improve.

Further, according to the manufacturing method of the present embodiment, the wafer CSP 40 in a wafer state is adopted as the configuration on which the lead frame 30 is mounted, and the lead frame pieces 30X produced by singulating the lead frame 30 are mounted on the wafer CSP 40. In the case of this manufacturing method, the clearances 30Y between the adjoining lead frame pieces 30X can be utilized when the resist 37 fills the inside of the space portions 36. Accordingly, filling of the resist 37 can be facilitated. As a result, production efficiency of the solid-state imaging device 1 can improve.

In addition, the manufacturing method according to the present embodiment uses the resist 37 as the fluid filling the space portion 36. According to this manufacturing method, a material having properties suited for filling the space portion 36 (e.g., fluidity, permeability) can be relatively easily selected as the material of the fluid.

Moreover, according to the configuration of the present embodiment, the first plating terminal portions 31 on the lead frame 30 are made larger than the second plating terminal portions 32, and the proximal end side terminal portions 11 included in the columnar terminals 10 and constituting the junction surfaces joined to the electrode terminals 7 are made larger than the distal end side terminal portions 12 constituting the distal end surfaces.

According to this configuration, a strength of the conductor portions connecting the electrode terminals 7 of the image sensor 2 and the land electrodes 21 of the mounting substrate 20 can be raised. Specifically, as depicted in FIG. 3, in the state where the solid-state imaging device 1 is mounted on the mounting substrate 20, the conductor portion including the solder portion 25 wet and solderable for the columnar terminal 10 is allowed to have a substantially vertically symmetric shape on the whole. In such a manner, the cross-sectional sizes of the conductor portion on the upper and lower sides can be well-balanced, and the conductor portion obtains a structure not easily broken.

3. Modifications of Semiconductor Device of First Embodiment

Formation of various function units with use of a part of the lead frame 30, and adjustment of the shape of the columnar terminals 10 are achievable by devising plating formation patterns of the first plating terminal portions 31 and the second plating terminal portions 32 of the lead frame 30. Described hereinafter in modifications of the solid-state imaging device 1 will be variations of respective types of function units including the lead frame 30, and other shapes of the columnar terminals 10.

(Modification 1)

As depicted in FIGS. 7A and 7B, the solid-state imaging device 1 in modification 1 has a heat dissipation pad 50 provided on one side surface of the semiconductor base 1A as a function unit including a part of the lead frame 30. According to the example depicted in the FIGS. 7A and 7B, the heat dissipation pad 50 is provided at a central portion of the rear surface 2b of the image sensor 2 and constitutes a rectangular protruding portion together with the plurality of columnar terminals 10.

The heat dissipation pad 50 has a layered structure similar to that of the columnar terminals 10. Specifically, in correspondence with the layered structure of the columnar terminals 10, the heat dissipation pad 50 has a first layer portion 51 as a layer portion identical to the layer portion of each of the proximal end side terminal portions 11, a second layer portion 52 as a layer portion identical to each of the distal end side terminal portions 12, and an intermediate layer portion 53 which is a layer portion provided between these layer portions and identical to each of the terminal body portions 13. The first layer portion 51 and the second layer portion 52 have substantially the same planar size and are provided so as to overlap with each other in the plan view.

For example, the heat dissipation pad 50 is connected via a solder portion 59 to a pad connection portion 57 which has a rectangular shape and is provided on the rear surface 2b side of the image sensor 2 to constitute a layer portion identical to each of the electrode terminals 7. The pad connection portion 57 is formed so as to agree with the heat dissipation pad 50 in shape and size in the plan view.

The intermediate layer portion 53 of the heat dissipation pad 50 has an upper outer circumferential surface 53a and a lower outer circumferential surface 53b each provided in an outer circumferential side surface portion on all sides and forming a recess curve in the longitudinal cross-sectional view. The upper outer circumferential surface 53a and the lower outer circumferential surface 53b are outer circumferential surfaces of substantially half portions on the upper and lower sides, respectively, and including an action of etching from both surface sides of the lead frame 30 in a manner similar to the manner of the upper outer circumferential surface 14a and the lower outer circumferential surface 15a of each of the columnar terminals 10. The upper outer circumferential surface 53a and the lower outer circumferential surface 53b form a ridgeline portion 56 having a projection shape on the outer circumferential side on the entire circumference of the intermediate layer portion 53.

For manufacturing the configuration of modification 1, a lead frame 30A forming the heat dissipation pad 50 as depicted in FIGS. 8A and 8B are used in place of the lead frame 30.

As depicted in the FIGS. 8A and 8B, the lead frame 30A has first plating layer portions 61 which are plating layer portions provided in common with the first plating terminal portions 31 and formed on the facing surface 33a of the frame body portion 33 where the first plating terminal portions 31 are formed. Each of the first plating layer portions 61 is a portion constituting the first layer portion 51 of the heat dissipation pad 50. Each of the first plating layer portions 61 is formed simultaneously with the first plating terminal portions 31 as a plating pattern shape in the step of forming the first plating terminal portions 31.

The lead frame 30A has second plating layer portions 62 which are plating layer portions similar to the second plating terminal portions 32 and formed on the opposite surface 33b of the frame body portion 33 where the second plating terminal portions 32 are formed. Each of the second plating layer portions 62 is a portion constituting the second layer portion 52 of the heat dissipation pad 50. Each of the second plating layer portions 62 is formed simultaneously with the second plating terminal portions 32 as a plating pattern shape in the step of forming the second plating terminal portions 32.

The first plating layer portions 61 and the second plating layer portions 62 are formed such that external shapes of these portions agree with each other in the plate surface view of the frame body portion 33. The intermediate layer portion 53 of each of the heat dissipation pads 50 includes a portion included in the frame body portion 33 and sandwiched between the first plating layer portion 61 and the second plating layer portion 62.

The configuration of modification 1 which includes the heat dissipation pad 50 is obtained by a manufacturing method similar to the manufacturing method described in the present embodiment with use of the lead frame 30A having the foregoing configuration.

According to the configuration of modification 1, the heat dissipation pad 50 can include the lead frame 30A simultaneously with the plurality of columnar terminals 10. In such a manner, a heat dissipation unit can be provided on the semiconductor base 1A with a low-cost and simplified manufacturing method without the necessity of separately providing a heat dissipation component such as a heat dissipation plate and a heat sink. Accordingly, heat generation from the image sensor 2 can be easily handled.
(Modification 2)

As depicted in FIGS. 9A and 9B, the solid-state imaging device 1 in modification 2 has a reinforcing portion 70 provided on one side surface of the semiconductor base 1A as a function unit including a part of the lead frame 30. According to the example depicted in the FIGS. 9A and 9B, the reinforcing portion 70 is formed to constitute a frame-shaped protruding portion extending along a circumferential edge portion of the rear surface 2b of the image sensor 2.

In a bottom view, the reinforcing portion 70 is shaped to have a pair of long side portions 70a extending in the long direction (left-right direction in the FIG. 9B) of the image sensor 2 and a pair of short side portions 70b extending in the short direction (up-down direction in the FIGS. 9A and 9B) of the image sensor 2. The reinforcing portion 70 includes these four side portions to constitute a rectangular frame-shaped portion extending along the external shape of the image sensor 2.

The reinforcing portion 70 has a layered structure similar to the structure of the upper half portion of each of the columnar terminals 10. Specifically, in correspondence with the layered structure of the upper half portion of each of the columnar terminals 10, the reinforcing portion 70 has a first layer portion 71 as a layer portion identical to each of the proximal end side terminal portions 11 and a second layer portion 73 as a layer portion identical to the upper half portion of each of the terminal body portions 13.

For example, the reinforcing portion 70 is connected via a solder portion 79 to a reinforcing frame connection portion 77 having a rectangular frame shape and provided on the rear surface 2b side of the image sensor 2 to constitute a layer portion identical to each of the electrode terminals 7. The reinforcing frame connection portion 77 is formed so as to agree with the reinforcing portion 70 in shape and size in the plan view.

A lower end surface of the reinforcing portion 70 corresponds to a lower surface 73c of the second layer portion 73 including the frame body portion 33. Moreover, the second layer portion 73 has an inner circumferential surface 73a located in an inner circumferential side surface portion on all sides and forming a recess curve in the longitudinal cross-sectional view. The inner circumferential surface 73a includes an action of half-etching of the lead frame 30 similarly to the upper outer circumferential surfaces 14a of the columnar terminals 10.

For manufacturing the configuration of modification 2, a lead frame 30B forming the reinforcing portion 70 as depicted in FIGS. 10A and 10B are used in place of the lead frame 30.

As depicted in the FIGS. 10A and 10B, the lead frame 30B has a first plating layer portion 81 which is a plating layer portion provided in common with each of the first plating terminal portions 31 and formed on the facing surface 33a of the frame body portion 33 where the first plating terminal portions 31 are formed. The first plating layer portion 81 is a portion constituting the first layer portion 71 of the reinforcing portion 70.

The first plating layer portion 81 has a predetermined width and is formed so as to have a predetermined width and provided in a grid shape in the plan view in correspondence with each of the rectangular regions finally constituting the solid-state imaging devices 1. Specifically, the first plating layer portion 81 has a plurality of linear portions crossing each other at right angles and forming a grid shape, i.e., first linear portions 81a extending in a direction corresponding to the long direction of the image sensor 2, and second linear portions 81ba extending in a direction corresponding to the short direction of the image sensor 2.

Each of the first plating terminal portions 31 is formed in regions surrounded by the first plating layer portion 81. The first plating layer portion 81 is formed simultaneously with the first plating terminal portions 31 as a plating pattern shape in the step of forming the first plating terminal portions 31.

In the lead frame 30B, an area portion included in the opposite surface 33b of the frame body portion 33 where the second plating terminal portions 32 are formed, and corresponding to a portion on the opposite side of the first plating layer portion 81 is a portion where no plating layer portion is provided. Specifically, the second plating terminal portions 32 and other plating layer portions are not formed on the frame body portion 33 on the side opposite to the first plating layer portion 81.

The configuration of modification 2 which includes the reinforcing portion 70 is obtained by a manufacturing method similar to the manufacturing method described in the present embodiment with use of the lead frame 30B having the foregoing configuration.

In the case of the configuration of modification 2, the first plating layer portion 81 functions as a mask, and a portion constituting the second layer portion 73 is formed using the frame body portion 33 as a portion relatively protruding in a grid shape in the step of half-etching (see the FIG. 4B). Thereafter, the portion constituting the second layer portion 73 is formed into a protruding portion having a rectangular frame shape on each of the lead frame pieces 30X in the step of singulating the lead frame 30B (see the part G of FIG. 4C).

Thereafter, by the step of opposite surface etching (see the FIG. 5B), a portion corresponding to the portion where the first plating layer portion 81 is formed is partially removed from the frame body portion 33 to reduce the thickness of this portion to about half the thickness. In such a manner, the second layer portion 73 having a rectangular frame shape and constituting the lower surface 73c is formed to constitute the reinforcing portion 70.

According to the configuration of modification 2, the reinforcing portion 70 can include the lead frame 30B simultaneously with the plurality of columnar terminals 10. In such a manner, a reinforcing structure unit can be provided on the semiconductor base 1A with use of a low-cost and simplified manufacturing method without the necessity of separately providing a reinforcing component. Accordingly, sufficient strength of the solid-state imaging device 1 can be easily obtained, and rigidity of the package can be enhanced. As a result, deformation such as a warp can be reduced. Note that the reinforcing portion 70 is not limited to the frame-shaped part but may be a linear part, a curved part, or others.
(Modification 3)

As depicted in FIGS. 11A and 11B, the solid-state imaging device 1 in modification 3 has a GND (ground) plain 90 provided on one side surface of the semiconductor base 1A as a function unit including a part of the lead frame 30. Specifically, a part of the layer including the lead frame 30 constitutes a GND layer containing the GND plain 90. According to the example depicted in the FIGS. 11A and 11B, the GND plain 90 is provided to constitute a frame-shaped protruding portion extending along a circumferential edge portion of the rear surface 2b of the image sensor 2.

In a bottom view, the GND plain 90 is shaped to have a pair of long side portions 90a extending in the long direction (left-right direction in the FIG. 11B) of the image sensor 2, and a pair of short side portions 90b extending in the short direction (up-down direction in the FIG. 11B) of the image sensor 2 in a bottom view. The GND plain 90 includes these four side portions to constitute a rectangular frame-shaped portion extending along the external shape of the image sensor 2.

The GND plain 90 has a layered structure similar to the structure of the upper half portion of each of the columnar terminals 10. Specifically, in correspondence with the layered structure of the upper half portion of each of the columnar terminals 10, the GND plain 90 has a first layer portion 91 as a layer portion identical to each of the proximal end side terminal portions 11, and a second layer portion 93 as a layer portion identical to the upper half portion of each of the terminal body portions 13.

For example, the GND plain 90 is connected via a solder portion 99 to a GND connection portion 97 having a rectangular frame shape and provided on the rear surface 2b side of the image sensor 2 to constitute a layer portion identical to each of the electrode terminals 7. The GND plain connection portion 97 is formed so as to agree with the GND plain 90 in shape and size in the plan view.

A lower end surface of the GND plain 90 corresponds to a lower surface 93c of the second layer portion 93 including the frame body portion 33. Moreover, the second layer portion 93 has an inner circumferential surface 93a located in an inner circumferential side surface portion on all sides and forming a recess curve in the longitudinal cross-sectional view. The inner circumferential surface 93a includes an action of half-etching of the lead frame 30 similarly to the upper outer circumferential surfaces 14a of the columnar terminals 10.

Further, according to the configuration of modification 3, GND terminals 100 including a part of the lead frame 30 are provided. Each of the GND terminal 100 is a terminal receiving supply of a GND potential, and connected to the GND plain 90. According to the example depicted in the FIGS. 11A and 11B, the GND terminals 100 are provided in a line in a form bridged between the pair of long side portions 90a and in parallel with the short side portions 90b for the GND plain 90 having a frame shape in the bottom view. Moreover, the GND terminals 100 are located at positions closer to one side (left side in the FIG. 11B) with respect to the center of the image sensor 2 in the long direction.

Each of the GND terminals 100 has a layered structure similar to that of the columnar terminals 10. Specifically, in correspondence with the layered structure of the columnar terminals 10, each of the GND terminals 100 has a first layer portion 101 as a layer portion identical to the layer portion of each of the proximal end side terminal portions 11, a second layer portion 102 as a layer portion identical to each of the distal end side terminal portions 12, and a third layer portion 103 as a layer portion identical to each of the terminal body portions 13.

Each of the first layer portions 101 and the third layer portions 103 is formed into a linearly continuous layer portion in correspondence with the linear shape of each of the GND terminals 100. Each of the GND terminals 100 is connected to the GND plain 90 via the first layer portion 101 and the third layer portion 103. On the other hand, the second layer portions 102 each have a circular shape similarly to the distal end side terminal portion 12, and are linearly arranged with a predetermined clearance left between each other in correspondence with the layout of the plurality of columnar terminals 10. According to the example depicted in the FIG. 11B, the five second layer portions 102 are disposed in a line in an extending direction of the GND terminal 100.

For example, each of the GND terminals 100 is connected via a solder portion 109 to a GND terminal connection portion 107 having a linear shape and provided on the rear surface 2b side of the image sensor 2 to constitute a layer portion identical to each of the electrode terminals 7. Each of the GND terminal connection portions 107 is formed so as to agree with each of the GND terminals 100 in shape and size in the plan view.

The third layer portion 103 of each of the GND terminals 100 has an upper side surface 103a which forms a recess curve in the longitudinal cross-sectional view on each of the left and right sides of an upper part of the third layer portion 103. The upper side surface 103a includes an action of half-etching of the lead frame 30 similarly to the upper outer circumferential surfaces 14a of the columnar terminals 10. Moreover, each of the third layer portions 103 has a lower surface 103c which is a surface flush with the lower surface 93c of the GND plain 90. Further, each of the third layer portions 103 has a portion corresponding to a portion where the second layer portion 102 is provided, and protruding from the lower surface 103c. An outer circumferential surface of this protruded portion constitutes a lower outer circumferential surface 103b forming a recess curve in the longitudinal cross-sectional view similarly to the lower outer circumferential surface 15a of each of the columnar terminals 10. The lower outer circumferential surface 103b includes an action of opposite surface etching of the lead frame 30.

For manufacturing the configuration of modification 3, a lead frame 30C forming the GND plain 90 and the GND terminals 100 as depicted in FIGS. 12A and 12B are used in place of the lead frame 30.

As depicted in the FIGS. 12A and 12B, the lead frame 30C has a first plating layer portion 111 which is a plating layer portion provided in common with each of the first plating terminal portions 31 and formed on the facing surface 33a of the frame body portion 33 where the first plating terminal portions 31 are formed. The first plating layer portion 111 includes a portion constituting the first layer portion 91 of the GND plain 90, and portions constituting the first layer portions 101 of the GND terminals 100.

As the portion constituting the first layer portion 91 of the GND plain 90, the first plating layer portion 111 has a portion having a predetermined width and provided in a grid shape in the plan view in correspondence with rectangular regions each finally constituting the solid-state imaging device 1. Specifically, the first plating layer portion 111 has a plurality of linear portions crossing each other at right angles and forming a grid shape to constitute the first layer portion 91, i.e., first linear portions 111a extending in a direction corresponding to the long direction of the image sensor 2, and second linear portions 111b extending in a direction corresponding to the short direction of the image sensor 2. Moreover, the first plating layer portion 111 has a portion constituting the first layer portions 101 of the GND terminal 100, i.e., a third linear portion 111c which is linear and parallel with the second linear portion 111b.

Each of the first plating terminal portions 31 is formed in regions surrounded by the first plating layer portion 111. The first plating layer portion 111 is formed simultaneously with the first plating terminal portions 31 as a plating pattern shape in the step of forming the first plating terminal portions 31.

In the lead frame 30C, an area portion included in the opposite surface 33b of the frame body portion 33 where the second plating terminal portions 32 are formed, and corresponding to portions on the opposite side of the first linear portions 111a and the second linear portions 111b of the first plating layer portion 111 is a portion where no plating layer portion is provided. Specifically, the second plating terminal portions 32 and other plating layer portions are not formed on the frame body portion 33 on the side opposite to the first linear portions 111a and the second linear portions 111b.

On the other hand, second plating layer portions 112 each having a circular shape and arranged in conformity with the layout of the second plating terminal portions 32 are provided on the opposite surface 33b on the side opposite to the portion where the third linear portion 111c is formed. The second plating layer portions 112 are portions constituting the second layer portions 102 of the GND terminals 100.

The configuration of modification 3 which includes the GND plain 90 and the GND terminals 100 is obtained by a manufacturing method similar to the manufacturing method described in the present embodiment with use of the lead frame 30C having the foregoing configuration.

In the case of the configuration of modification 3, the first plating layer portion 111 functions as a mask, and portions relatively protruding in a grid shape are formed using the frame body portion 33 to constitute portions corresponding to the second layer portion 93 of the GND plain 90 and the third layer portions 103 of the GND terminals 100 in the step of half-etching (see the FIG. 4B). Thereafter, a protruding portion having a rectangular frame shape is formed to constitute the second layer portion 93 of the GND plain 90, and linear protruding portions are formed to constitute the third layer portions 103 of the GND terminals 100 on each of the lead frame pieces 30X in the step of singulating the lead frame 30C (see the part G of FIG. 4C).

Subsequently, by the step of opposite surface etching (see the FIG. 5B), portions corresponding to the portions where the first linear portions 111a and the second linear portions 111b of the first plating layer portion 111 are formed are partially removed from the frame body portion 33 to reduce each thickness of these portions has about half the thickness. Moreover, for the portion included in the frame body portion 33 and corresponding to the portion where the third linear portion 111c is formed, the distal end side terminal portions 12 function as a mask. The portion where the second plating layer portions 112 are not formed is partially removed to reduce the thickness of this portion to about half the thickness. The portions where the second plating layer portions 112 are formed remain as protruded portions. In such a manner, the second layer portion 93 which has a rectangular frame shape and constitutes the lower surface 93c of the GND plain 90, and the third layer portions 103 which are linear and constitute the lower surfaces 103c of the GND terminals 100 are formed to produce the GND plain 90 and the GND terminals 100.

According to the configuration of modification 3, the GND plain 90 and the GND terminals 100 can be formed simultaneously with the plurality of columnar terminals 10 with use of the lead frame 30C. In such a manner, the GND plain and the GND terminals can be provided on the semiconductor base 1A using a low-cost and simplified manufacturing method without the necessity of separately providing the GND plain and the GND terminals. As a result, electric signal transfer quality of the solid-state imaging device can improve. Moreover, pattern shapes of plating on the lead frame 30C can be reflected in the shapes of the GND plain 90 and the GND terminals 100. Accordingly, the degree of freedom of the shapes of the GND plain 90 and the GND terminals 100 increases.

(Modification 4)

As depicted in FIGS. 13A and 13B, the solid-state imaging device 1 in modification 4 has a built-in chip 125 which is a second semiconductor element provided on one side surface of the semiconductor base 1A. For example, the built-in chip 125 is a semiconductor chip having a predetermined integrated circuit such as a logic chip and a memory chip.

According to the example depicted in the FIGS. 13A and 13B, the built-in chip 125 has a rectangular-plate external shape and is mounted on a central portion of the rear surface 2b of the image sensor 2 via a predetermined connection layer 125a with use of solder or an adhesive. For example, the built-in chips 125 are mounted at predetermined portions of the silicon wafer 42 together with the lead frame 30 in a step of mounting the lead frame 30 on the wafer CSP 40 by reflow. Note that the built-in chips 125 may be mounted prior to the step of mounting the lead frame 30.

The solid-state imaging device 1 having the built-in chip 125 as described above includes a shield portion 120 formed on one side surface of the semiconductor base 1A in such a manner as to cover the built-in chip 125, and provided as a function unit including a part of the lead frame 30. The shield portion 120 is provided at a central portion of the rear surface 2b of the image sensor 2 as a rectangular and protruding cover portion together with the plurality of columnar terminals 10.

The shield portion 120 has a flat portion 120a having a rectangular shape and provided in parallel with the rear surface 2b of the image sensor 2, and a circumferential wall portion 120b provided so as to follow an external shape of the flat portion 120a. The flat portion 120a covers the built-in chip 125 from the lower side. The circumferential wall portion 120b has a pair of long wall portions extending in the long direction of the image sensor 2, and a pair of short wall portions extending in the short direction of the image sensor 2, and surrounds the built-in chip 125 from all sides using these wall portions. The shield portion 120 has a flat box shape including the flat portion 120a and the circumferential wall portion 120b, and defines, jointly with the rear surface 2b of the image sensor 2, a space portion 120c containing the built-in chip 125.

The shield portion 120 has a layered structure similar to the layered structure of each of the columnar terminals 10. Specifically, in correspondence with the layered structure of the columnar terminals 10, the shield portion 120 has a first layer portion 121 as a layer portion identical to the layer portion of each of the proximal end side terminal portions 11, a second layer portion 122 as a layer portion identical to each of the distal end side terminal portions 12, and an intermediate layer portion 123 which is a layer portion provided between these layer portions and identical to each of the terminal body portions 13.

The first layer portion 121 includes a pair of long side portions and a pair of short side portions each having a predetermined width, and has a rectangular frame shape including these side portions and corresponding to the external shape of the shield portion 120. The second layer portion 122 constitutes a lower surface portion of the shield portion 120, and has a rectangular shape corresponding to the external shape of the shield portion 120.

The intermediate layer portion 123 has a bottom portion 123p having a rectangular plate shape and corresponding to the external shape of the shield portion 120, and a protruding edge portion 123q protruding in a rectangular frame shape and extending along an entire outer edge of the bottom portion 123p. The first layer portion 121 is provided above the protruding edge portion 123q, while the second layer portion 122 is provided below the bottom portion 123p. The bottom portion 123p is a portion which forms, jointly with the second layer portion 122, the flat portion 120a of the shield portion 120. The protruding edge portion 123q is a portion which forms, jointly with the first layer portion 121, the circumferential wall portion 120b of the shield portion 120.

For example, the shield portion 120 is connected via a solder portion 129 to a pad connection portion 127 having a rectangular frame shape and provided on the rear surface 2b side of the image sensor 2 as a layer portion identical to each of the electrode terminals 7. The pad connection portion 127 is formed so as to agree with the first layer portion 121 of the shield portion 120 in shape and size.

The intermediate layer portion 123 of the shield portion 120 has an upper outer circumferential surface 123a and a lower outer circumferential surface 123b each located in an outer circumferential side surface portion on all sides and forming a recess curve in the longitudinal cross-sectional view. The upper outer circumferential surface 123a and the lower outer circumferential surface 123b are outer side surfaces of substantially half portions on the upper and lower sides, respectively, and including an action of etching from both surface sides of the lead frame 30 in a manner similar to the manner of the upper outer circumferential surface 14a and the lower outer circumferential surface 15a of each of the columnar terminals 10. The upper outer circumferential surface 123a and the lower outer circumferential surface 123b form a ridgeline portion 126 having a projection shape on the outer circumferential side and extending on the entire circumference of the intermediate layer portion 123.

Moreover, the intermediate layer portion 123 of the shield portion 120 has an upper inner circumferential surface 123c located in an inner circumferential side surface portion on all sides of the protruding edge portion 123q and forming a recess curve in the longitudinal cross-sectional view. Further, the intermediate layer portion 123 of the shield portion 120 has a bottom surface 123d which is the upper surface of the bottom portion 123p, and is horizontal and faces the rear surface 2b of the image sensor 2. The upper inner circumferential surface 123c and the bottom surface 123d include an action of half-etching of the lead frame 30.

For manufacturing the configuration of modification 4, a lead frame 30D forming the shield portion 120 as depicted in FIGS. 14A and 14B are used in place of the lead frame 30.

As depicted in the FIGS. 14A and 14B, the lead frame 30D has first plating layer portions 131 each of which is a plating layer portion provided in common with each of the first plating terminal portions 31 and formed on the facing surface 33a of the frame body portion 33 where the first plating terminal portions 31 are formed. Each of the first plating layer portions 131 is a portion constituting the first layer portion 121 of the shield portion 120.

Each of the first plating layer portions 131 has a pair of long side portions 131a and a pair of short side portions 131b each having a predetermined width and is provided as a portion having a rectangular frame shape. Each of the first plating terminal portions 31 is formed so as to surround the corresponding first plating layer portion 131. The first plating layer portions 131 are formed simultaneously with the first plating terminal portions 31 as a plating pattern shape in the step of forming the first plating terminal portions 31.

The lead frame 30D has second plating layer portions 132 which are plating layer portions similar to the second plating terminal portions 32 and formed on the opposite surface 33b of the frame body portion 33 where the second plating terminal portions 32 are formed. Each of the second plating layer portions 132 is a portion constituting the second layer portion 122 of the shield portion 120 and having a rectangular shape. Each of the second plating terminal portions 32 is formed so as to surround the corresponding second plating layer portion 132. The second plating layer portions 132 are formed simultaneously with the second plating terminal portions 32 as a plating pattern shape in the step of forming the second plating terminal portions 32.

The first plating layer portions 131 and the second plating layer portions 132 are formed such that external shapes of these portions agree with each other in the plate surface view of the frame body portion 33. The intermediate layer portion 123 of the shield portion 120 includes a portion included in the frame body portion 33 and contained within a range where the corresponding first plating layer portion 131 and the corresponding second plating layer portion 132 are formed.

The configuration of modification 4 which includes the shield portion 120 is obtained by a manufacturing method similar to the manufacturing method described in the present embodiment with use of the lead frame 30D having the foregoing configuration.

In the case of the configuration of modification 4, the first plating layer portions 131 function as a mask, and rectangular recessed portions include the frame body portion 33 as portions each defined by surfaces constituting the upper inner circumferential surface 123c and the bottom surface 123d of the intermediate layer portion 123 in the step of half-etching (see the FIG. 4B).

Thereafter, by the step of opposite surface etching (see the FIG. 5B), the second plating layer portions 132 function as a mask, and the upper outer circumferential surface 123a and the lower outer circumferential surface 123b of each of the intermediate layer portions 123 are formed together with the terminal body portions 13 of the columnar terminals 10. In such a manner, the intermediate layer portions 123 are formed, and therefore formation of the shield portions 120 is completed.

As described above, the configuration of modification 4 has a hollow structure disposed on the rear surface 2b side of the image sensor 2 and including the lead frame 30. The built-in chip 125 is provided inside this hollow structure, and shielded by the shield portion 120. According to the configuration of modification 4, the shield portion 120 can be formed simultaneously with the plurality of columnar terminals 10 with use of the lead frame 30D. Accordingly, a shield structure unit can be provided for the built-in chip 125 of the semiconductor base 1A by using a low-cost and simplified manufacturing method without the necessity of separately providing a component for a shield structure. As a result, noise generated from the built-in chip 125 can be reduced. Accordingly, advantageous effects such as an increase in the degree of freedom of wiring on the mounting substrate 20 can be offered.

(Modification 5)

Modification 5 is a modified example of the shape of the columnar terminals 10. As depicted in FIGS. 15A and 15B, and FIGS. 16A, 16B, and 16C, each of columnar terminals 10A (10) of modification 5 is configured such that a junction surface of the columnar terminal 10A joined to the corresponding electrode terminal 7 has an elliptic shape, and that a distal end side end surface of the columnar terminal 10 has a circular shape. The circular distal end surface of each of the columnar terminals 10A has a size contained in an area of the elliptic junction surface joined to the electrode terminal 7 in an axial view of the columnar terminal 10A. Note that the FIG. 16B is a cross-sectional diagram taken in a direction A-A in the FIG. 16A, while the FIG. 16C is a cross-sectional diagram taken in a direction B-B in the FIG. 16A.

Each of the columnar terminals 10A is configured such that the proximal end side terminal portion 11 which has the upper surface 11a corresponding to the junction surface joined to the electrode terminal 7 has an elliptic shape, and that the distal end side terminal portion 12 which has the lower surface 12a corresponding to the distal end surface has a circular shape. Each of the distal end side terminal portions 12 has a size contained within the range of the external shape of the proximal end side terminal portion 11 in the axial view of the columnar terminal 10A. The diameter of each of the distal end side terminal portions 12 having a circular shape is smaller than the minor axis of each of the proximal end side terminal portions 11 having an elliptic shape. Both of these terminal portions are concentrically disposed. In addition, each of the columnar terminals 10A has the terminal body portion 13 having a substantially tapered shape between the proximal end side terminal portion 11 and the distal end side terminal portion 12.

For example, each of the electrode terminals 7 to which the columnar terminals 10A are connected has an elliptic shape in correspondence with the proximal end side terminal portion 11. Each of the solder portions 9 interposed between the proximal end side terminal portions 11 and the electrode terminals 7 is an elliptic layer portion in correspondence with the shapes of the proximal end side terminal portions 11 and the electrode terminals 7.

According to the configuration of modification 5, the proximal end side portion 14 of each of the terminal body portions 13 has an elliptic transverse cross-sectional shape. Moreover, the distal end side portion 15 of each of the terminal body portions 13 has such a transverse cross-sectional shape gradually changing from the elliptic shape into a circular shape in the direction from the upper side to the lower side. The diameter expansion portion 16 of each of the columnar terminals 10A forms the ridgeline 16a having an elliptic shape and following the external shape of the proximal end side terminal portion 11.

Each of the columnar terminals 10A has a tapered external shape on the whole, which is tapered downward in a longitudinal cross-sectional view at a position of the major axis of the elliptic shape in the bottom view of the proximal end side terminal portion 11 (see the FIG. 16B). Each of the columnar terminals 10A has a substantially cylindrical shape on the whole in a longitudinal cross-sectional view at a position of the minor axis of the elliptic shape in the bottom view of the proximal end side terminal portion 11 (see the FIG. 16C).

According to the configuration of modification 5, a plurality of the columnar terminals 10A is provided such that the major axis direction of the elliptic shape of each of the proximal end side terminal portions 11 extends toward a central portion of the semiconductor base 1A. As depicted in the FIG. 15B, each of the columnar terminals 10A of the present embodiment is provided such that the major axis direction of the elliptic shape of each of the proximal end side terminal portions 11 extends toward a center point O1 located at the center portion of the semiconductor base 1A in the bottom view of the solid-state imaging device 1.

Each of the plurality of columnar terminals 10A two-dimensionally arranged in a form of grid points is provided such that the major axis direction of the elliptic shape of the proximal end side terminal portion 11 is directed to the center point O1 with an inclination angle corresponding to an arrangement position of the columnar terminal 10A. In other words, each of the plurality of columnar terminals 10A is provided such that the major axis direction of the elliptic shape corresponding to the bottom view shape has directivity to the center point O1 so as to extend radially from the center point O1 in the bottom view of the solid-state imaging device 1. Specifically, each of the plurality of columnar terminals 10A is provided such that the major axis direction of the elliptic shape corresponding to the bottom view shape extends along a straight line passing through the center point O1 in the bottom view of the solid-state imaging device 1.

For manufacturing the configuration of modification 5, a lead frame 30E as depicted in FIGS. 17A and 17B are used in place of the lead frame 30.

As depicted in the FIGS. 17A and 17B, the lead frame 30E has the first plating terminal portions 31 each having an elliptic shape and the second plating terminal portions 32 each having a circular shape. The outer diameter of each of the second plating terminal portions 32 is smaller than the minor axis of each of the first plating terminal portions 31. The plating terminal portions 31 and 32 are concentrically disposed around a center axis direction coinciding with the vertical direction of the plate surface of the lead frame 30.

In addition, each of the plurality of first plating terminal portions 31 is formed such that the major axis direction of the elliptic shape extends toward a center position O2 of a rectangular region which finally constitutes the solid-state imaging device 1. Specifically, each of the first plating terminal portions 31 is provided such that the major axis direction of the elliptic shape extends along a straight line passing through the center position o2.

The configuration of modification 5 is obtained by a manufacturing method similar to the manufacturing method described in the present embodiment by using the lead frame 30E having the foregoing configuration.

In the step of forming the plurality of plating terminal portions 31 and 32 in the manufacturing method of the configuration of modification 5, each of the first plating terminal portions 31 formed on the facing surface 33a of the frame body portion 33 has an elliptic shape, and each of the second plating terminal portions 32 formed on the opposite surface 33b of the frame body portion 33 has a circular shape. In this case, each of the second plating terminal portions 32 has a circular shape having a size contained in the region where the corresponding first plating terminal portion 31 is formed. Moreover, each of the first plating terminal portions 31 is formed such that the major axis direction of the elliptic shape extends toward the central portion of the image sensor 2.

According to the configuration of modification 5, each of the columnar terminals 10A is allowed to have such a shape gradually increasing the thickness of the shape from a circular shape to an elliptic shape in the direction from the distal end side terminal portion 12 toward the proximal end side terminal portion 11. Accordingly, the root portion can be reinforced, and therefore a strength of the columnar terminals 10A can be raised. Moreover, each of the plurality of columnar terminals 10A is radially arranged to have directivity. Accordingly, a mechanical strength of the package structure itself of the solid-state imaging device 1 can increase. In such a manner, reduction of deformation such as a warp, and improvement of temperature cycle resistance of the solid-state imaging device 1 are achievable.

According to the solid-state imaging device 1 and the manufacturing method of the solid-state imaging device 1 according to the present embodiment described above in the respective modifications, various shapes and structures can be created only by designing of the plating portions formed on both the surfaces of the frame body portion 33 and each functioning as a mask during etching of the lead frame 30. These shapes and structures are difficult to produce by plating processes.

In a case where columnar metal terminals corresponding to external connection terminals include plating stacking, for example, the degree of freedom in design of terminal shapes is relatively low. Accordingly, processing the external connection terminals into various shapes, and providing functions other than the function of the external connection terminals are difficult to realize. According to the technology which forms the columnar terminals 10 with use of the lead frame 30, however, the degree of freedom in design of the terminal shapes can be raised, and various function units can include by the lead frame 30 as well as the columnar terminals 10.

4. Configuration Example of Semiconductor Device of Second Embodiment

A configuration example of a semiconductor device according to a second embodiment of the present technology will be described with reference to FIG. 18. A solid-state imaging device 201 according to the present embodiment is an example of the semiconductor device, and has a different configuration of the semiconductor base 1A in comparison with the first embodiment. Note that the up-down direction in FIG. 18 corresponds to the up-down direction of the solid-state imaging device 201. Moreover, in the following description of each of embodiments presented hereinafter, common configurations also included in the other embodiments will be given identical reference numbers, and the same description will be omitted where appropriate.

As depicted in FIG. 18, the solid-state imaging device 201 includes an image sensor 202 provided as a solid-state imaging element, glass 203, and a rib resin portion 204 provided as a support portion for supporting the glass 203 on the image sensor 2. The solid-state imaging device 201 has a package structure which includes the glass 203 mounted on the image sensor 202 via the rib resin portion 204, and a cavity 205 between the image sensor 202 and the glass 203.

The image sensor 202 is a chip having a rectangular plate shape, and the upper side of the image sensor 202 is designated as a light reception surface side. For example, the image sensor 202 is a CMOS type image sensor. The glass 203 is a transparent component having a rectangular-plate external shape, and is supported by the rib resin portion 204 in a state fixed to the image sensor 202.

The rib resin portion 204 has a wall shape formed on the entire circumference along the external shape of the glass 203, and provided so as to surround a pixel region on the light reception surface of the image sensor 202, and formed so as to constitute a rectangular frame shape in the plan view. The rib resin portion 204 functions as a sealing portion which seals the circumference of the cavity 205.

For example, the rib resin portion 204 includes a material of a photosensitive adhesive such as a UV (ultraviolet light) curable resin which is an acryl-based resin, a thermosetting resin such as an epoxy-based resin, or a mixture of these.

The rib resin portion 204 is formed on the front surface of the image sensor 202 by application using a dispenser, patterning using photolithography, or other methods.

The image sensor 202 is mounted on an organic substrate 206 including an organic material such as plastic. The organic substrate 206 has a front surface 206a on which the image sensor 202 is mounted, and a rear surface 206b as a plate surface opposite to the front surface 206a. The image sensor 202 is die-bonded to the front surface 206a side of the organic substrate 206 with use of insulating or conductive paste 207.

The image sensor 202 and the organic substrate 206 are electrically connected to each other by a plurality of bonding wires 208. For example, each of the bonding wires 208 is a metal thin line including Au (gold) or Cu (copper), and electrically connects a pad electrode provided on the upper surface of the image sensor 202 and a lead electrode 210 provided on the front surface of the organic substrate 206.

The lead electrode 210 on the organic substrate 206 is connected to a plurality of electrode terminals 217 provided on the rear surface 206b side of the organic substrate 206 via a wiring pattern or the like provided in the organic substrate 206.

A periphery of the bonding wires 208 which is a portion outside the cavity 205 on the organic substrate 206 is covered and sealed by a mold resin 213. The mold resin 213 is provided so as to cover a portion located on a circumferential edge portion of the organic substrate 206 and constituting circumferential edge portions of the image sensor 202 and the glass 203.

For example, the mold resin 213 is a thermosetting resin which contains a filler including silicon oxide as a chief ingredient. For example, the mold resin 213 is formed into a predetermined shape by injection molding using a molding die or other methods.

According to the solid-state imaging device 201 having the above configuration, a plurality of the columnar terminals 10 including the lead frame 30 is provided as external connection terminals for electric connection with a predetermined mounting substrate on which the solid-state imaging device 201 is mounted.

Each of the columnar terminals 10 is provided in a state protruded from the corresponding one of the electrode terminals 217 provided on the rear surface 206b side of the organic substrate 206. Each of the columnar terminals 10 is electrically connected to the corresponding electrode terminal 217 via a solder portion 219.

As described above, the solid-state imaging device 201 includes a semiconductor base 201A which contains the image sensor 202 corresponding to a semiconductor element, and the columnar terminals 10 each including a part of a lead frame. According to the present embodiment, the semiconductor base 201A is a structure which has the image sensor 202 mounted on the organic substrate 206, and the glass 203 provided on the front surface side of the image sensor 202 via the rib resin portion 204, and has the plurality of electrode terminals 217 for external connection on the rear surface 206b of the organic substrate 206 corresponding to one surface of the semiconductor base 201A. In addition, the columnar terminals 10 are provided on the semiconductor base 201A in such a manner as to protrude from the respective electrode terminals 217.

5. Manufacturing Method of Semiconductor Device of Second Embodiment

A manufacturing method of the semiconductor device according to the second embodiment of the present technology will be described with reference to FIGS. 19A, 19B, 19C, 20A, 20B, 20C, and 21.

The manufacturing method of the solid-state imaging device 201 of the present embodiment has a different mounting mode of the lead frame 30 in comparison with the manufacturing method of the solid-state imaging device of the first embodiment. Specifically, according to the manufacturing method of the first embodiment, the lead frame pieces 30X produced by singulating the lead frame 30 are mounted on the WL-CSP in a wafer state (see FIG. 6). According to the manufacturing method of the second embodiment, however, the lead frame 30 in an aggregate state is mounted on an organic substrate package similarly in an aggregated state (see FIG. 21). Other steps are the same steps as the corresponding steps in the first embodiment.

In the manufacturing method of the solid-state imaging device 201, a step of preparing the lead frame 30 is initially performed as depicted in a FIG. 19A.

Moreover, in the manufacturing method of the solid-state imaging device 201, a step of preparing an organic substrate package 240 in an aggregate state is performed. The organic substrate package 240 includes the semiconductor bases 201A of the solid-state imaging devices 201 in an aggregate state, and has a rectangular plate shape as depicted in FIG. 21 similarly to the lead frame 30.

As depicted in a FIGS. 19B and 21, the organic substrate package 240 has a plurality of configurations each including the image sensor 202, the glass 203, and the rib resin portion 204. These configurations are disposed in a predetermined layout and mounted on an organic substrate body 246 which constitutes the organic substrates 206 in an aggregate state. The bonding wires 208 are provided for the respective configurations to form mold resin portions 243 constituting the mold resins 213. For example, each of the mold resin portions 243 has a predetermined shape including injection molding using a molding die or other methods. The plurality of electrode terminals 217 is formed in a predetermined layout on a plate surface 246b on the side opposite to the image sensor 202 side of the organic substrate body 246.

According to the present embodiment as described above, the organic substrate package 240 which is an integrated plate-shaped body including the plurality of image sensors 202 formed in an aggregation state is adopted as a semiconductor device body on which the lead frame 30 is mounted.

Subsequently, as depicted in the FIG. 19B, one-side half etching is performed for the lead frame 30 from the facing surface 33a side of the frame body portion 33. This step is performed before a step of mounting the lead frame 30 on the organic substrate package 240. By this step, the projection portions 34 and the thin plate portion 35 are formed on the lead frame 30 as depicted in the FIG. 19B.

Subsequently, as depicted in a FIG. 19C, the step of mounting the lead frame 30 (30P) on the organic substrate package 240 is performed. Specifically, the step of mounting the lead frame 30P on the organic substrate package 240 is achieved by joining the first plating terminal portions 31 of the half-etched lead frame 30P to the electrode terminals 217 corresponding to terminals of the organic substrate package 240.

In this step, the lead frame 30P is mounted on the organic substrate package 240 by reflow solder mounting. In this example, the lead frame 30P in an aggregate state is mounted on the organic substrate package 240 similarly in an aggregate state as depicted in FIG. 21. FIG. 21 depicts an image of mounting of the lead frame 30 according to the present embodiment.

By this step, the lead frame 30P is brought into a state where the respective first plating terminal portions 31 are joined to the electrode terminals 217 via the solder portions 219. As depicted in the FIG. 19C, space portions 236 are produced between the lead frame 30P and the organic substrate body 246 in a state where the lead frame 30P is mounted on the organic substrate package 240.

Subsequently performed is a step of filling the space portions 236 which are spaces between the lead frame 30P and the organic substrate package 240, with the resist 37 as depicted in a FIG. 20A. This step of filling the resist 37 is carried out after the step of mounting the lead frame 30P and before a step of forming the columnar terminals 10.

For example, the resist 37 is ejected from a nozzle of a dispenser, and applied through a clearance between the lead frame 30P and the organic substrate body 246 in an outer peripheral portion of the organic substrate package 240 in such a manner as to fill the space portions 236. In this step, an opening through which the resist 37 is supplied into the space portions 236 may be formed at a predetermined portion of the lead frame 30P. For example, the opening is formed as a through hole portion having a slit shape and provided in the thin plate portion 35 or the like of the lead frame 30P to allow the space portions 236 to communicate with an external space. The resist 37 is supplied through the opening of the lead frame 30P and fills the inside of the space portions 236. The opening thus formed in the lead frame 30P allows easy and efficient application of the resist 37.

According to the present embodiment as described above, the resist 37 is employed as a fluid filling the clearances between the lead frame 30P and the organic substrate body 246.

Subsequently, as depicted in a FIG. 20B, etching is performed for the lead frame 30P mounted on the organic substrate package 240 from the opposite surface 33b side. By this step, the thin plate portion 35 of the lead frame 30P is removed to form the columnar portions 38. Specifically, the columnar portions including the upper and lower plating terminal portions 31 and 32 and the columnar portions 38 constitute the columnar terminals 10 standing on the electrode terminals 217 via the solder portions 219.

Subsequently, after completion of the step of removing the resist 37, performed as depicted in a FIG. 20C is a step of dicing and singulating the organic substrate package 240 on which the columnar terminals 10 are formed. In the step of dicing, the organic substrate body 246 on which the columnar terminals 10 are formed, and the mold resin portion 243 are cut and singulated with use of a dicing blade along predetermined dicing lines in a grid shape corresponding to the layout of the image sensors 202. In such a manner, the organic substrate body 246 is separated into a plurality of the organic substrates 206, and the mold resin portion 243 is separated into a plurality of the mold resins 213. As a result, a plurality of the solid-state imaging devices 201 is obtained.

According to the solid-state imaging device 201 and the manufacturing method of the solid-state imaging device 201 of the present embodiment, the columnar terminals 10 as external connection terminals can be formed in a short time and at a low cost, and mounting reliability of the solid-state imaging device 201 can be raised as in the first embodiment.

6. Configuration Example of Semiconductor Device
of Third Embodiment

A configuration example of a semiconductor device according to a third embodiment of the present technology will be described with reference to FIG. 22. A solid-state imaging device 301 according to the present embodiment is an example of the semiconductor device, and has a different configuration of the semiconductor base 1A in comparison with the first embodiment. Note that the up-down direction in FIG. 22 corresponds to the up-down direction of the solid-state imaging device 301.

As depicted in FIG. 22, the solid-state imaging device 301 includes an image sensor 302 provided as a solid-state imaging element, a ceramic package 306, and glass 303. The solid-state imaging device 301 has a package structure which includes the image sensor 302 mounted within the ceramic package 306, the glass 303 mounted on the ceramic package 306, and a cavity 305 having a closed shape and formed in an inside space of the ceramic package 306.

The image sensor 302 is a chip having a rectangular plate shape, and the upper side of the image sensor 302 is designated as a light reception surface side. For example, the image sensor 302 is a CMOS type image sensor. The glass 303 is a transparent component having a rectangular plate external shape.

The ceramic package 306 is a package substrate including ceramics, and has a flat portion 306a having a rectangular plate shape, and a wall portion 306b formed so as to have a rectangular frame shape extending along an edge portion of the flat portion 306a. The ceramic package 306 is configured to have a flat box shape including the flat portion 306a and the wall portion 306b on all sides and having an opened upper side (see FIG. 25).

The image sensor 302 is mounted on the flat portion 306a of the ceramic package 306. The flat portion 306a of the ceramic package 306 has a front surface 306c on which the image sensor 302 is mounted, and a rear surface 306d as a plate surface opposite to the front surface 306c. The image sensor 302 is die-bonded to the front surface 306c side of the flat portion 306a of the ceramic package 306 with use of insulating or conductive paste 307.

The glass 303 is supported on the wall portion 306b of the ceramic package 306 in a fixed state. The wall portion 306b of the ceramic package 306 has an upper surface 306e extending along a horizontal plane. The glass 303 is fixed to the upper surface 306e by an adhesive 318. The periphery of the cavity 305 is sealed by the adhesive 318.

The image sensor 302 and the ceramic package 306 are electrically connected to each other by a plurality of bonding wires 308. For example, each of the bonding wires 308 electrically connects a pad electrode 309 provided on the upper surface of the image sensor 302 and a lead electrode 310 provided on the front surface 306c of the flat portion 306a of the ceramic package 306.

The lead electrode 310 on the ceramic package 306 is connected to a plurality of electrode terminals 317 provided on the rear surface 306d side of the flat portion 306a via a wiring pattern or the like formed in the ceramic package 306.

According to the solid-state imaging device 301 having the above configuration, a plurality of the columnar terminals 10 including the lead frame 30 is provided as external connection terminals for electric connection with a predetermined mounting substrate on which the solid-state imaging device 301 is mounted.

Each of the columnar terminals 10 is provided in a state protruded from the corresponding one of the electrode terminals 317 provided on the rear surface 306d side of the ceramic package 306. Each of the columnar terminals 10 is electrically connected to the corresponding electrode terminal 317 via a solder portion 319.

As described above, the solid-state imaging device 301 has a semiconductor base 301A which includes the image sensor 302 corresponding to a semiconductor element, and the columnar terminals 10 each including a part of a lead frame. According to the present embodiment, the semiconductor base 301A is a structure which has the image sensor 302 mounted on the flat portion 306a of the ceramic package 306, and the glass 203 provided on the wall portion 306b, and has the plurality of electrode terminals 317 for external connection on the rear surface 306d of the ceramic package 306 as a surface on one side. In addition, the columnar terminals 10 are provided on the semiconductor base 301A in such a manner as to protrude from the respective electrode terminals 317.

7. Manufacturing Method of Semiconductor Device of Third Embodiment

A manufacturing method of the semiconductor device according to the third embodiment of the present technology will be described with reference to FIGS. 23A, 23B, 23C, 23D, 24A, 24B, 24C, 24D, and 25.

The manufacturing method of the solid-state imaging device 301 of the present embodiment has a different mounting mode of the lead frame 30 and the like in comparison with the manufacturing method of the solid-state imaging device 1 of the first embodiment.

Figure 23A:
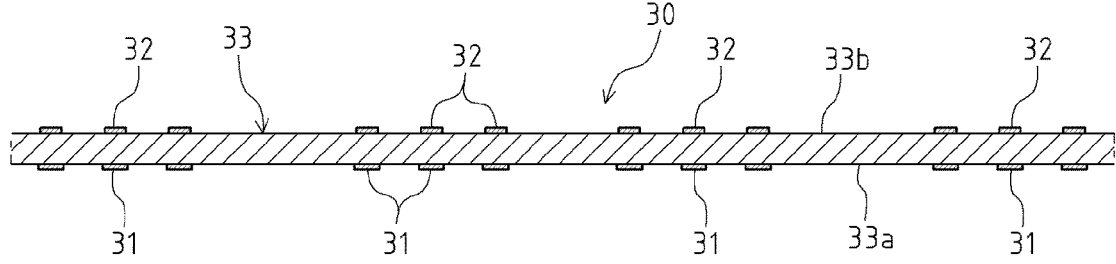

In the manufacturing method of the solid-state imaging device 301, a step of preparing the lead frame 30 is initially performed as depicted in a FIG. 23A.

Figure 23B:
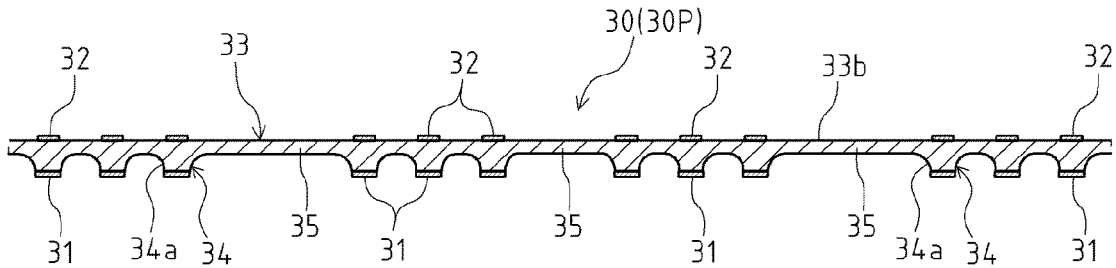

Subsequently, as depicted in a FIG. 23B, one-side half etching is performed for the lead frame 30 from the facing surface 33a side of the frame body portion 33. This step is performed before a step of mounting the lead frame 30 on the ceramic package 306. By this step, the projection portions 34 and the thin plate portion 35 are formed on the lead frame 30 as depicted in the FIG. 23B.

Subsequently, a step of mounting the half-etched lead frame 30 (30P) on the ceramic packages 306 is performed. According to the present embodiment, as depicted in FIG. 25, the lead frame 30 is mounted by placing the ceramic packages 306 in a singulated state on the lead frame 30P in an aggregate state. Specifically, the step of mounting the lead frame 30P on the plurality of ceramic packages 306 is achieved by joining the first plating terminal portions 31 of the lead frame 30P to the electrode terminals 317 corresponding to terminals of the ceramic packages 306. FIG. 25 depicts an image of mounting of the lead frame 30 according to the present embodiment.

Figure 23C:
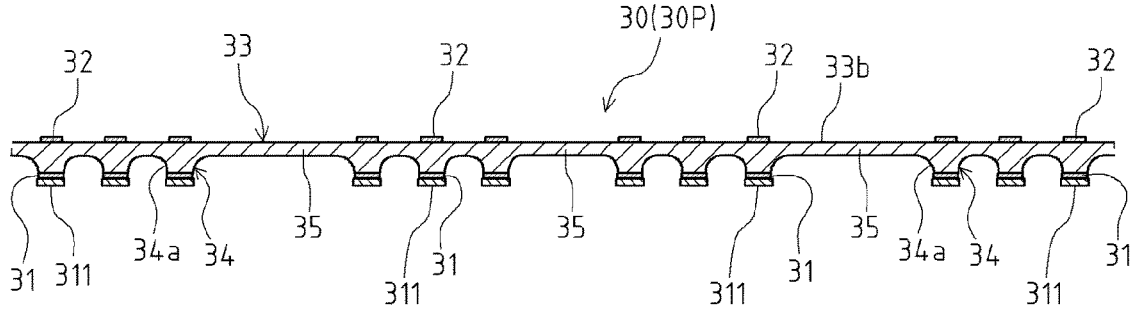

As depicted in a FIG. 23C, for mounting the lead frame 30P, solder paste 311 containing flux is applied to the plating terminal portions 31 of the lead frame 30P by transfer or other methods.

Figure 23D:
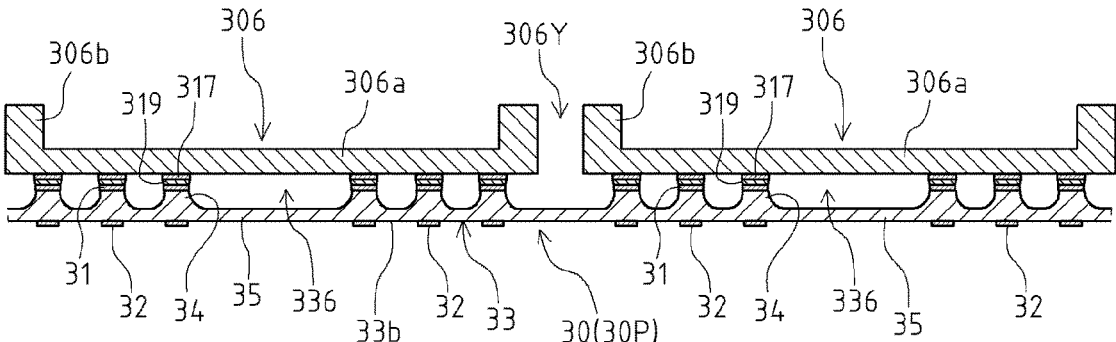

Thereafter, as depicted in a FIG. 23D, the plurality of ceramic packages 306 is placed on the lead frame 30P at predetermined positions where the respective electrode terminals 317 correspond to the first plating terminal portions 31 with use of a chip mounter or the like, and reflow is performed at a predetermined temperature.

By this step, the lead frame 30P is brought into a state where the respective first plating terminal portions 31 are joined to the electrode terminals 317 via the solder portions 319 produced by the solidified solder paste 311. As depicted in the FIG. 23D, space portions 336 are produced between the lead frame 30P and the ceramic packages 306 in a state where the lead frame 30P is mounted on the plurality of ceramic packages 306.

Figure 24A:
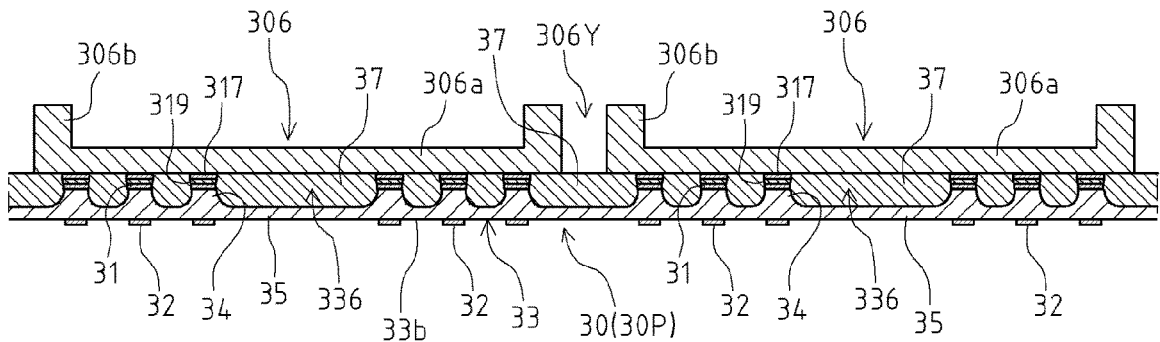

Subsequently performed is a step of filling the space portions 336, which are spaces between the lead frame 30P and the ceramic packages 306, with the resist 37 as depicted in a FIG. 24A. This step of filling with the resist 37 is carried out after the step of mounting the lead frame 30P and before a step of forming the columnar terminals 10.

For example, the resist 37 is ejected from a nozzle of a dispenser and applied through clearances 306Y between the adjoining ceramic packages 306 in such a manner as to fill the space portions 336. According to the present embodiment as described above, the resist 37 is employed as a fluid filling the clearances between the lead frame 30P and the ceramic packages 306.

Figure 24B:
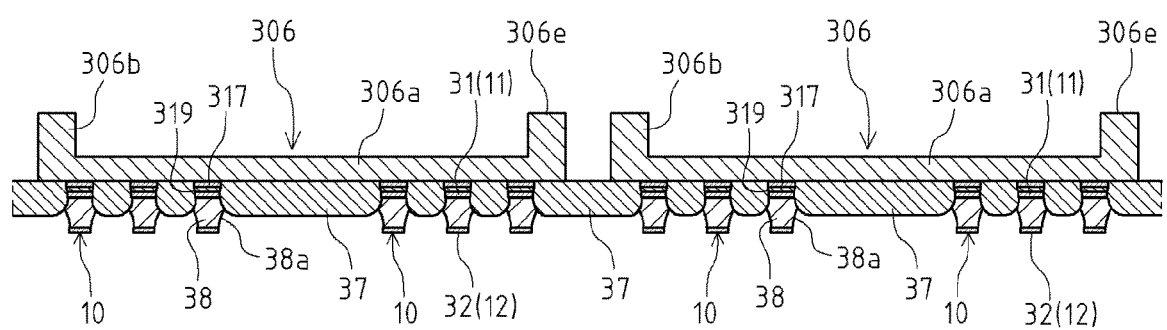

Subsequently, as depicted in a FIG. 24B, etching is performed for the lead frame 30P, where the plurality of ceramic packages 306 are mounted, from the opposite surface 33b side. By this step, the thin plate portion 35 of the lead frame 30P is removed to form the columnar portions 38. Specifically, the columnar portions including the upper and lower plating terminal portions 31 and 32 and the columnar portions 38 constitute the columnar terminals 10 standing on the electrode terminals 317 via the solder portions 319. Moreover, the plurality of ceramic packages 306 in a state connected to each other via the resist 37 is formed.

Figure 24C:
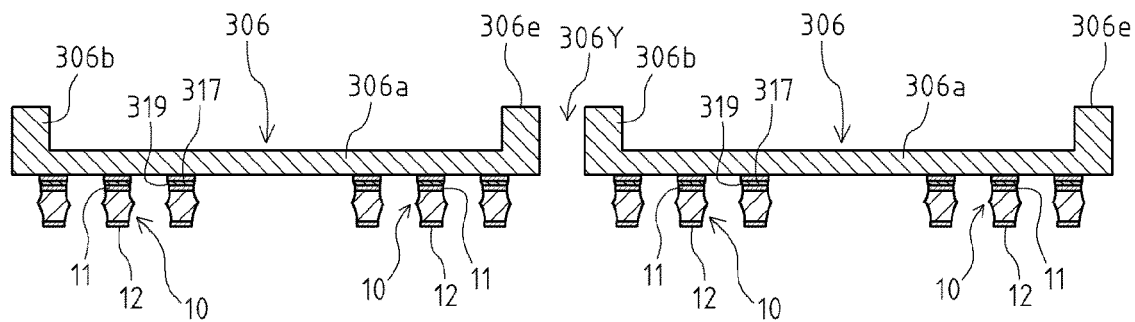

Subsequently, as depicted in a FIG. 24C, a step of removing the resist 37 is performed. In such a manner, the whole of the columnar terminals 10 is brought into an exposed state, and the plurality of ceramic packages 306 connected to each other via the resist 37 is separated.

Figure 24D:
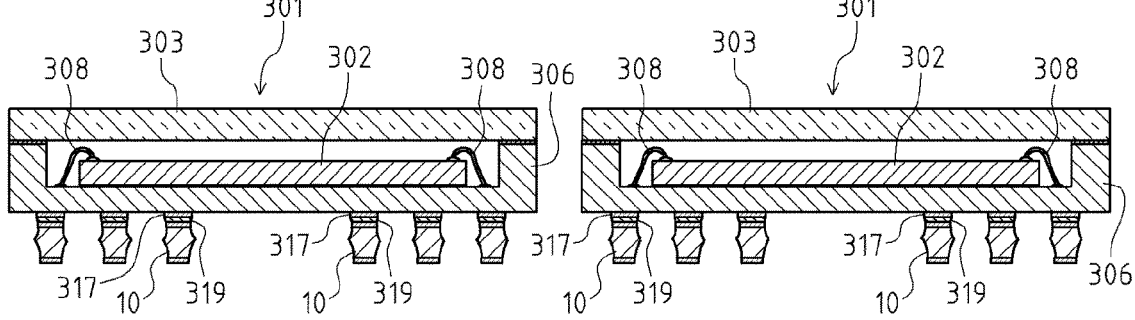

Thereafter, as depicted in a FIG. 24D, the image sensors 302 are die-bonded to the ceramic packages 306, wire bonding connection is made with use of the bonding wires 308, and the glasses 303 are bonded to the ceramic packages 306 to seal the glasses. In such a manner, a plurality of solid-state imaging devices 301 is produced.

According to the solid-state imaging device 301 and the manufacturing method of the solid-state imaging device 301 of the present embodiment, the columnar terminals 10 as external connection terminals can be formed in a short time and at a low cost, and mounting reliability of the solid-state imaging device 301 can be raised as in the first embodiment.

8. Configuration Example of Semiconductor Device of Fourth Embodiment

A configuration example of a semiconductor device according to a fourth embodiment of the present technology will be described with reference to FIG. 26. A semiconductor device 401 according to the present embodiment has a different configuration of the semiconductor base 1A in comparison with the first embodiment. Note that the up-down direction in FIG. 26 corresponds to the up-down direction of the semiconductor device 401.

As depicted in FIG. 26, the semiconductor device 401 includes an IC chip 402 provided as a semiconductor element, a rewiring layer 403, and a sealing resin portion 405. The semiconductor device 401 has a generally-called FOWLP (Fan Out Wafer Level Package) structure where the rewiring layer 403 extends to the outside of an external shape of the IC chip 402.

The IC chip 402 is a semiconductor chip having a rectangular plate shape and a predetermined circuit structure. The rewiring layer 403 is a part having a rectangular plate shape and drawing a wire from a terminal of the IC chip 402, and has wiring including a low-resistance metal material such as copper (Cu). The rewiring layer 403 is formed on a lower surface 402a side of the IC chip 402, and has an extended portion 403a projected from the external shape of the IC chip 402. The extended portion 403a is formed on all sizes so as to surround the IC chip 402 in the plan view.

For example, the sealing resin portion 405 is a thermosetting resin which contains a filler including silicon oxide as a chief ingredient. The sealing resin portion 405 is formed so as to cover the whole of the rewiring layer 403 and the IC chip 402 from above. For example, the sealing resin portion 405 has a predetermined shape including injection molding with use of a molding die or other methods.

A plurality of electrode terminals 417 is provided on a rear surface 403b side of the rewiring layer 403 as a plurality of electrode portions for external connection. The electrode terminals 417 are connected to the terminal of the IC chip 402 via the wiring of the rewiring layer 403.

According to the semiconductor device 401 having the above configuration, a plurality of the columnar terminals 10 including the lead frame 30 is provided as external connection terminals for electric connection with a predetermined mounting substrate on which the semiconductor device 401 is mounted.

Each of the columnar terminals 10 is provided in a state protruded from the corresponding one of the electrode terminals 417 provided on the rear surface 403b side of the rewiring layer 403. Each of the columnar terminals 10 is electrically connected to the corresponding electrode terminal 417 via a solder portion 419.

As described above, the semiconductor device 401 has a semiconductor base 401A which includes the IC chip 402 corresponding to a semiconductor element, and the columnar terminals 10 each including a part of a lead frame. According to the present embodiment, the semiconductor base 401A is a structure which includes the IC chip 402, the rewiring layer 403, and the sealing resin portion 405, and has the plurality of electrode terminals 417 for external connection provided on the rear surface 303b of the rewiring layer 403 corresponding to a surface on one side. In addition, the columnar terminals 10 are provided on the semiconductor base 401A in such a manner as to protrude from the respective electrode terminals 417.

9. Manufacturing Method of Semiconductor Device of Fourth Embodiment

A manufacturing method of the semiconductor device according to the fourth embodiment of the present technology will be described with reference to FIGS. 27A, 27B, 27C, 27D, 28A, 28B, 28C, and 29.

The manufacturing method of the semiconductor device 401 of the present embodiment is a method which mounts the lead frame pieces 30X produced by singulating the lead frame 30 on an FOWLP in a wafer state similarly to the manufacturing method of the solid-state imaging device 1 of the first embodiment (see FIG. 29).

Figure 27A:
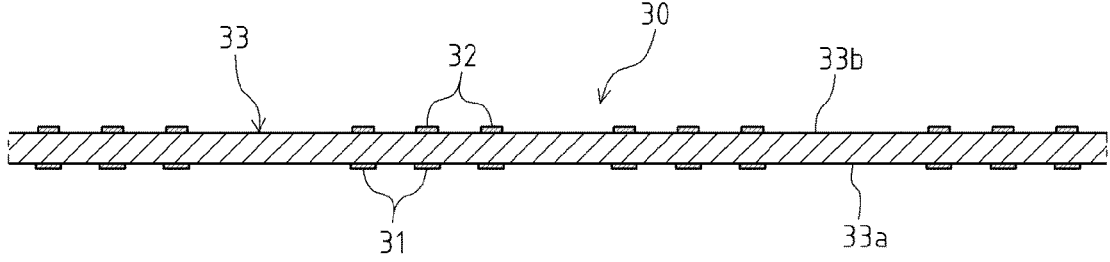

In the manufacturing method of the semiconductor device 401, a step of preparing the lead frame 30 is initially performed as depicted in a FIG. 27A.

Moreover, in the manufacturing method of the semiconductor device 401, a step of preparing a wafer FOWLP 440 which is an FOWLP in a wafer state is performed. The wafer FOWLP 440 is the semiconductor base 401A of the semiconductor devices 401 in an aggregate state, and has a circular-plate external shape as depicted in FIG. 29, for example.

Figure 27B:
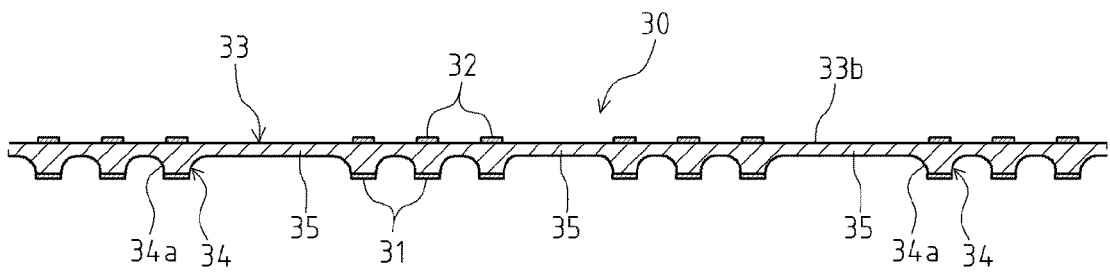
Figure 27C:
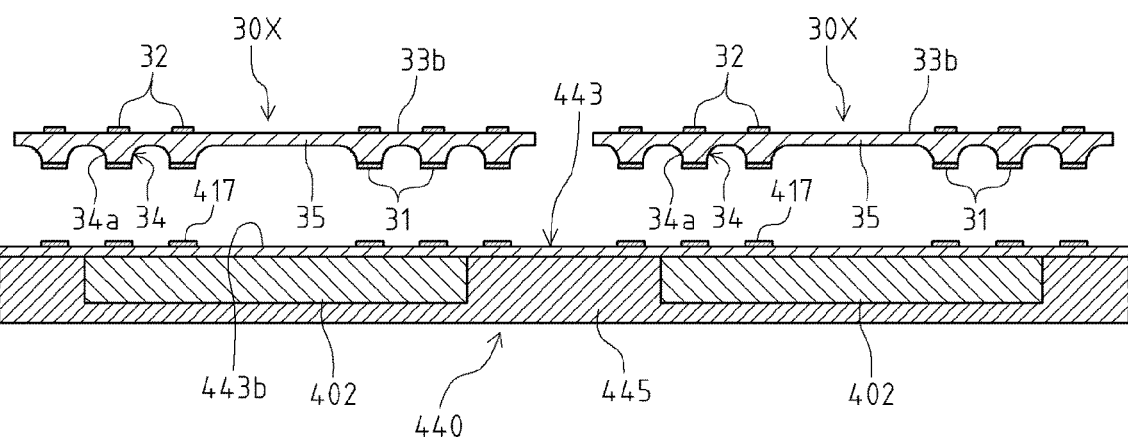

As depicted in FIGS. 27C and 29, the wafer FOWLP 440 is produced by forming a mold resin portion 445 constituting the sealing resin portion 405 in such a shape as to form a disk external shape for the IC chips 402 arranged at predetermined intervals, and forming a rewiring layer portion 443 having a disk shape and constituting the rewiring layer 403 on the lower surface 402a side of the IC chips 402. For example, the mold resin portion 445 has a predetermined shape including injection molding using a molding die or other methods. The plurality of electrode terminals 417 is formed in a predetermined layout on a plate surface 443b on the side opposite to the IC chip 402 side of the rewiring layer portion 443.

According to the present embodiment as described above, the wafer FOWLP 440 which is an integrated plate-shaped body including the plurality of IC chips 402 formed in an aggregate state is adopted as a semiconductor device body on which the lead frame 30 is mounted.

Subsequently, as depicted in a FIG. 27B, one-side half etching is performed for the lead frame 30 from the facing surface 33a side of the frame body portion 33. This step is performed before a step of mounting the lead frame 30 on the wafer FOWLP 440. By this step, the projection portions 34 and the thin plate portion 35 are formed on the lead frame 30 as depicted in the FIG. 27B.

Performed after the step of half-etching is a step of singulating the etched lead frame 30 into a plurality of chips corresponding to the IC chips 402 as depicted in the FIG. 27C. By this step, the lead frame 30 is divided into the plurality of lead frame pieces 30X corresponding to the respective IC chips 402. The lead frame pieces 30X are rectangular-plate-shaped chips each having a size corresponding to the size of the semiconductor device 401 (see FIG. 29).

Subsequently, as depicted in a FIG. 27D, a step of mounting the plurality of lead frame pieces 30X on the wafer FOWLP 440 is performed. Specifically, the step of mounting the lead frame pieces 30X on the wafer FOWLP 440 is achieved by joining the first plating terminal portions 31 of the respective lead frame pieces 30X to the electrode terminals 417 corresponding to terminals of the wafer FOWLP 440.

In this step, the plurality of lead frame pieces 30X is mounted on the wafer FOWLP 440 by reflow solder mounting. In this example, the plurality of lead frame pieces 30X in a singulated state is mounted on the wafer FOWLP 440 in an aggregate state as depicted in FIG. 29. FIG. 29 depicts an image of mounting of the lead frame 30 according to the present embodiment.

By this step, the plurality of lead frame pieces 30X is brought into a state where the respective first plating terminal portions 31 are joined to the electrode terminals 417 via the solder portions 419. As depicted in the FIG. 27D, in the state where the plurality of lead frame pieces 30X is mounted on the wafer FOWLP 440, space portions 436 are produced between the lead frame pieces 30X and the rewiring layer portion 443.

Subsequently performed is a step of filling the space portions 436, which are spaces between the lead frame pieces 30X and the wafer FOWLP 440, with the resist 37 as depicted in a FIG. 28A. This step of filling with the resist 37 is carried out after the step of mounting the lead frame 30 and before a step of forming the columnar terminals 10.

For example, the resist 37 is ejected from a nozzle of a dispenser and applied through the clearances 30Y between the adjoining lead frame pieces 30X (see the FIG. 27D) in such a manner as to fill the space portions 436 which are clearances between the lead frame pieces 30X and the rewiring layer portion 443. According to the present embodiment as described above, the resist 37 is employed as a fluid filling the clearances between the lead frame pieces 30X and the rewiring layer portion 443.

Subsequently, as depicted in a FIG. 28B, etching is performed for the lead frame pieces 30X mounted on the wafer FOWLP 440 from the opposite surface 33b side. By this step, the thin plate portion 35 of the lead frame pieces 30X is removed to form the columnar portions 38. Specifically, the columnar portions including the upper and lower plating terminal portions 31 and 32 and the columnar portions 38 constitute the columnar terminals 10 standing on the electrode terminals 417 via the solder portions 419.

Subsequently, performed after completion of the step of removing the resist 37 is a step of dicing and singulating the wafer FOWLP 440 on which the columnar terminals 10 are formed as depicted in a FIG. 28C. In the step of dicing, the rewiring layer portion 443 on which the columnar terminals 10 are formed, and the mold resin portion 445 are cut and singulated with use of a dicing blade along predetermined dicing lines in a grid shape corresponding to the layout of the IC chips 402. In such a manner, the rewiring layer portion 443 is separated into a plurality of the rewiring layers 403, and the mold resin portion 445 is separated into a plurality of the sealing resin portions 405. As a result, a plurality of the semiconductor device 401 is obtained.

According to the semiconductor device 401 and the manufacturing method of the semiconductor device 401 of the present embodiment, the columnar terminals 10 as external connection terminals can be formed in a short time and at a low cost, and mounting reliability of the semiconductor device 401 can be raised as in the first embodiment.

10. Configuration Example of Semiconductor Device of Fifth Embodiment

A configuration example of a semiconductor device according to a fifth embodiment of the present technology will be described with reference to FIG. 30. As depicted in FIG. 30, a solid-state imaging device 501 according to the present embodiment has a sealing resin portion 505 on the rear surface 2b side of the image sensor 2 in addition to the configuration of the solid-state imaging device 1 of the first embodiment (see FIG. 1).

The sealing resin portion 505 is provided on the rear surface 2b side of the image sensor 2 to constitute a layered portion formed such that the electrode terminals 7, the solder portions 9, and the upper half portions of the columnar terminals 10 are embedded in this layered portion. The lower half portion of each of the columnar terminals 10 protrudes downward from a lower surface 505a of the sealing resin portion 505.

Specifically, a portion included in each of the columnar terminals 10 and located on the upper side (proximal end side) with respect to the proximal end side portion 14 of the terminal body portion 13 is embedded in the sealing resin portion 505, while a portion included in each of the columnar terminals 10 and located on the lower side (distal end side) with respect to the distal end side portion 15 protrudes from the sealing resin portion 505. The sealing resin portion 505 contains curved surface portions 505b included in contact surfaces in contact with the columnar terminals 10, and extending along the upper outer circumferential surfaces 14a.

For example, the sealing resin portion 505 includes a thermosetting liquid resin or the like such as an epoxy-based resin. For example, the sealing resin portion 505 has a predetermined shape including application with use of a dispenser, injection molding with use of a molding die and a mold releasing film, or other methods.

The sealing resin portion 505 includes filling a sealing resin instead of the resist 37 for filling the spaces between the lead frame pieces 30X and the silicon wafer 42, and leaving the sealing resin without removal before the step of opposite surface etching of the lead frame 30 in the manufacturing method of the solid-state imaging device 1 described above.

11. Manufacturing Method of Semiconductor Device of Fifth Embodiment

A manufacturing method of the semiconductor device according to the fifth embodiment of the present technology will be described with reference to FIGS. 4A, 4B, 4C, 4D, 31A, 31B, 31C, and 31D.

In the manufacturing method of the solid-state imaging device 501, a step of preparing the lead frame 30 is initially performed as in the first embodiment (see the FIG. 4A). Moreover, a step of preparing the wafer CSP 40 is performed (see the FIGS. 4C and 6). Subsequently, one-side half etching is performed for the lead frame 30 (see the FIG. 4B). Thereafter, a step of singulating the etched lead frame 30 into a plurality of the lead frame pieces 30X is performed (see the FIG. 4C). Thereafter, a step of mounting the plurality of lead frame pieces 30X on the wafer CSP 40 is performed (see the FIG. 4D). By this step, the space portions 36 are produced between the lead frame pieces 30X and the silicon wafer 42.

Figure 31A:
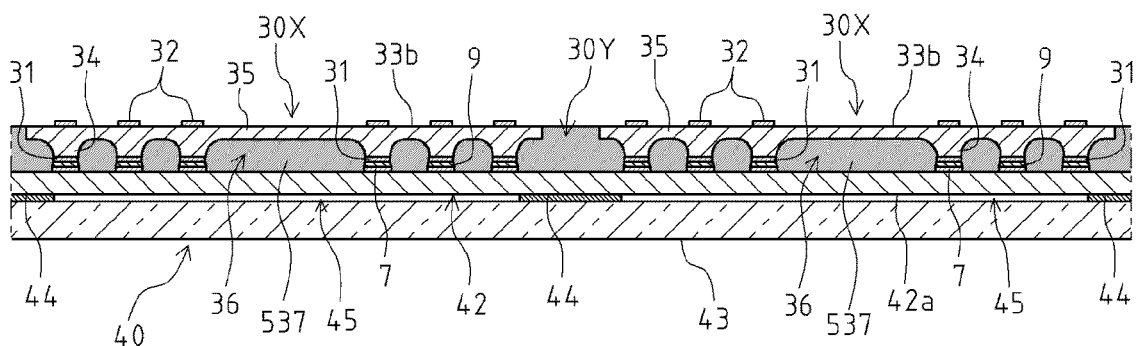

Subsequently performed is a step of filling the space portions 36, which are spaces between the lead frame pieces 30X and the wafer CSP 40, with a sealing resin 537 as depicted in a FIG. 31A.

For example, the sealing resin 537 is ejected from a nozzle of a dispenser and applied through clearances 30Y between the adjoining lead frame pieces 30X (see the FIG. 4D) in such a manner as to fill the space portions 36 which are clearances between the lead frame pieces 30X and the silicon wafer 42. Alternatively, the sealing resin 537 may fill the inside of the space portions 36 by injection molding using a molding die and a mold releasing film. According to the present embodiment as described above, the sealing resin 537 is employed as a fluid filling the clearances between the lead frame pieces 30X and the silicon wafer 42.

The sealing resin 537 filling the inside of the space portions 36 is solidified at a predetermined timing. In a case where the sealing resin 537 is a thermosetting resin, a step of heating the sealing resin 537 at a predetermined temperature to harden the sealing resin 537 is performed after the step of filling the space portions 36 with the sealing resin 537. The sealing resin 537 having fluidity and thus hardened becomes a sealing resin 537A in a hardened state.

Subsequently, as depicted in a FIG. 31B, etching is performed for the lead frame pieces 30X mounted on the wafer CPS 40 from the opposite surface 33b side.

Figure 31B:
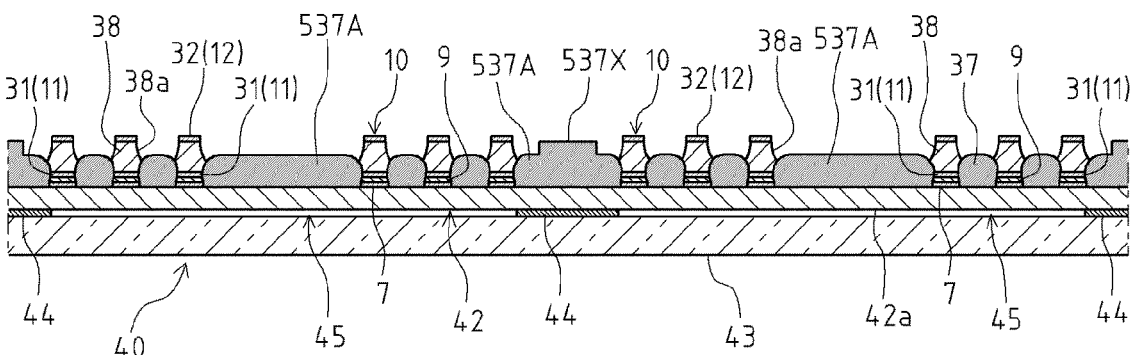
Figure 31C:
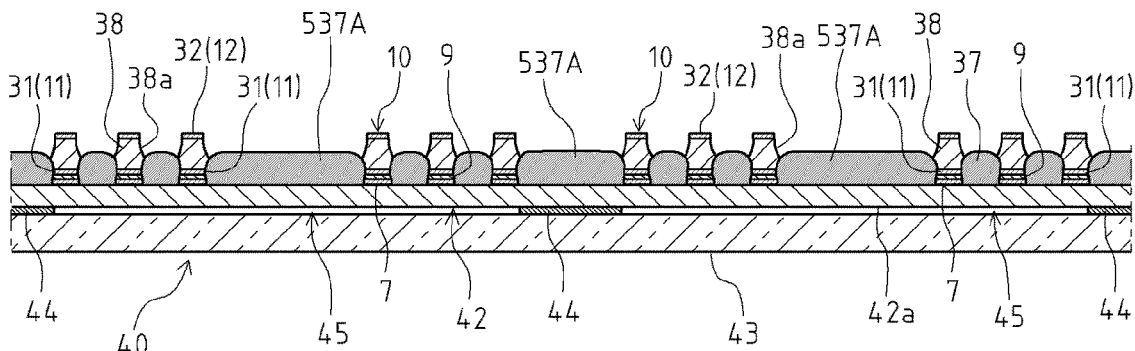

As depicted in the FIG. 31B, projection portions 537X corresponding to pulled portions are present at portions of the sealing resin 537A between the adjoining lead frame pieces 30X in a state where the frame body portion 33 of each of the lead frame pieces 30X is partially removed by etching. The projection portions 537X are portions including the sealing resin 537 filling the clearances 30Y between the adjoining lead frame pieces 30X and form a grid shape in correspondence with the layout of the lead frame pieces 30X.

A step of removing the projection portions 537X is performed for the projection portions 537X having appeared on the surface of the sealing resin 537A in such a manner. For example, the projection portions 537X are removed by cutting with use of a predetermined dicing blade or the like corresponding to the width of the projection portions 537X. However, the method for removing the projection portions 537X is not particularly limited. By removing the projection portions 537X, the surface of the sealing resin 537A is converted into a flat surface as depicted in a FIG. 31C.

Figure 31D:
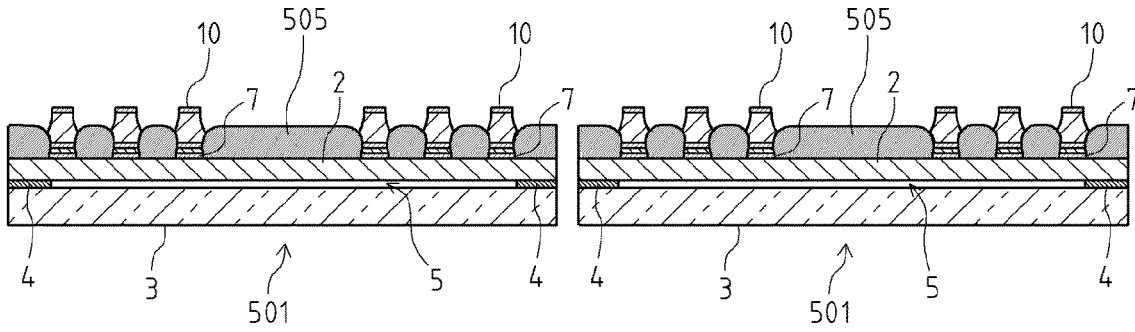

Thereafter, performed as depicted in a FIG. 31D is a step of dicing and singulating the wafer CPS 40 in a state where the columnar terminals 10 are formed on the wafer CPS 40. By this step, the sealing resin 537A in a hardened state is separated together with the silicon wafer 42, the glass plate, 43, and the wall portion 44 to constitute the sealing resin portion 505. In such a manner, a plurality of the solid-state imaging devices 501 each including the sealing resin portion 505 are produced.

According to the solid-state imaging device 501 and the manufacturing method of the solid-state imaging device 501 of the present embodiment, the columnar terminals 10 as external connection terminals can be formed in a short time and at a low cost, and mounting reliability of the solid-state imaging device 501 can be raised as in the first embodiment. Moreover, the rear surface 2b side of the image sensor 2, and the root side portion of each of the columnar terminals 10 can be covered with the sealing resin portion 505. In such a manner, the connection portion of each of the columnar terminals 10 connecting with the corresponding electrode terminal 7, and the root side portion of each of the columnar terminals 10 can be protected and reinforced. Accordingly, improvement of temperature cycle resistance, and improvement of substrate mounting reliability are achievable.

12. Modifications of Semiconductor Device of Fifth Embodiment

In the steps for manufacturing the respective configurations in modifications 1 to 5 of the solid-state imaging device 1 according to the first embodiment, the sealing resin 537 may be used instead of the resist 37 and left without removal to form the sealing resin portion 505 on the rear surface 2b side of the image sensor 2. The configurations of the respective modifications will be hereinafter described.
(Modification 1)

As depicted in FIGS. 32A and 32B, in the configuration where the heat dissipation pad 50 including the lead frame 30 is provided on the rear surface 2b side of the image sensor 2 in modification 1, the sealing resin portion 505 is formed on the rear surface 2b side of the image sensor 2. The sealing resin portion 505 covers the upper half portions of the columnar terminals 10 and the upper half portion of the heat dissipation pad 50.

The sealing resin portion 505 is provided on the rear surface 2b side of the image sensor 2 to constitute a layered portion formed such that the pad connection portion 57, the solder portion 59, and the upper half portion of the heat dissipation pad 50 are embedded in this layered portion. The lower half portion of the heat dissipation pad 50 protrudes downward from the lower surface 505a of the sealing resin portion 505.

Specifically, an upper portion included in the heat dissipation pad 50 and located on the upper side with respect to the portion where the upper outer circumferential surface 53a of the intermediate layer portion 53 is formed is embedded in the sealing resin portion 505, while a portion included in the heat dissipation pad 50 and located on the lower side with respect to the portion where the lower outer circumferential surface 53*b* of the intermediate layer portion 53 is formed protrudes from the sealing resin portion 505. The sealing resin portion 505 contains a curved surface portion 505*c* included in a contact surface in contact with the heat dissipation pad 50, and extending along the upper outer circumferential surface 53*a* of the intermediate layer portion 53.

According to the configuration of modification 1, the upper part of the heat dissipation pad 50 can be covered with the sealing resin portion 505. Accordingly, the heat dissipation pad 50 can be protected and reinforced.

(Modification 2)

As depicted in FIGS. 33A and 33B, in the configuration where the reinforcing portion 70 having a frame shape and including the lead frame 30 is provided on the rear surface 2*b* side of the image sensor 2 in modification 2, the sealing resin portion 505 is formed on the rear surface 2*b* side of the image sensor 2. The sealing resin portion 505 covers the upper half portions of the columnar terminals 10 and the inner portion of the reinforcing portion 70.

The sealing resin portion 505 is provided on the rear surface 2*b* side of the image sensor 2 to constitute a layered portion formed such that the lower half portions of the columnar terminals 10 protrude from this layered portion, and that the whole region inside the reinforcing portion 70 having a frame shape is embedded in this layered portion.

Specifically, the sealing resin portion 505 is formed such that the lower surface 505*a* is located substantially at the same height as that of the lower surface 73*c* of the reinforcing portion 70, and becomes flush with the reinforcing portion 70. The sealing resin portion 505 contains a curved surface portion 505*d* included in a contact surface in contact with the reinforcing portion 70, and extending along the inner circumferential surface 73*a* of the second layer portion 73.

According to the configuration of modification 2, the inner part of the reinforcing portion 70 can be covered with the sealing resin portion 505. Accordingly, the reinforcing portion 70 can be protected and reinforced. In such a manner, a package rigidity improvement effect can be effectively produced by the reinforcing portion 70.

(Modification 3)

As depicted in FIGS. 34A and 34B in the configuration where the GND plain 90 having a frame shape and the GND terminals 100, both including the lead frame 30, are provided on the rear surface 2*b* side of the image sensor 2 in modification 3, the sealing resin portion 505 is formed on the rear surface 2*b* side of the image sensor 2. The sealing resin portion 505 covers the upper half portions of the columnar terminals 10, the inner portion of the GND plain 90, and the upper half portions of the GND terminals 100.

The sealing resin portion 505 is provided on the rear surface 2*b* side of the image sensor 2 to constitute a layered portion formed such that the lower half portions of the columnar terminals 10 and the GND terminals 100 protrude from this layered portion and that the whole region inside the GND plain 90 having a frame shape is embedded in this layered portion. The sealing resin portion 505 is provided such that the GND terminal connection portions 107, the solder portions 109, and the upper half portions of the GND terminals 100 are embedded in the sealing resin portion 505.

Specifically, the sealing resin portion 505 is formed such that the lower surface 505*a* is located substantially at the same height as that of the lower surface 93*c* of the GND plain 90 and becomes flush with the GND plain 90. The sealing resin portion 505 contains a curved surface portion 505*e* included in a contact surface in contact with the GND plain 90, and extending along the inner circumferential surface 93*a* of the second layer portion 93.

Moreover, an upper portion included in each of the GND terminals 100 and located on the upper side with respect to the portion where the upper side surface 103*a* of the third layer portion 103 is formed is embedded in the sealing resin portion 505, while a portion included in each of the GND terminals 100 and located on the lower side with respect to the portion where the lower outer circumferential surface 103*b* of the third layer portion 103 is formed protrudes from the sealing resin portion 505. The sealing resin portion 505 contains curved surface portions 505*f* included in contact surfaces in contact with the GND terminals 100, and extending along the upper side surfaces 103*a* of the third layer portions 103.

According to the configuration of modification 3, the inner part of the GND plain 90 and the upper portions of the GND terminals 100 can be covered with the sealing resin portion 505. Accordingly, the GND plain 90 and the GND terminals 100 can be protected and reinforced.

(Modification 4)

As depicted in FIGS. 35A and 35B, in the configuration where the shield portion 120 including the lead frame 30 and covering the built-in chip 125 is provided on the rear surface 2*b* side of the image sensor 2 in modification 4, the sealing resin portion 505 is formed on the rear surface 2*b* side of the image sensor 2. The sealing resin portion 505 covers the upper half portions of the columnar terminals 10 and the upper half portion of the shield portion 120.

The sealing resin portion 505 is provided on the rear surface 2*b* side of the image sensor 2 to constitute a layered portion formed such that the pad connection portion 127, the solder portion 129, and the upper half portion of the shield portion 120 are covered with this layered portion from the outer circumferential side of the shield portion 120. The lower half portion of the shield portion 120 protrudes downward from the lower surface 505*a* of the sealing resin portion 505.

Specifically, an upper portion included in the shield portion 120 and located on the upper side with respect to the portion where the upper outer circumferential surface 123*a* of the intermediate layer portion 123 is formed is embedded in the sealing resin portion 505, while a portion included in the shield portion 120 and located on the lower side with respect to the portion where the lower outer circumferential surface 123*b* of the intermediate layer portion 123 is formed protrudes from the sealing resin portion 505. The sealing resin portion 505 contains a curved surface portion 505*g* included in a contact surface in contact with the shield portion 120, and extending along the upper outer circumferential surface 123*a* of the intermediate layer portion 123.

According to the configuration of modification 4, the upper part of the shield portion 120 can be covered with the sealing resin portion 505 from the outside. Accordingly, the shield portion 120 can be protected and reinforced.

Modification 5)

As depicted in FIGS. 36A and 36B, in the configuration where each of the columnar terminals 10A having an elliptic root portion is radially disposed from the center point O1 in modification 5, the sealing resin portion 505 is formed on the rear surface 2*b* side of the image sensor 2. The sealing resin portion 505 covers the upper half portions of the columnar terminals 10A.

The sealing resin portion 505 is provided on the rear surface 2*b* side of the image sensor 2 to constitute a layered portion formed such that the electrode terminals 7, the solder portions 9, and the upper half portions of the columnar terminals 10A are embedded in this layered portion. The lower half of each of the columnar terminals 10A protrudes downward from the lower surface 505a of the sealing resin portion 505.

Specifically, a portion included in each of the columnar terminals 10A and located on the upper side with respect to the proximal end side portion 14 of the terminal body portion 13 is embedded in the sealing resin portion 505, while a portion included in each of the columnar terminals 10A and located on the lower side with respect to the distal end side portion 15 protrudes from the sealing resin portion 505. The sealing resin portion 505 contains curved surface portions 505h included in contact surfaces in contact with the columnar terminal 10A, and extending along the upper outer circumferential surfaces 14a.

According to the configuration of modification 5, the rear surface 2b side of the image sensor 2, and the root side portion of each of the columnar terminals 10A can be covered with the sealing resin portion 505. In such a manner, the connection portions of the columnar terminals 10A connecting with the corresponding electrode terminals 7, and the root side portions of the columnar terminals 10 can be protected and reinforced. These operations and effects can effectively improve a mechanical strength of the package structure in combination with the thicker shape of the root side of the columnar terminals 10A and the radial arrangement of the plurality of columnar terminals 10A, and also effectively improve temperature cycle resistance and substrate mounting reliability.

As described above in the respective modifications, according to the solid-state imaging device 501 and the manufacturing method of the solid-state imaging device 501 of the present embodiment, the sealing resin portion 505 can be formed on the rear surface 2b side of the image sensor 2 according to the various types of function units including the lead frame 30 and the shape of the columnar terminals 10.

13. Configuration Example of Semiconductor Device of Sixth Embodiment

A configuration example of a semiconductor device according to a sixth embodiment of the present technology will be described with reference to FIG. 37. As depicted in FIG. 37, a solid-state imaging device 601 according to the present embodiment has a sealing resin portion 605 on the rear surface 206b side of the organic substrate 206 in addition to the configuration of the solid-state imaging device 201 of the second embodiment (see FIG. 18). The sealing resin portion 605 is a portion including a material and a manufacturing method similar to those of the sealing resin portion 505 according to the fifth embodiment.

The sealing resin portion 605 is provided on the rear surface 206b side of the organic substrate 206 to constitute a layered portion formed such that the electrode terminals 217, the solder portions 219, and the upper half portions of the columnar terminals 10 are embedded in this layered portion. The lower half portion of each of the columnar terminals 10 protrudes downward from a lower surface 605a of the sealing resin portion 605.

Specifically, a portion included in each of the columnar terminals 10 and located on the upper side with respect to the proximal end side portion 14 of the terminal body portion 13 is embedded in the sealing resin portion 605, while a portion included in each of the columnar terminals 10 and located on the lower side with respect to the distal end side portion 15 protrudes from the sealing resin portion 605. The sealing resin portion 605 contains curved surface portions 605b included in contact surfaces in contact with the columnar terminals 10, and extending along the upper outer circumferential surfaces 14a.

The sealing resin portion 605 includes filling a sealing resin instead of the resist 37 for filling the spaces between the lead frame pieces 30X and the organic substrate body 246, and leaving the sealing resin without removal before the step of opposite surface etching of the lead frame 30 in the manufacturing method of the solid-state imaging device 201 described above.

14. Manufacturing Method of Semiconductor Device of Sixth Embodiment

A manufacturing method of the semiconductor device according to the sixth embodiment of the present technology will be described with reference to FIGS. 19A, 19B, 19C, 38A, 38B, and 38C.

In the manufacturing method of the solid-state imaging device 601, a step of preparing the lead frame 30 is initially performed as in the second embodiment (see the FIG. 19A). Moreover, a step of preparing the organic substrate package 240 is performed (see the FIGS. 19B and 21). Subsequently, one-side half etching is performed for the lead frame 30 (see the FIG. 19B). Subsequently, a step of mounting the etched lead frame 30 (30P) on the organic substrate package 240 is performed (see the FIG. 19C). By this step, the space portions 236 are produced between the lead frame 30P and the organic substrate body 246.

Subsequently performed is a step of filling the space portions 236, which are spaces between the lead frame 30P and the organic substrate body 246, with the sealing resin 537 as depicted in a FIG. 38A.

For example, the sealing resin 537 is ejected from a nozzle of a dispenser and applied through clearances between the lead frame 30P and the organic substrate body 246 in the outer peripheral portion of the organic substrate package 240 in such a manner as to fill the space portions 236. In this step, an opening through which the sealing resin 537 is supplied into the space portions 236 may be formed at a predetermined portion of the lead frame 30P. For example, the opening is formed as a through hole portion having a slit shape and provided in the thin plate portion 35 or the like of the lead frame 30P to allow the space portions 236 to communicate with an external space. The sealing resin 537 is supplied through the opening of the lead frame 30P and fills the inside of the space portions 236. The opening thus formed in the lead frame 30P allows easy and efficient application of the sealing resin 537. Alternatively, the sealing resin 537 may fill the inside of the space portions 236 by injection molding with use of a molding die and a mold releasing film. In this case, a slit-shaped opening may be similarly formed in the lead frame 30P.

According to the present embodiment as described above, the sealing resin 537 is employed as a fluid filling the clearances between the lead frame 30P and the organic substrate body 246.

The sealing resin 537 filling the inside of the space portions 236 is solidified at a predetermined timing. In a case where the sealing resin 537 is a thermosetting resin, a step of heating the sealing resin 537 at a predetermined temperature to harden the sealing resin 537 is performed after the step of filling the space portions 236 with the sealing resin 537. The sealing resin 537 having fluidity and thus hardened becomes a sealing resin 537A in a hardened state.

Subsequently, as depicted in a FIG. 38B, etching is performed for the lead frame 30P mounted on the organic substrate package 240 from the opposite surface 33b side.

Thereafter, performed as depicted in a FIG. 38C is a step of dicing and singulating the organic substrate package 240 in a state where the columnar terminals 10 are formed on the organic substrate package 240. By this step, the sealing resin 537A in a hardened state is separated together with the organic substrate body 246 and the mold resin portion 243 to constitute the sealing resin portion 605. In such a manner, a plurality of the solid-state imaging devices 601 each including the sealing resin portion 605 is produced.

According to the solid-state imaging device 601 and the manufacturing method of the solid-state imaging device 601 of the present embodiment, the connection portions of the columnar terminals 10 in contact with the electrode terminals 7 and the root side portions of the columnar terminals 10 can be protected and reinforced with use of the sealing resin portion 605, and improvement of temperature cycle resistance and substrate mounting reliability are thus achievable as in the fifth embodiment.

15. Configuration Example of Semiconductor Device of Seventh Embodiment

A configuration example of a semiconductor device according to a seventh embodiment of the present technology will be described with reference to FIG. 39. As depicted in FIG. 39, a solid-state imaging device 701 according to the present embodiment has a ceramic substrate 706 having a rectangular plate shape instead of the ceramic package 306 in comparison with the configuration of the solid-state imaging device 301 of the third embodiment (see FIG. 22). In addition, a sealing resin portion 705 is provided from the rear surface side of the ceramic substrate 706 to an upper part of a peripheral portion of the ceramic substrate 706. The sealing resin portion 705 is a portion including a material and a manufacturing method similar to those of the sealing resin portion 505 according to the fifth embodiment.

The ceramic substrate 706 is a substrate including ceramics, and having a form produced by eliminating the wall portion 306b of the ceramic package 306 having a box shape in the third embodiment. The ceramic substrate 706 has a front surface 706a corresponding to an upper plate surface, a rear surface 706b corresponding to a lower plate surface, and a side surface 706c on all sides. A plurality of the electrode terminals 317 is provided on a rear surface 706b side of the ceramic substrate 706.

The solid-state imaging device 701 supports the glass 303 above the ceramic substrate 706 with use of a part of the sealing resin portion 705. Specifically, the solid-state imaging device 701 has a wall-shaped part disposed on the upper side of a peripheral portion of the ceramic substrate 706 and including a part of the sealing resin portion 705 to constitute a portion for supporting the glass 303 instead of the wall portion 306b of the ceramic package 306.

The sealing resin portion 705 has a lower layer portion 705p provided on the rear surface 706b side of the ceramic substrate 706, an enclosure portion 705q provided on the side surface 706c side of the ceramic substrate 706, and a wall portion 705r provided above the front surface 706a of the ceramic substrate 706. The lower layer portion 705p, the enclosure portion 705q, and the wall portion 705r described above constitute an integrated and continuous portion forming the sealing resin portion 705.

The lower layer portion 705p is provided on the rear surface 706b side of the ceramic substrate 706 to constitute a layered portion formed such that the electrode terminals 317, the solder portions 319, and the upper half portions of the columnar terminals 10 are embedded in this layered portion. The lower half of each of the columnar terminals 10 protrudes downward from a lower surface 705a included in the lower layer portion 705p and constituting a lower surface of the ceramic substrate 706.

Specifically, a portion included in each of the columnar terminals 10 and located on the upper side with respect to the proximal end side portion 14 of the terminal body portion 13 is embedded in the lower layer portion 705p, while a portion included in each of the columnar terminals 10 and located on the lower side with respect to the distal end side portion 15 protrudes from the lower layer portion 705p. The lower layer portion 705p contains curved surface portions 705b included in contact surfaces in contact with the columnar terminals 10, and extending along the upper outer circumferential surfaces 14a.

The enclosure portion 705q is disposed on the outside (side surface 706c side) of the lower layer portion 705p and the ceramic substrate 706, and formed so as to cover the entire circumference of the ceramic substrate 706 having a rectangular plate shape. The lower layer portion 705p is formed along the side surface 705c of the ceramic substrate 706 provided on all sides and encloses the outside of the ceramic substrate 706.

The wall portion 705r is formed on all sides to form a rectangular frame shape along the edge of the ceramic substrate 706. The wall portion 705r is provided so as to form, jointly with the ceramic substrate 706, a flat box shape having an upper open side. The wall portion 706r is a portion supporting the glass 303 above the image sensor 302.

The glass 303 is supported on the wall portion 705r of the ceramic substrate 706 in a fixed state. The wall portion 705r has an upper surface 705d extending along the horizontal plane. The glass 303 is fixed to the upper surface 705d by the adhesive 318. The periphery of the cavity 305 is sealed by the sealing resin portion 705 and the adhesive 318.

As described above, the sealing resin portion 705 covers the whole of the lower part and the side part of the ceramic substrate 706, and protrudes in a frame shape to the upper side of a peripheral edge of the ceramic substrate 706. In addition, the sealing resin portion 705 constitutes a support portion for supporting the glass 303 with use of the protruding portion having the frame shape and protruding upward from the front surface 706a of the ceramic substrate 706.

The sealing resin portion 705 includes filling a sealing resin instead of the resist 37 for filling the space between the lead frame 30 and the ceramic package 306, and leaving the sealing resin in a predetermined shape without removal of the sealing resin before the step of opposite surface etching of the lead frame 30 in the manufacturing method of the solid-state imaging device 301 described above.

16. MANUFACTURING METHOD OF SEMICONDUCTOR DEVICE OF SEVENTH Embodiment

A manufacturing method of the semiconductor device according to the seventh embodiment of the present technology will be described with reference to FIGS. 40A, 40B, 40C, 40D, 41A, 41B, 41C, and 41D.

Figure 40A:
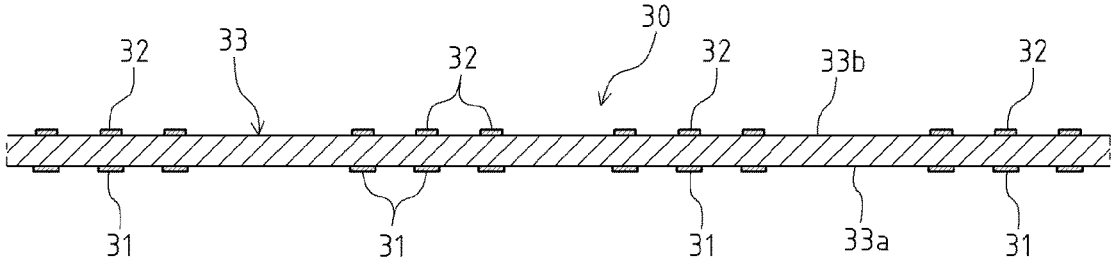
Figure 40B:
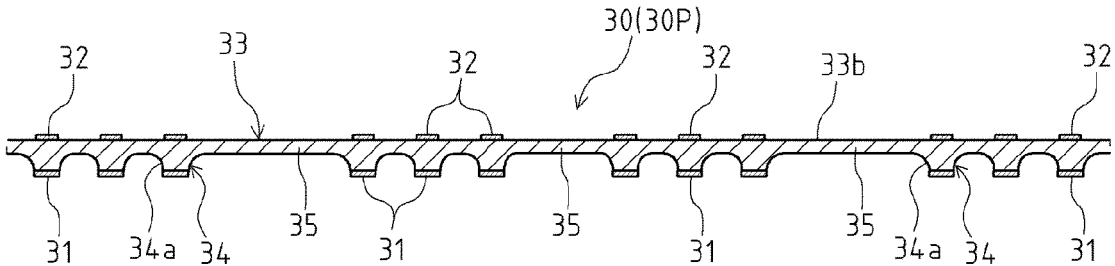

In the manufacturing method of the solid-state imaging device 701, a step of preparing the lead frame 30 is initially performed as depicted in a FIG. 40A as in the third embodiment. Subsequently, as depicted in a FIG. 40B, one-side half etching is performed for the lead frame 30.

Subsequently, a step of mounting the etched lead frame 30 (30P) on the ceramic substrates 706 is performed. The lead frame 30 is herein mounted by placing the ceramic substrates 706 in a singulated state on the lead frame 30P in an aggregate state in a manner similar to the manner depicted in FIG. 25.

Figure 40C:
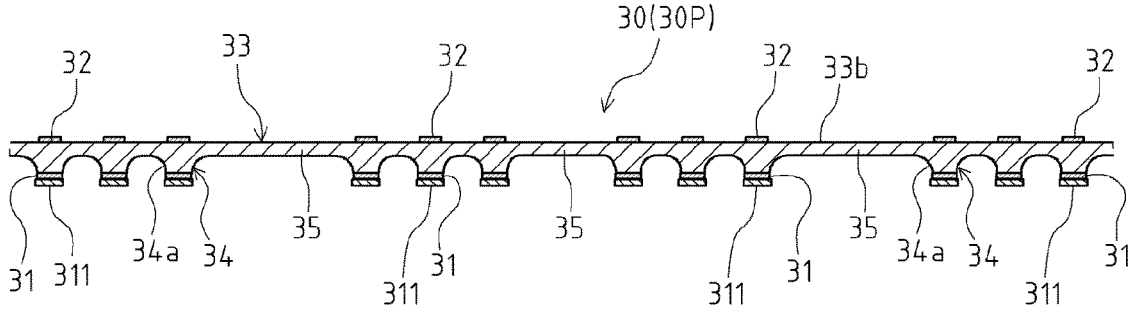
Figure 40D:
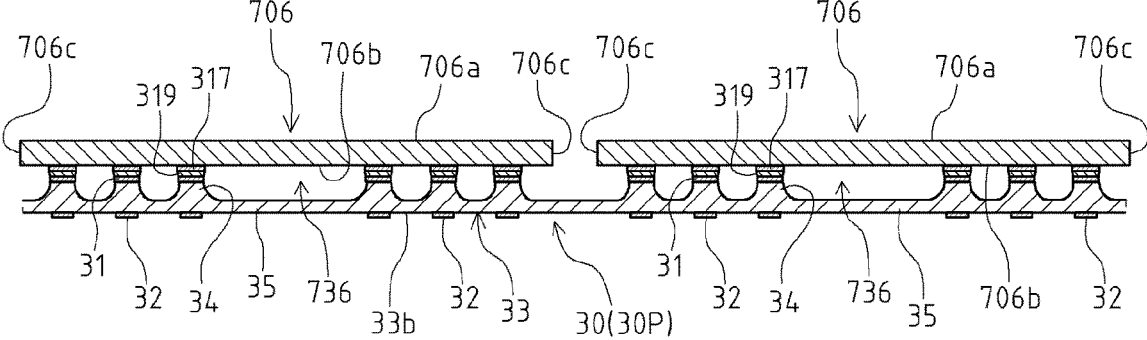

As depicted in a FIG. 40C, for mounting the lead frame 30P, the solder paste 311 is applied to the plating terminal portions 31 of the lead frame 30P. Thereafter, as depicted in a FIG. 40D, a plurality of the ceramic substrates 706 is mounted on the lead frame 30P by reflow. By this step, space portions 736 are produced between the lead frame 30P and the ceramic substrates 706.

Figure 41A:
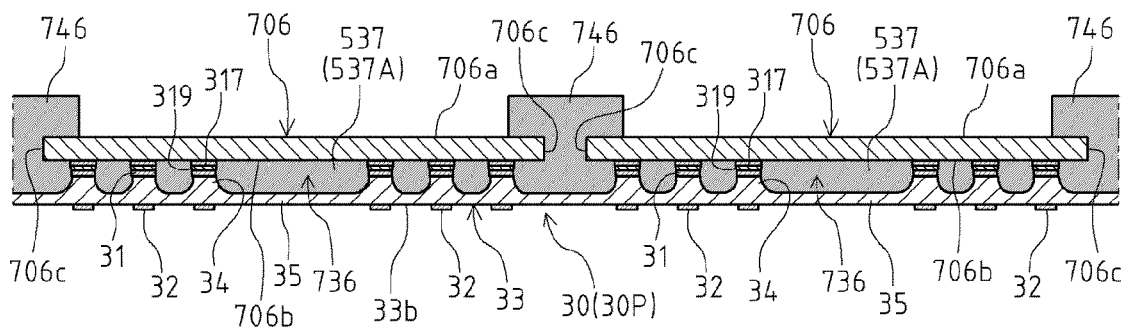

Subsequently performed is a step of filling the space portions 736, which are spaces between the lead frame 30P and the ceramic substrates 706, with the sealing resin 537 as depicted in a FIG. 41A, and forming a resin wall portion 746 which is a portion constituting the enclosure portion 705q and the wall portion 705r of the sealing resin portion 705. The resin wall portion 746 is formed to constitute a grid-shaped portion having a predetermined width in the plan view in correspondence with a rectangular region of the ceramic substrate 706.

Filling of the sealing resin 537 into the space portions 736 and formation of the resin wall portion 746 are achieved by injection molding with use of a molding die and a mold releasing film. According to the present embodiment as described above, the sealing resin 537 is employed as a fluid filling the clearances between the lead frame 30P and the ceramic substrates 706.

The sealing resin 537 filling the inside of the space portions 736 and constituting the resin wall portion 746 is solidified at a predetermined timing after the step of injection into the molding die. The sealing resin 537 thus hardened becomes a sealing resin 537A in a hardened state. The sealing resin 537A includes the portion filling the inside of the space portions 736, and the resin wall portion 746.

Figure 41B:
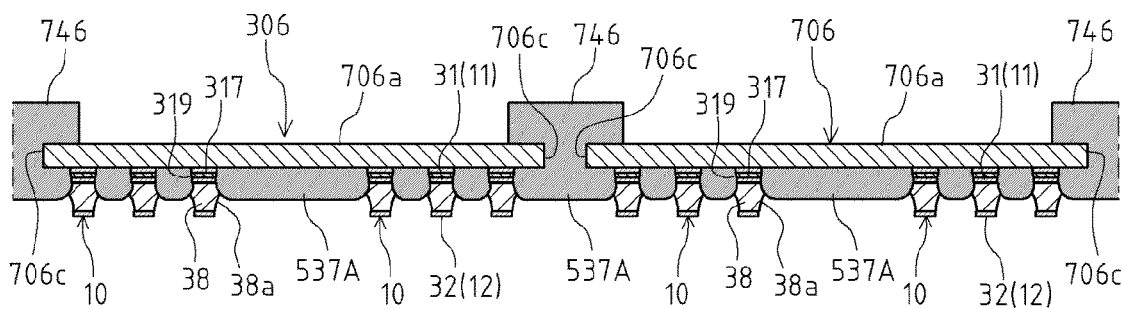

Subsequently, as depicted in a FIG. 41B, etching is performed for the lead frame 30P where the plurality of ceramic packages 306 is placed from the opposite surface 33b side.

Figure 41C:
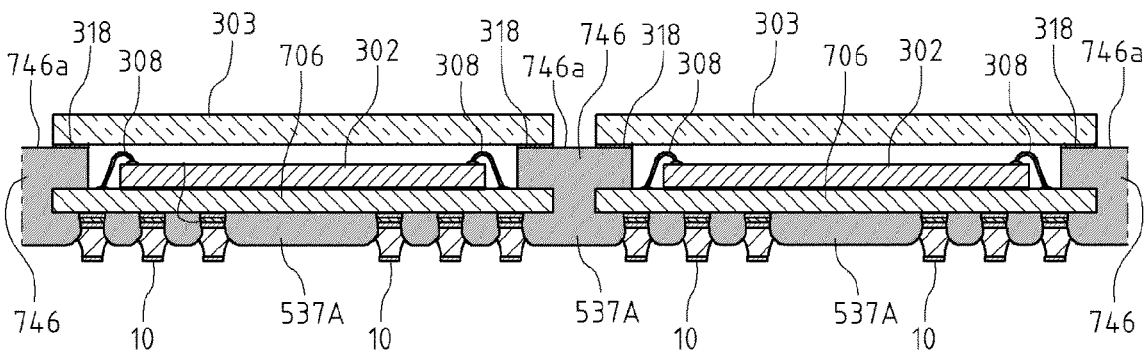

Thereafter, as depicted in a FIG. 41C, the image sensors 302 are die-bonded to the ceramic substrates 706, and wire bonding connection is made with use of the bonding wires 308. Moreover, the glass 303 is bonded to the upper surface 746a of the resin wall portion 746 with use of the adhesive 318 to seal the glass. The upper surface 746a of the resin wall portion 746 corresponds to a surface constituting the upper surface 705d of the wall portion 705r of the sealing resin portion 705.

Figure 41D:
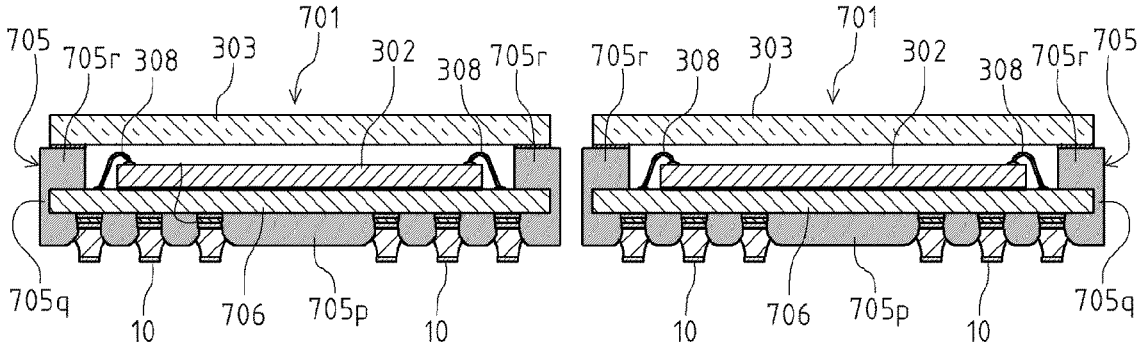

Thereafter, performed as depicted in a FIG. 41D is a step of dicing and singulating the package. By this step, the sealing resin 537A in a hardened state including the filling portion in the space portions 736 and the resin wall portion 746 is separated to constitute the sealing resin portion 705. A plurality of the solid-state imaging devices 701 each including the sealing resin portion 705 is thus produced.

According to the solid-state imaging device 701 and the manufacturing method of the solid-state imaging device 701 of the present embodiment, the connection portions of the columnar terminals 10 in contact with the electrode terminals 7, and the root side portions of the columnar terminals 10 can be protected and reinforced using the sealing resin portion 705, and improvement of temperature cycle resistance and substrate mounting reliability are achievable as in the fifth embodiment. Moreover, by using the plate-shaped ceramic substrate 706, manufacturing costs can be more reduced than the costs required in the case of the ceramic package 306 of the third embodiment. Accordingly, cost reduction is achievable.

17. Configuration Example of Semiconductor Device of Eighth Embodiment

A configuration example of a semiconductor device according to an eighth embodiment of the present technology will be described with reference to FIG. 42. As depicted in FIG. 42, a semiconductor device 801 according to the present embodiment has a sealing resin portion 805 on the rear surface 403b side of the rewiring layer 403 in addition to the configuration of the semiconductor device 401 of the fourth embodiment (see FIG. 26). The sealing resin portion 805 is a portion including a material and a manufacturing method similar to those of the sealing resin portion 505 according to the fifth embodiment.

The sealing resin portion 805 is provided on the rear surface 403b side of the rewiring layer 403 to constitute a layered portion formed such that the electrode terminals 417, the solder portions 419, and the upper half portions of the columnar terminals 10 are embedded in this layered portion. The lower half of each of the columnar terminals 10 protrudes downward from a lower surface 805a of the sealing resin portion 805.

Specifically, a portion included in each of the columnar terminals 10 and located on the upper side with respect to the proximal end side portion 14 of the terminal body portion 13 is embedded in the sealing resin portion 805, while a portion included in each of the columnar terminals 10 and located on the lower side with respect to the distal end side portion 15 protrudes from the sealing resin portion 805. The sealing resin portion 805 contains curved surface portions 805b included in contact surfaces in contact with the columnar terminals 10, and extending along the upper outer circumferential surfaces 14a.

The sealing resin portion 805 includes filling a sealing resin instead of the resist 37 for filling the spaces between the lead frame pieces 30X and the rewiring layer portion 443, and leaving the sealing resin without removal before the step of opposite surface etching of the lead frame 30 in the manufacturing method of the semiconductor device 401 described above.

18. Manufacturing Method of Semiconductor Device of Eighth Embodiment

A manufacturing method of the semiconductor device according to the eighth embodiment of the present technology will be described with reference to FIGS. 27A, 27B, 27C, 27D, 43A, 43B, and 43C.

In the manufacturing method of the semiconductor device 801, a step of preparing the lead frame 30 is initially performed as in the fourth embodiment (see the FIG. 27A). Moreover, a step of preparing the wafer FOWLP 440 is performed (see the FIGS. 27C and 29). Subsequently, one-side half etching is performed for the lead frame 30 (see the FIG. 27B). Thereafter, a step of singulating the etched lead frame 30 into a plurality of the lead frame pieces 30X corresponding to the IC chips 402 is performed (see the FIG. 27C).

Figure 27D:
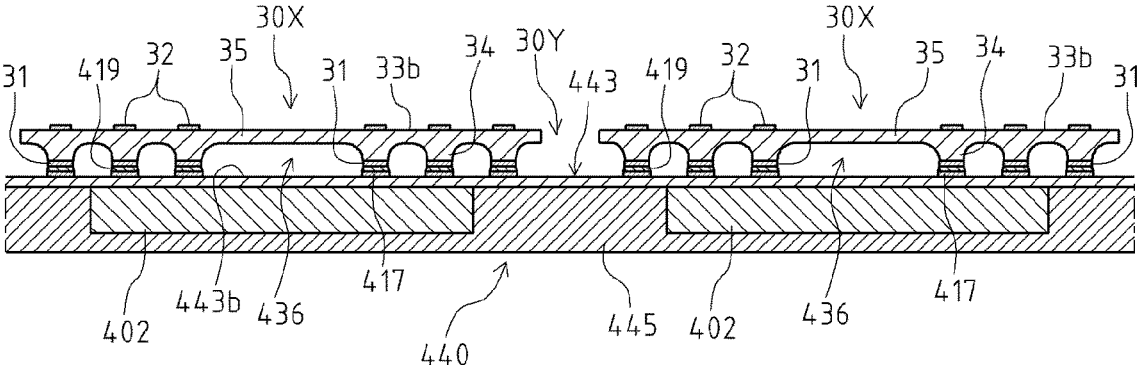

Then, a step of mounting the etched lead frame 30 (30P) on the wafer FOWLP 440 is performed (see the FIG. 27D).

By this step, the space portions 436 are produced between the lead frame pieces 30X and the wafer FOWLP 440.

ubsequently performed is a step of filling the space portions 436, which are spaces between the lead frame pieces 30X and the wafer FOWLP 440, with the sealing resin 537 as depicted in a FIG. 43A.

For example, the sealing resin 537 is ejected from a nozzle of a dispenser and applied through the clearances 30Y between the adjoining lead frame pieces 30X (see the FIG. 27D) in such a manner as to fill the space portions 436 which are clearances between the lead frame pieces 30X and the rewiring layer portion 443. Alternatively, the sealing resin 537 may fill the inside of the space portions 436 by injection molding with use of a molding die and a mold releasing film. According to the present embodiment as described above, the sealing resin 537 is employed as a fluid filling the clearances between the lead frame pieces 30X and the rewiring layer portion 443.

The sealing resin 537 filling the inside of the space portions 436 is solidified at a predetermined timing. The sealing resin 537 having fluidity and thus hardened becomes a sealing resin 537A in a hardened state.

ubsequently, as depicted in a FIG. 43B, etching is performed for the lead frame pieces 30X mounted on the wafer FOWLP 440 from the opposite surface 33b side. Thereafter, a step of removing the projection portions 537X of the sealing resin 537A is performed.

ubsequently performed as depicted in a FIG. 43C is a step of dicing and singulating the wafer FOWLP 440 on which the columnar terminals 10 are formed. By this step, the sealing resin 537A in a hardened state is separated together with the rewiring layer portion 443 and the mold resin portion 445 to constitute the sealing resin portion 805. In such a manner, a plurality of the semiconductor devices 801 each including the sealing resin portion 805 is produced.

According to the semiconductor device 801 and the manufacturing method of the semiconductor device 801 of the present embodiment, the connection portions of the columnar terminals 10 in contact with the electrode terminals 7, and the root side portions of the columnar terminals 10 can be protected and reinforced with use of the sealing resin portion 805, and improvement of temperature cycle resistance and substrate mounting reliability are achievable as in the fifth embodiment.

19. Manufacturing Method of Semiconductor Device of Ninth Embodiment

A manufacturing method of a semiconductor device according to a ninth embodiment of the present technology will be described with reference to FIGS. 44A, 44B, 44C, 45A, 45B, 45C, and 46.

The manufacturing method according to the present embodiment has a different mounting mode of the lead frame 30 in comparison with the manufacturing method of the solid-state imaging device 1 of the first embodiment. Specifically, according to the manufacturing method of the first embodiment, the lead frame pieces 30X produced by singulating the lead frame 30 are mounted on the WL-CSP in a wafer state (see FIG. 6). According to the manufacturing method of the ninth embodiment, however, the lead frame 30 (30P) similarly in an aggregate state is mounted on a WL-CSP in a wafer state (see FIG. 46). Other steps are identical to the corresponding steps in the first embodiment.

In the manufacturing method according to the present embodiment, a step of preparing the lead frame 30 is initially performed as in the first embodiment (see a FIG. 44A).

Moreover, a step of preparing the wafer CSP 40 is performed (see FIGS. 44B and 46). Subsequently, one-side half etching is performed for the lead frame 30 (see the FIG. 44B).

ubsequently, as depicted in a FIG. 44C, a step for mounting the half-etched lead frame 30P on the wafer CSP 40 is performed. In this step, the lead frame 30P not singulated but maintained in an aggregate state is mounted on the wafer CSP 40 as depicted in FIG. 46. By this step, space portions 936 are produced between the lead frame 30P and the silicon wafer 42. FIG. 46 depicts a mounting image of the lead frame 30 according to the present embodiment.

ubsequently performed is a step of filling the space portions 936, which are spaces between the lead frame 30P and the wafer CSP 40, with the resist 37 as depicted in a FIG. 45A.

For example, the resist 37 is ejected from a nozzle of a dispenser and applied through a clearance between the lead frame 30P and the silicon wafer 42 in an outer peripheral portion of the wafer CSP 40 in such a manner as to fill the space portions 936. In this step, an opening through which the resist 37 is supplied into the space portions 936 may be formed at a predetermined portion of the lead frame 30P. For example, the opening is formed as a through hole portion having a slit shape and provided in the thin plate portion 35 or the like of the lead frame 30P to allow the space portions 936 to communicate with an external space. The resist 37 is supplied through the opening of the lead frame 30P and fills the inside of the space portions 936. The opening thus formed in the lead frame 30P allows easy and efficient application of the resist 37.

ubsequently, as depicted in a FIG. 45B, etching is performed for the lead frame 30P mounted on the wafer CSP 40 from the opposite surface 33b side. Then, after completion of the step of removing the resist 37, performed as depicted in a FIG. 45C is a step of dicing and singulating the wafer CSP 40 on which the columnar terminals 10 are formed. In such a manner, a plurality of the solid-state imaging devices 1 is obtained.

According to the solid-state imaging device 1 and the manufacturing method of the solid-state imaging device 1 of the present embodiment, the columnar terminals 10 as external connection terminals can be formed in a short time and at a low cost, and mounting reliability of the solid-state imaging device 1 can be raised as in the first embodiment.

20. Configuration Example of Semiconductor Device of Tenth Embodiment

A configuration example of a semiconductor device according to a tenth embodiment of the present technology will be described with reference to FIGS. 47 and 48. A solid-state imaging device 1001 of the present embodiment has a different shape of the terminal body portion 13 of each of the columnar terminals 10 in comparison with the solid-state imaging device 1 of the first embodiment. Other configurations are identical to the corresponding configurations in the first embodiment.

The solid-state imaging device 1001 has the semiconductor base 1A which includes the image sensor 2, and columnar terminals 10B (10) each including a part of the lead frame 30. Each of the columnar terminals 10B has the proximal end side terminal portion 11, the distal end side terminal portion 12, and a terminal body portion 1013 corresponding to a portion between the proximal end side terminal portion 11 and the distal end side terminal portion 12 and constituting a body portion of the columnar terminal 10B.

The terminal body portion 1013 is a columnar portion constituting a major part of the columnar terminal 10B. The terminal body portion 1013 is formed such that the shape and the size of an upper surface 1013a corresponding to a junction surface joined to the proximal end side terminal portion 11 are substantially identical to those of the lower surface 11b of the proximal end side terminal portion 11, and such that the shape and the size of a lower surface 1013b corresponding to a junction surface joined to the distal end side terminal portion 12 are substantially identical to those of the upper surface 12b of the distal end side terminal portion 12. The terminal body portion 1013 includes a part of the frame body portion 33 similarly to the terminal body portion 13 of the embodiments described above.

Moreover, concerning the columnar terminals 10B, the junction surface of each of the columnar terminals 10B joined to the corresponding electrode terminals 7 is larger than the distal end side end surface of each of the columnar terminals 10B as depicted in FIG. 48. Accordingly, the area of the proximal end side terminal portion 11 is larger than the area of the distal end side terminal portion 12 in each of the columnar terminals 10B.

Each of the terminal body portions 1013 has a substantially tapered shape (substantially taper shape) which has an outside diameter gradually decreasing from the proximal end side terminal portion 11 side toward the distal end side terminal portion 12 side according to the size relation between the proximal end side terminal portion 11 and the distal end side terminal portion 12. Accordingly, each of the columnar terminals 10B has a substantially tapered shape on the whole following the shape of the terminal body portion 1013.

An outer circumferential surface 1013c of the terminal body portion 1013 forms a recess curve which has the projection side on the center axis side of the columnar terminal 10B in a longitudinal cross-sectional view of the columnar terminal 10B. In the example depicted in FIG. 48, a lower part of the terminal body portion 1013 has a gently tapered upside-down shape which has an outside diameter gradually and slightly increasing from the upper side toward the lower side.

As depicted in FIG. 48, the solid-state imaging device 1001 having the above configuration is mounted on the mounting substrate 20 having the land electrodes 21 with use of the columnar terminals 10B as connection terminals. The columnar terminals 10B are joined to the land electrodes 21 via the solder portions 25. Similarly to the case of the first embodiment, each of the solder portions 25 fills the space between the proximal end side terminal portion 11 and the land electrode 21, and covers the lower part of the columnar terminal 10B while forming a downward flaring shape. Each of the solder portions 25 has the terminal interposition portion 25a, the lower end outer circumference portion 25b, and the circumferential wall portion 25c.

According to a mounting mode of the solid-state imaging device 1001 with use of the columnar terminals 10B as described above, a conductor portion shaped to have an expanded diameter on each of the upper and lower end sides with respect to an intermediate portion between the upper and lower sides is provided as an electric connection portion between each of the electrode terminals 7 of the image sensor 2 and each of the land electrodes 21 of the mounting substrate 20. This conductor portion is a portion connecting each of the electrode terminals 7 and each of the land electrodes 21, corresponds to a columnar portion including the solder portion 9, the columnar terminal 10B, and the solder portion 25. In addition, this conductor portion is shaped to have a narrow center by gradually decreasing the outside diameter from both the end portions toward the central portion in the up-down direction, and has a substantially symmetric shape vertically with respect to a center located at a vertically central portion of the terminal body portion 1013 in the longitudinal cross-sectional shape.

In the manufacturing method of the solid-state imaging device 1 described above, the terminal body portions 1013 are collectively produced by mounting the lead frame 30 having the original plate thickness without performing half-etching of the lead frame 30, and then performing full-etching at a time with use of a mask including the plating terminal portions 31 and 32.

21. Manufacturing Method of Semiconductor Device of Tenth Embodiment

A manufacturing method of the semiconductor device according to the tenth embodiment of the present technology will be described with reference to FIGS. 49A, 49B, 49C, and 49D.

Figure 49A:
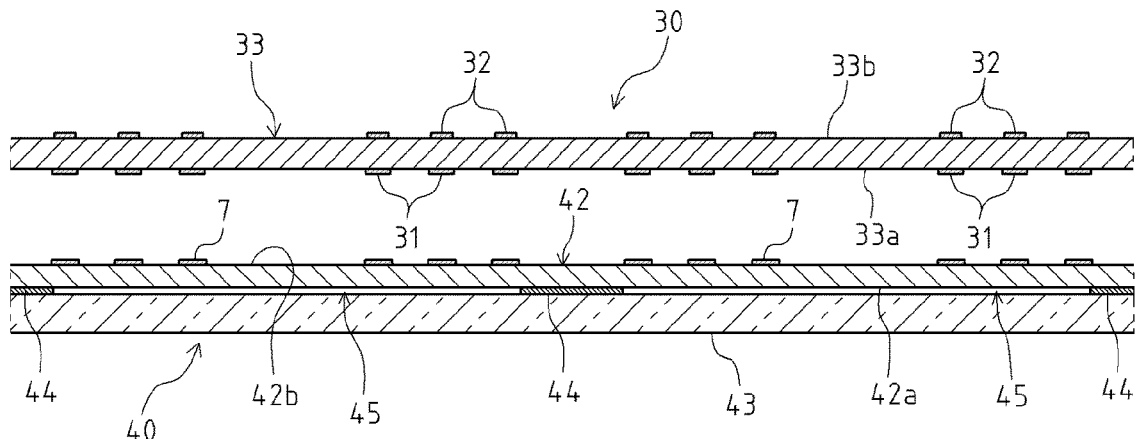
Figure 49B:
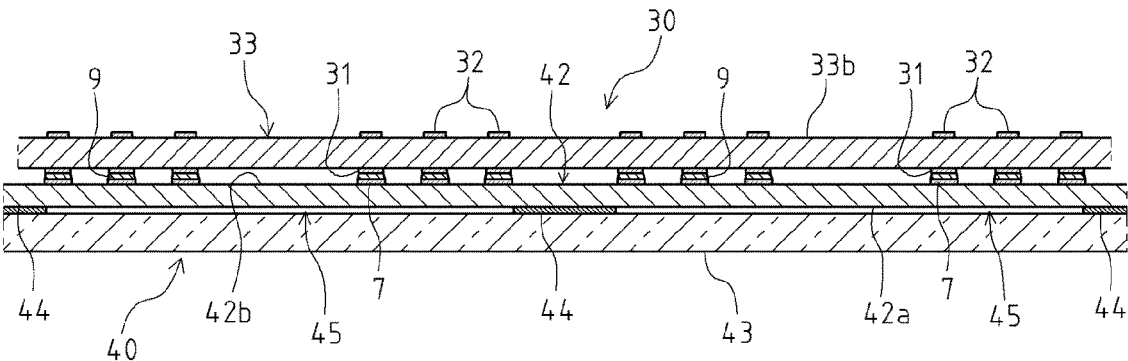
Figure 49C:
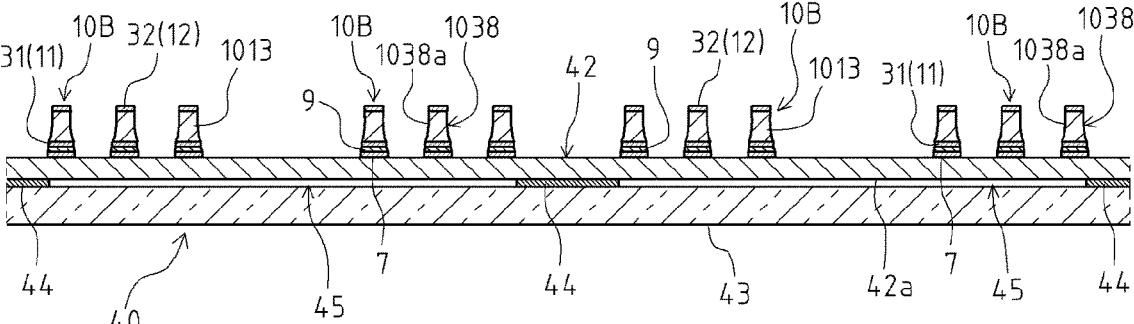

In the manufacturing method of the solid-state imaging device 1001, a step of preparing the lead frame 30 and a step of preparing the wafer CSP 40 are initially performed as depicted in a FIG. 49A as in the first embodiment.

ubsequently, as depicted in a FIG. 49B, a step of mounting the lead frame 30P on the wafer CSP 40 is performed without carrying out half-etching for the lead frame 30. In this step, the lead frame 30 not singulated but maintained in an aggregate state is mounted on the wafer CSP 40 by reflow (see FIG. 46). By this step, the lead frame 30 is brought into a state where the respective first plating terminal portions 31 are joined to the electrode terminals 7 via the solder portions 9.

ubsequently, as depicted in a FIG. 49C, etching is performed for the lead frame 30 mounted on the wafer CPS 40 from the opposite surface 33b side. Performed herein is full-etching for removing the entire frame body portion 33 in the thickness direction of the frame body portion 33 in an area other than the region where the plating terminal portions 31 and 32 are formed. In such a manner, a step of forming the columnar terminals 10B protruding from the electrode terminals 7 is achieved by partially removing the frame body portion 33 of the lead frame 30 by etching with use of a mask including the second plating terminal portions 32 and the first plating terminal portions 31 of the frame body portion 33.

By this step, portions of the frame body portion 33 of the lead frame 30 other than portions between the first plating terminal portions 31 and the second plating terminal portions 32 are removed. As a result, the portions of the frame body portion 33 between the first plating terminal portions 31 and the second plating terminal portions 32 remain as columnar portions 1038.

In such a manner, the columnar portions including the upper and lower plating terminal portions 31 and 32 and the columnar portions 1038 constitute the columnar terminals 10B standing on the electrode terminals 7 via the solder portions 9. By etching in this step, outer circumferential surfaces 1038c of the columnar portions 1038 are formed to constitute surfaces forming outer circumferential surfaces 1013c of the terminal body portions 1013 of the columnar terminals 10B. Specifically, the first plating terminal portions 31 constitute the proximal end side terminal portions 11, the second plating terminal portions 32 constitute the distal end side terminal portions 12, and the columnar portions 1038 constitute the terminal body portions 1013. In such a manner, the columnar terminals 10B are produced.

Figure 49D:
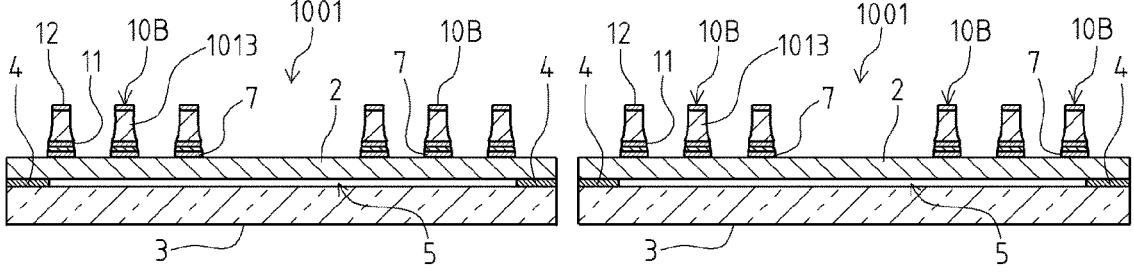

Thereafter, performed as depicted in a FIG. 49D is a step of dicing and singulating the wafer CPS 40 on which the columnar terminals 10B are formed. In such a manner, a plurality of the solid-state imaging devices 1001 is obtained.

According to the solid-state imaging device 1001 and the manufacturing method of the solid-state imaging device 1001 of the present embodiment, the columnar terminals 10B as external connection terminals can be formed in a short time and at a low cost, and mounting reliability of the solid-state imaging device 1001 can be raised as in the first embodiment.

Moreover, according to the present embodiment, a strength of the conductor portions connecting the electrode terminals 7 of the image sensor 2 and the land electrodes 21 of the mounting substrate 20 can be similarly raised according to the size relation between the first plating terminal portions 31 and the second plating terminal portions 32. Specifically, as depicted in FIG. 48, in the state where the solid-state imaging device 1001 is mounted on the mounting substrate 20, the conductor portion including the solder portion 25 wet and solderable for the columnar terminal 10B is allowed to have a substantially symmetric shape in the vertical direction on the whole. In such a manner, the cross-sectional sizes of the conductor portion on the upper and lower sides can be well-balanced and the conductor portion obtains a structure not easily broken.

Further, according to the manufacturing method of the present embodiment, the step of half-etching for the lead frame 30 is eliminated. Accordingly, the manufacturing steps can be simplified. As a result, manufacturing costs can be lowered.

22. Configuration Example of Electronic Apparatus

Described with reference to FIG. 50 will be an application example of the solid-state imaging devices of the foregoing embodiments each applied to an electronic apparatus. Note that an application example of the solid-state imaging device 1 according to the first embodiment will be described herein.

The solid-state imaging device 1 is applicable to all types of electronic apparatuses each equipped with a solid-state imaging element as an image capturing unit (photoelectric conversion unit) such as an imaging device including a digital still camera and a video camera, a portable terminal device having an imaging function, and a copy machine equipped with a solid-state imaging element as an image reading unit. The solid-state imaging element may have a form including one chip, or a module-shaped form having an imaging function as a collective package of both an imaging unit and a signal processing unit or an optical system.

As depicted in FIG. 50, an imaging apparatus 2100 as an electronic apparatus includes an optical unit 2102, the solid-state imaging device 1, a DSP (Digital Signal Processor) circuit 2103 as a camera signal processing circuit, a frame memory 2104, a display unit 2105, a recording unit 2106, an operation unit 2107, and a power source unit 2108. The DSP circuit 2103, the frame memory 2104, the display unit 2105, the recording unit 2106, the operation unit 2107, and the power source unit 2108 are connected to each other via a bus line 2109.

The optical unit 2102 contains a plurality of lenses and is configured to introduce incident light (image light) from an object and form an image on an imaging surface of the solid-state imaging device 1. The solid-state imaging device 1 converts a light amount of the incident light of the image formed on the imaging surface by the optical unit 2102 into an electric signal in units of a pixel, and outputs the electric signal as a pixel signal.

For example, the display unit 2105 includes a panel type display device such as a liquid crystal panel and an organic EL (Electro Luminescence) panel, and displays a moving image or a still image captured by the solid-state imaging device 1. The recording unit 2106 records the moving image or the still image captured by the solid-state imaging device 1 in a recording medium such as a hard disk and a semiconductor memory.

The operation unit 2107 issues operation commands associated with various functions of the imaging apparatus 2100 according to operations performed by a user. The power source unit 2108 supplies various types of power sources to the DSP circuit 2103, the frame memory 2104, the display unit 2105, the recording unit 2106, and the operation unit 2107 as operation power sources for these supply targets as necessary.

According to the imaging apparatus 2100 configured as above, the package size of the solid-state imaging device 1 can be made compact by simplifying the structure so as to cope with heat generation from the solid-state imaging device 1. In addition, transfer delays of a high-speed interface can be reduced. With size reduction of the solid-state imaging device 1, size reduction of the imaging apparatus 2100 can be promoted.

The above description of the embodiments is presented only by way of example of the present technology. The present technology is not limited to the embodiments described above. Accordingly, it is obvious that various modifications other than the embodiments described above may be made according to design or the like without departing from the technical ideas of the present disclosure. Moreover, advantageous effects to be offered are not limited to those described in the present disclosure and presented only by way of example. In addition, other advantageous effects may be further offered. Besides, the configurations of the respective embodiments and the configurations of the modifications described above may be combined in appropriate manners.

While the lead frame 30 of the embodiments described above has the plating terminal portions 31 and 32 including plating as terminal portions of the lead frame 30, the terminal portions of the lead frame 30 may be portions including methods other than plating.

Note that the present technology may have following configurations.

(1)

A manufacturing method of a semiconductor device, including:

a step of preparing a frame body portion that has a plate shape, and a lead frame that has a plurality of terminal portions paired and provided such that at least a part of the terminal portions overlap with each other on plate surfaces on both sides of the frame body portion in a plate surface view;

a step of mounting the lead frame on a semiconductor device body that includes a semiconductor element by joining the terminal portion on one plate surface of the plate surfaces of the frame body portion to an electrode portion of the semiconductor device body; and a step of forming a columnar terminal that protrudes from the electrode portion by partially removing the frame body portion by etching with use of a mask including the terminal portion on another plate surface of the frame body portion.

(2)

The manufacturing method of a semiconductor device according to (1), further including:

a step of partially removing the frame body portion in a plate thickness direction of the frame body portion by etching the one plate surface side of the frame body portion with use of a mask including the terminal portion prior to the step of mounting; and a step of filling a space between the lead frame and the semiconductor device body with a fluid having an insulation property after the step of mounting and before the step of forming the columnar terminal.

(3)

The manufacturing method of a semiconductor device according to (2), the semiconductor device body including an integrated plate-shaped body that includes a plurality of the semiconductor elements formed in an aggregate state, the method further including:

a step of singulating the lead frame into a plurality of chips in correspondence with the semiconductor elements is performed after the step of removal, in which the plurality of chips is mounted on the semiconductor device body in the step of mounting.

(4)

The manufacturing method of a semiconductor device according to (2) or (3), in which the fluid used in the step of filling includes a photoresist.

(5)

The manufacturing method of a semiconductor device according to any one of (2) to (4), in which the step of preparation includes a step of forming the plurality of terminal portions by plating of the frame body portion, and, in the step of forming the plurality of terminal portions, the terminal portion formed on the one plate surface of the frame body portion is made larger than the terminal portion formed on another plate surface of the frame body portion.

(6)

The manufacturing method of a semiconductor device according to (5), in which, in the step of forming the plurality of terminal portions, the terminal portions are formed such that the terminal portion formed on the one plate surface of the frame body portion has an elliptic shape and that the terminal portion formed on the other plate surface of the frame body portion has a circular shape, and the terminal portion having the elliptic shape is formed such that a long diameter direction of the elliptic shape extends toward a central portion of the semiconductor element.

(7)

A semiconductor device including:

a semiconductor base that includes a semiconductor element and has a plurality of electrode portions provided for external connection and disposed on one surface of the semiconductor base; and columnar terminals provided in such a manner as to protrude from the electrode portions of the semiconductor base and each including a part of a lead frame.

(8)

A semiconductor device according to (7), in which a junction surface of each of the columnar terminals joined to the corresponding electrode portion is larger than a distal end side end surface of the corresponding columnar terminal.

(9)

A semiconductor device according to (7) or (8), in which each of the columnar terminals is formed such that a junction surface joined to the corresponding electrode portion has an elliptic shape and an end surface on a distal end side has a circular shape, and each of a plurality of the columnar terminals is provided such that a major axis direction of the elliptic shape of the junction surface joined to the corresponding electrode portion extends toward a central portion of the semiconductor base.

(10)

The semiconductor device according to any one of (7) to (9), further including:

a heat dissipation pad provided on the one surface of the semiconductor base and including a part of the lead frame.

(11)

The semiconductor device according to any one of (7) to (10), further including:

a reinforcing portion provided on the one surface of the semiconductor base and including a part of the lead frame.

(12)

The semiconductor device according to any one of (7) to (11), further including:

a GND plain provided on the one surface of the semiconductor base and including a part of the lead frame.

(13)

The semiconductor device according to any one of (7) to (12), further including:

a second semiconductor element provided on the one surface of the semiconductor base; and a shield portion provided on the one surface of the semiconductor base and including a part of the lead frame in such a manner as to cover the second semiconductor element.

(14)

An electronic apparatus including a semiconductor device, including:

a semiconductor device that includes a semiconductor base that includes a semiconductor element and has a plurality of electrode portions provided for external connection and disposed on one surface of the semiconductor base, and columnar terminals provided in such a manner as to protrude from the electrode portions of the semiconductor base and each including a part of a lead frame.

REFERENCE SIGNS LIST

1, 201, 301, 501, 601, 701, 1001: Solid-state imaging device (semiconductor device)
1A, 201A, 301A, 401A: Semiconductor base
2, 202, 302: Image sensor (semiconductor element)
7, 217, 317, 417: Electrode terminal (electrode portion)
10: Columnar terminal
11: Proximal end side terminal portion
12: Distal end side terminal portion
13: Terminal body portion
30: Lead frame
30X: Lead frame piece
31: First plating terminal portion (terminal portion)
32: Second plating terminal portion (terminal portion)
33: Frame body portion
33a: Facing surface (one plate surface)
33b: Opposite surface (other plate surface)
36, 236, 336, 436, 736, 936: Space portion 37: Resist (fluid, photoresist)

40: Wafer CSP (semiconductor body, plate-shaped body)

50: Heat dissipation pad

70: Reinforcing portion

90: GND plain

120: Shield portion

125: Built-in chip (second semiconductor element)

240: Organic substrate package (semiconductor device body)

401, 801: Semiconductor device

402: IC chip (semiconductor element)

440: Wafer FOWLP (semiconductor body, plate-shaped body)

537: Sealing resin (fluid)

2100: Imaging apparatus (electronic apparatus)

The invention claimed is:

1. A manufacturing method of a semiconductor device, comprising:

preparing a frame body portion that has a plate shape;

preparing a lead frame including a plurality of terminal portions, wherein the preparing of the lead frame includes:

plating the frame body portion; and forming the plurality of terminal portions based on the plating of the frame body portion, a first pair of the plurality of terminal portions is on a first plate surface of the frame body portion, a second pair of the plurality of terminal portions is on a second plate surface of the frame body portion, the first pair of the plurality of terminal portions is larger than the second pair of the plurality of terminal portions, the first plate surface is opposite to the second plate surface, each of the first pair of the plurality of terminal portions has an elliptic shape, each of the second pair of the plurality of terminal portions has a circular shape, and a long diameter direction of the elliptic shape extends toward a central portion of a semiconductor element, and at least a part of the first pair of the plurality of terminal portions and at least a part of the second pair of the plurality of terminal portions overlap in a plate surface view of the lead frame;

joining each of the first pair of the plurality of terminal portions to an electrode portion of a semiconductor device body, wherein the semiconductor device body includes the semiconductor element;

mounting the lead frame on the semiconductor device body based on the joining of each of the first pair of the plurality of terminal portions to the electrode portion of the semiconductor device body;

filling a space between the lead frame and the semiconductor device body with a fluid having an insulation property after the mounting of the lead frame and before formation of a columnar terminal;

removing the frame body portion by etching with use of a mask, wherein the mask includes the second pair of the plurality of terminal portions on the second plate surface of the frame body portion, the removal of the frame body portion is in a plate thickness direction of the frame body portion, and the removal of the frame body portion is prior to the mounting of the lead frame on the semiconductor device body; and forming the columnar terminal, based on the removal of the frame body portion, wherein the columnar terminal protrudes from the electrode portion.

2. The manufacturing method of the semiconductor device according to claim 1, further comprising:

singulating the lead frame into a plurality of chips, wherein the plurality of chips are in correspondence with a plurality of semiconductor elements; and mounting the plurality of chips on the semiconductor device body, wherein the semiconductor device body further includes an integrated plate-shaped body, the integrated plate-shaped body includes the plurality of the semiconductor elements an aggregate state, the singulation of the lead frame is executed after the removal of the frame body portion, and the plurality of chips is mounted on the semiconductor device body during the mounting of the lead frame on the semiconductor device body.

3. The manufacturing method of the semiconductor device according to claim 1, wherein the fluid, that fills the space between the lead frame and the semiconductor device body, includes a photoresist.

4. A semiconductor device, comprising:

a semiconductor base that includes:

a semiconductor element; and a plurality of electrode portions for external connection, wherein the plurality of electrode portions are on a surface of the semiconductor base; and a plurality of columnar terminals that protrudes from the plurality of electrode portions of the semiconductor base, wherein each columnar terminal of the plurality of columnar terminals includes a part of a lead frame, a junction surface, between a columnar terminal of the plurality of columnar terminals and an electrode portion, of the plurality of electrode portions, corresponding to the columnar terminal, has an elliptic shape, a distal end side of the columnar terminal corresponding to the electrode portion, has a circular shape, the plurality of electrode portions include the electrode portion, and a major axis direction of the elliptic shape of the junction surface extends toward a central portion of the semiconductor base.

5. The semiconductor device according to claim 4, wherein the junction surface is larger than the distal end side of the columnar terminal corresponding to the electrode portion.

6. The semiconductor device according to claim 4, further comprising a heat dissipation pad on the surface of the semiconductor base, wherein the heat dissipation pad comprises the part of the lead frame.

7. The semiconductor device according to claim 4, further comprising a reinforcing portion on the surface of the semiconductor base, wherein the reinforcing portion comprises the part of the lead frame.

8. The semiconductor device according to claim 4, further comprising a ground (GND) plain on the surface of the semiconductor base, wherein the GND plain comprises the part of the lead frame.

9. The semiconductor device according to claim 4, further comprising:

a second semiconductor element on the surface of the semiconductor base; and a shield portion on the surface of the semiconductor base,
wherein the shield portion comprises the part of the
lead frame to cover the second semiconductor element.

10. An electronic apparatus, comprising:

a semiconductor device that includes a semiconductor
base and a plurality of columnar terminals, wherein
the semiconductor base includes:

a semiconductor element; and a plurality of electrode portions for external connec-
tion, wherein the plurality of electrode portions is
on a surface of the semiconductor base, the plurality of columnar terminals protrudes from the
plurality of electrode portions of the semiconductor
base, each columnar terminal of the plurality of columnar
terminals includes a part of a lead frame, a junction surface, between a columnar terminal of the
plurality of columnar terminals and an electrode
portion, of the plurality of electrode portions, corre-
sponding to the columnar terminal, has an elliptic
shape, a distal end side of the columnar terminal correspond-
ing to the electrode portion, has a circular shape, the plurality of electrode portions include the electrode
portion, and a major axis direction of the elliptic shape of the
junction surface extends toward a central portion of
the semiconductor base.

\*   \*   \*   \*   \*